(12) United States Patent
Goehnermeier et al.

(10) Patent No.: US 7,239,447 B2
(45) Date of Patent: *__Jul. 3, 2007__

(54) OBJECTIVE WITH CRYSTAL LENSES

(75) Inventors: Aksel Goehnermeier, Aalen (DE); Alexandra Pazidis, Aalen (DE); Birgit Kuerz, Aalen (DE); Christoph Zaczek, Hebach (DE); Daniel Kraehmer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/931,745

(22) Filed: Sep. 1, 2004

(65) Prior Publication Data

US 2005/0157401 A1    Jul. 21, 2005

Related U.S. Application Data

(63) Continuation of application No. PCT/EP03/002549, filed on Mar. 12, 2003, and a continuation-in-part of application No. 10/367,989, filed on Feb. 12, 2003, now Pat. No. 7,145,720, which is a continuation of application No. PCT/EP02/05050, filed on May 8, 2002.

(30) Foreign Application Priority Data

| May 15, 2001 | (DE) | 101 23 725 |
| May 15, 2001 | (DE) | 101 23 727 |
| May 23, 2001 | (DE) | 101 25 487 |
| Jun. 6, 2001 | (DE) | 101 27 320 |
| Mar. 12, 2002 | (DE) | 102 10 782 |

(51) Int. Cl.
*G02B 5/30* (2006.01)

(52) U.S. Cl. .................. 359/499; 359/355; 359/726; 355/71

(58) Field of Classification Search ............ None
See application file for complete search history.

(56) References Cited

U.S. PATENT DOCUMENTS 1,332,410 A    3/1920    Potts (Continued)

FOREIGN PATENT DOCUMENTS

DE    4022904    1/1992

(Continued)

OTHER PUBLICATIONS

Wang et al. "Polarized Phase Shift Mask: Concept, Design, and Potential Advantages to Photolithography Process and Physical Design." Proceedings of SPIE vol. 4562, 21st Annual BACUS Symposium on Photomask Technology, Mar. 2002, p. 406-417.

(Continued)

*Primary Examiner*—Arnel Lavarias
*Assistant Examiner*—Derek S. Chapel
(74) *Attorney, Agent, or Firm*—Fish & Richardson P.C.

(57) ABSTRACT

An objective, in particular a projection objective for a microlithography projection-exposure installation, with at least one fluoride crystal lens is disclosed. A reduction in the detrimental influence of birefringence is achieved if this lens is a (100)-lens with a lens axis which is approximately perpendicular to the {100} crystallographic planes or to the crystallographic planes equivalent thereto of the fluoride crystal. A further reduction in the detrimental influence of birefringence is obtained by covering an optical element with a compensation coating.

33 Claims, 18 Drawing Sheets

U.S. PATENT DOCUMENTS

| | | | |
|---|---|---|---|
| 2,934,993 A | 5/1960 | Chromy | |
| 4,215,288 A | 7/1980 | Kato et al. | |
| 4,701,606 A | 10/1987 | Tanimoto et al. | |
| 4,993,823 A | 2/1991 | Schaffer, Jr. et al. | |
| 5,042,922 A | 8/1991 | Pepper | |
| 5,184,176 A | 2/1993 | Unno et al. | |
| 5,625,453 A | 4/1997 | Matsumoto et al. | |
| 5,652,745 A | 7/1997 | Noguchi et al. | |
| 5,677,757 A | 10/1997 | Taniguchi et al. | |
| 5,805,273 A | 9/1998 | Unno | |
| 5,867,315 A | 2/1999 | Koike et al. | |
| 6,057,970 A | 5/2000 | Kim et al. | |
| 6,084,708 A | 7/2000 | Schuster | |
| 6,191,880 B1 | 2/2001 | Schuster | |
| 6,201,634 B1 | 3/2001 | Sakuma et al. | |
| 6,248,486 B1 | 6/2001 | Dirksen et al. | |
| 6,252,712 B1 | 6/2001 | Furter et al. | |
| 6,285,512 B1 | 9/2001 | Sudoh | |
| 6,307,688 B1 | 10/2001 | Merz et al. | |
| 6,324,003 B1 | 11/2001 | Martin | |
| 6,366,404 B1 | 4/2002 | Hiraiwa et al. | |
| 6,646,718 B2 | 11/2003 | Schuster et al. | |
| 6,683,710 B2 | 1/2004 | Hoffman et al. | |
| 6,765,717 B2 | 7/2004 | Allan et al. | |
| 6,775,063 B2 | 8/2004 | Shiraishi | |
| 6,782,074 B2 | 8/2004 | Sakuma | |
| 6,782,075 B2 | 8/2004 | Pell | |
| 6,785,051 B2 | 8/2004 | Allan et al. | |
| 6,788,389 B2 | 9/2004 | Fujishima et al. | |
| 6,829,041 B2 | 12/2004 | Unno | |
| 6,879,379 B2 | 4/2005 | Brunotte et al. | |
| 6,963,449 B2 | 11/2005 | Mecking et al. | |
| 7,027,237 B2 | 4/2006 | Mecking et al. | |
| 2001/0008440 A1 | 7/2001 | Hummel et al. | |
| 2001/0012154 A1 | 8/2001 | Schuster | |
| 2001/0023042 A1 | 9/2001 | Dirksen et al. | |
| 2001/0038497 A1 | 11/2001 | Sudoh | |
| 2001/0053489 A1 | 12/2001 | Dirksen et al. | |
| 2002/0126380 A1 | 9/2002 | Schuster | |
| 2003/0000453 A1 | 1/2003 | Unno et al. | |
| 2003/0011893 A1 | 1/2003 | Shiraishi et al. | |
| 2003/0011896 A1 | 1/2003 | Shiraishi | |
| 2003/0012724 A1 | 1/2003 | Burnett et al. | |
| 2003/0021026 A1 | 1/2003 | Allan et al. | |
| 2003/0025894 A1 | 2/2003 | Owa et al. | |
| 2003/0053036 A1 | 3/2003 | Fujishima et al. | |
| 2003/0058421 A1 | 3/2003 | Omura et al. | |
| 2003/0086071 A1 | 5/2003 | McGuire, Jr. | |
| 2003/0086156 A1 | 5/2003 | McGuire, Jr. | |
| 2003/0086157 A1 | 5/2003 | McGuire, Jr. | |
| 2003/0086171 A1 | 5/2003 | McGuire | |
| 2003/0099047 A1 | 5/2003 | Hoffman et al. | |
| 2003/0128349 A1 | 7/2003 | Unno | |
| 2003/0168597 A1 | 9/2003 | Webb et al. | |
| 2003/0197946 A1 | 10/2003 | Omura | |
| 2003/0234981 A1 | 12/2003 | Hoffman et al. | |
| 2004/0001244 A1 | 1/2004 | Hoffman et al. | |
| 2004/0008348 A1 | 1/2004 | Kishikawa et al. | |
| 2004/0036961 A1 | 2/2004 | McGuire, Jr. | |
| 2004/0036971 A1 | 2/2004 | McGuire, Jr. | |
| 2004/0036985 A1 | 2/2004 | McGuire, Jr. | |
| 2004/0050318 A1 | 3/2004 | Sakai | |
| 2004/0089023 A1 | 5/2004 | Hiraiwa et al. | |
| 2004/0105170 A1* | 6/2004 | Krahmer et al. | 359/726 |
| 2004/0136084 A1 | 7/2004 | Unno et al. | |
| 2004/0145806 A1 | 7/2004 | McGuire, Jr. | |
| 2004/0156051 A1 | 8/2004 | Takeuchi et al. | |
| 2004/0190151 A1* | 9/2004 | Krahmer et al. | 359/649 |
| 2005/0122499 A1* | 6/2005 | Omura et al. | 355/67 |
| 2005/0134967 A1 | 6/2005 | Brunotte et al. | |
| 2005/0157401 A1 | 7/2005 | Goehnermeier et al. | |
| 2005/0264786 A1 | 12/2005 | Brunotte et al. | |
| 2006/0146427 A1 | 7/2006 | Kurz et al. | |

FOREIGN PATENT DOCUMENTS

| | | |
|---|---|---|
| DE | 195 35 392 | 3/1997 |
| DE | 196 37 563 | 3/1998 |
| DE | 19807120 | 8/1999 |
| EP | 0103485 | 3/1984 |
| EP | 0 480 616 | 4/1992 |
| EP | 0 678 768 | 10/1995 |
| EP | 0857985 | 8/1998 |
| EP | 0 942 297 | 9/1999 |
| EP | 0 952 490 | 10/1999 |
| EP | 0 961 149 | 12/1999 |
| EP | 1 014 139 | 6/2000 |
| EP | 1 063 684 | 12/2000 |
| EP | 1063551 | 12/2000 |
| EP | 1 115 030 | 7/2001 |
| EP | 1 139 138 | 10/2001 |
| JP | 05-27200 | 2/1993 |
| JP | 09-166710 | 6/1997 |
| JP | 09166710 | 6/1997 |
| JP | 11-54411 | 2/1999 |
| JP | 11-106296 | 4/1999 |
| JP | 2000-86394 | 3/2000 |
| JP | 2000331927 | 11/2000 |
| JP | 2001108801 | 4/2001 |
| WO | WO91/14189 | 9/1991 |
| WO | WO 00/31592 | 6/2000 |
| WO | WO00/70407 | 11/2000 |
| WO | WO01/01182 | 1/2001 |
| WO | WO 01/02799 | 1/2001 |
| WO | WO 01/50171 | 7/2001 |
| WO | WO01/50171 | 7/2001 |
| WO | WO02/093201 | 11/2002 |
| WO | WO02/093209 | 11/2002 |
| WO | WO 02/093257 | 11/2002 |
| WO | WO02/097508 | 12/2002 |
| WO | WO02/099500 | 12/2002 |
| WO | WO03/003072 | 1/2003 |
| WO | WO03/003429 | 1/2003 |
| WO | WO03/007045 | 1/2003 |
| WO | WO03/009017 | 1/2003 |
| WO | WO03/023481 | 3/2003 |
| WO | WO03/038479 | 5/2003 |
| WO | WO03/046634 | 6/2003 |
| WO | WO2004/019077 | 3/2004 |

OTHER PUBLICATIONS

Hodgkinson, Ian. "Review of birefringent and chiral optical interference coatings." Optical Interference Coatings, Trends in Optics and Photonics vol. 63, 2001, p. FA1-FA3.

Band, Erster. Lexikon der Optik. 1999, p. 380-387. and certified copy of translation.

Burnett et al. "The Trouble with Calcium Fluoride." SPIE's OEMagazine, pp. 23-25, Mar. 2002.

Matsuyama et al. "High NA and low residual aberration projection lens for DUV scanner." Optical Microlithography XV, Proceedings of SPIE, 4691, pp. 687-695, 2002.

Matsuyama et al. "Microlithographic lens for DUV scanner." International Optical Design Conference, Proceedings of SPIE 4832, pp. 170174, 2002.

Matsumoto, et al. "Analysis of Imaging Performance Degradation." Optical Microlithography XVI, Proceedings of SPIE, 5040, pp. 131-138, 2003.

Owa et al. "Nikon F2 exposure tool development." Optical Microlithography XVI, Proceedings of SPIE, 5040, pp. 772-780, 2003.

Chiba et al. "New generation projection optics for ArF lithography." Optical Microlithography XVI, Proceedings of SPIE, 4691, pp. 679686, 2002.

Burnett, J. H. et al., "Intrinsic Birefringence in 157nm Materials" Proceedings of the International Symposium on 157nm Lithography, Dana Point, California, May 15, 2001 pp. 1-13.

Burnett J. H., et al. "Intrinsic birefringence in calcium fluoride and barium fluoride". Physical Review B (Condensed Matter and Materials Physics), American Institute of Physics. New York, US. Dec. 15, 2001, APS through AIP, US, vol. 64, Nr. 24, 241102/1-4.

Burnett, J. H. et al., "Intrinsic Birefringence in calcium fluoride" Preprint handed out at 2nd International Symposium on 157nm Lithography in Dana Point, California, May 15, 2001.

Mulkens, J. et al. "157-nm technology: Where are we today?" Optical Microlithography XV. 2002. vol. 4691, 613-625. Proceedings of the SPIE-Int. Soc. Opt. Eng., Santa Clara, CA, US, Mar. 5-8, 2002.

Van Peski; Memo to PAG Members; "Re: Birefringence of calcium fluoride" written May 7, 2001 Nicht-Vertrauliches Schreiben vom May 7, 2001 "Re: Birefringence of calcium fluoride" van Chris VanPeski von International SEMATECH zu den Vertretern von Litho. PAG (Project Advisory Group).

Nogawa H., et al. "System design of a 157 nm scanner". Optical Microlithography XV. 2002. vol. 4691, 602-612 Proceedings of the SPIE-Int. Soc. Opt. Eng., Santa Clara, CA, US. Mar. 5-8, 2002.

Pastrnak, J. et al. "Optical anisotropy of silicon single crystals" Physical Review B (Solid State), Apr. 15, 1971 US vol. 3, No. 8, pp. 2567-2571.

Shiraishi, N. et al. "Progress of Nikon's F2 Exposure Tool Development". Proceedings of the SPIE, SPIE, Bellingham, VA, US Mar. 5, 2002 vol. 4691. Mar. 5, 2002. 594-601.

Burnett et al, "Symmetry of Spatial-Dispersion-Induced Birefringence and its Implications for CaF2 Ultraviolet Optics", J. Microlith., Microfab., Micro Syst., vol. 1, No. 3, Oct. 2002; pp. 213-224.

Burnett et al., "Preliminary Determination of an Intrinsic Birefringence in $CaF_2$", dated May 7, 2001, 2nd International Symposium on 157nm Lithography in Dana Point, California, May 15, 2001.

Van Peski, Chris. "Birefringence of Calcium Fluoride", memo to Exposure Tool Manufactures and Lens Designers, dated May 7, 2001.

Merkel et al., "The development of microlithographic high-performance optics," *International Journal of Optoelectronics*, 4(6):545-561 (1989).

Unno, Yasuyuki, "Distorted wave front produced by a high-resolution projection optical system having rotationally symmetric birefringence," Applied Optics. Nov. 1, 1998, pp. 7241-7247, vol. 37(1), Opt. Soc. America, USA.

* cited by examiner

OBJECTIVE WITH CRYSTAL LENSES

CROSS REFERENCE TO RELATED APPLICATIONS

This application is a Continuation of and claims the benefit of priority under 35 USC 120 to co-pending International Application No. PCT/EP03/002549 filed Mar. 12, 2003, which claims priority from German Application No. 10210782.3 filed Mar. 12, 2002. This application is also a Continuation in Part of and claims the benefit of priority under 35 USC 120 to co-pending U.S. patent application Ser. No. 10/367,989 filed Feb. 12, 2003 now U.S. Pat. No. 7,145,720, which is a Continuation of International Application No. PCT/EP02/05050 filed May 8, 2002, and which claims priority from German Application No. 10123725.1 filed May 15, 2001, and also claims priority from German Application No. 10123727.8 filed May 15, 2001, and also claims priority from German Application No. 10125487.3 filed May 23, 2001, and also claims priority from German Application No. 10127320.7 filed Jun. 6, 2001, and also claims priority from German Application No. 10210782.3 filed Mar. 12, 2002. To the extent that they are consistent herewith, the aforementioned applications are incorporated herein by reference.

The invention relates to an objective according to the precharacterizing clause of claim 1.

Projection objectives of this type are known from U.S. Pat. No. 6,201,634, which discloses the concept of ideally aligning the lens axes perpendicularly to the {111} crystallographic planes of the fluoride crystals during the manufacture of fluoride crystal lenses in order to minimize stress-induced birefringence. U.S. Pat. No. 6,201,634 is based on the assumption that fluoride crystals have no intrinsic birefringence.

However, it is known from the Internet publication "Preliminary Determination of an Intrinsic Birefringence in $CaF_2$," by John H. Burnett, Eric L. Shirley, and Zachary H. Levine, NIST Gaithersburg, Md. 20899 USA (posted on May 7, 2001), that calcium fluoride single crystals also exhibit birefringence that is not stress-induced, i.e., intrinsic birefringence. The measurements presented there show that a ray of light traveling in the <110> direction of a calcium fluoride crystal is subject to a birefringence that amounts to $(6.5\pm0.4)$ nm/cm at a wavelength of $\lambda=156.1$ nm, to $(3.6\pm0.2)$ nm/cm at a wavelength of $\lambda=193.09$ nm, and to $(1.2\pm0.1)$ nm/cm at a wavelength of $\lambda=253.65$ nm. On the other hand, if the light propagation is oriented in the <100> direction or in the <111> direction of the crystal, no intrinsic birefringence occurs in calcium fluoride, as is also predicted by theory. Therefore, the intrinsic birefringence has a strong directional dependence and increases significantly as the wavelength becomes less.

The indices for the crystallographic directions will hereinafter be given between the symbols "<" and ">", and the indices for the crystallographic planes will be given between the symbols "{" and "}". The crystallographic direction always points in the direction of the surface normal of the corresponding crystallographic plane. For example, the crystallographic direction <100> points in the direction of the surface normal of the crystallographic plane {100}. Crystals with a cubic lattice structure, which include the fluoride crystals, have the principal crystallographic directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, <0$\bar{1}\bar{1}$>, <111>, <$\bar{1}\bar{1}\bar{1}$>, <$\bar{1}$11>, <1$\bar{1}\bar{1}$>, <1$\bar{1}\bar{1}$>, <$\bar{1}$11>, <11$\bar{1}$>, <100>, <001>, <001>, <$\bar{1}$00>, <0$\bar{1}$0>, and <00$\bar{1}$>. Because of the symmetry properties of cubic crystals, the principal crystallographic directions <100>, <010>, <001>, <$\bar{1}$00>, <0$\bar{1}$0>, and <00$\bar{1}$> are equivalent to one another, so that crystallographic directions which point in one of these principal crystallographic directions will hereinafter be given the prefix "(100)-". Crystallographic planes that are perpendicular to one of these principal crystallographic directions will correspondingly be given the prefix "(100)-". The principal crystallographic directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, and <0$\bar{1}\bar{1}$> are similarly equivalent to one another, so that crystallographic directions which point in one of these principal crystallographic directions will hereinafter be given the prefix "(110)-". Crystallographic planes that are perpendicular to one of these principal crystallographic directions will correspondingly be given the prefix "(110)-". The principal crystallographic directions <111>, <$\bar{1}\bar{1}\bar{1}$>, <$\bar{1}$11>, <1$\bar{1}$1>, <1$\bar{1}\bar{1}$>, <$\bar{1}$11>, <1$\bar{1}$1>, <11$\bar{1}$> are similarly equivalent to one another, so that crystallographic directions which point in one of these principal crystallographic directions will hereinafter be given the prefix "(111)-". Crystallographic planes that are perpendicular to one of these principal crystallographic directions will correspondingly be given the prefix "(111)-". Any statements made hereinafter in regard to one of the aforementioned principal crystallographic directions should be understood to be equally applicable to the equivalent principal crystallographic directions.

Projection objectives and microlithography projection-exposure installations are known for example from the applicant's patent application PCT/EP00/13148 and from the references cited in it. The exemplary embodiments of that application show suitable projection objectives of purely refractive as well as catadioptric types with numerical apertures of 0.8 and 0.9 at operating wavelengths of 193 nm and 157 nm.

The concept of rotating lens elements in order to compensate for the effects of birefringence is also described in the patent application "Projektionsbelichtungsanlage der Mikrolithographie, Optisches System und Herstellverfahren" (Projection-exposure Installation for Microlithography, optical System and Manufacturing Method) (DE 101 23 725.1), which has the applicant's file reference 01055P and was filed on May 15, 2001. The content of that application is hereby incorporated by reference in the present application.

The object of the invention is to provide projection objectives for a microlithography projection-exposure installation in which the influence of birefringence, in particular intrinsic birefringence, is significantly reduced.

This object is achieved by an objective according to claim 1, 8 and 31, a microlithography projection-exposure installation according to claim 47, a method for producing semiconductor components according to claim 48, a method for producing objectives according to claim 49, a method of compensating for birefringence effects according to claim 53 and a method of manufacturing lenses according to claim 54.

Advantageous refinements of the invention become evident from the features of the dependent claims.

To minimize the influence of intrinsic birefringence, claim 1 proposes aligning the lens axes in fluoride crystal lenses in the <100> crystallographic direction. The lens axes are considered to be aligned in a principal crystallographic direction if the lens axis deviates by no more than 5° from the principal crystallographic direction. It should be noted that not all the fluoride crystal lenses of the objective have to have such an alignment of the crystallographic planes. Those lenses in which the lens axes are perpendicular to the {100} crystallographic planes will hereinafter also be referred to as (100)-lenses. The alignment of the lens axis in the <100> crystallographic direction has the advantage that the detrimental influence of the intrinsic birefringence that affects light rays traveling in the <110> crystallographic direction becomes noticeable only at larger aperture angles of the light rays than would be the case with an alignment of the lens axis in the <111> crystallographic direction. Aperture angle is understood in this connection as meaning the angle between a light ray and the optical axis outside a lens and between the light ray and the lens axis inside a lens. The corresponding light rays are affected by birefringence only when the aperture angles enter the angular range between the <100> crystallographic direction and the <110> crystallographic direction. The angle between the <100> crystallographic direction and the <110> crystallographic direction is 45°. If on the other hand, the lens axis were aligned in the <111> crystallographic direction, the detrimental influence of intrinsic birefringence would become noticeable already at smaller aperture angles, because the angle between the <110> crystallographic direction and the <111> crystallographic direction is only 35°.

Of course, the inventive concepts disclosed herein are likewise applicable to lessen the detrimental influence of birefringence in cases where the angular dependency of the birefringence is caused for example by the manufacturing process of the fluoride crystal or the mechanical loading of the lens, in particular stress-induced birefringence.

The lens axis may be defined for example by a symmetry axis of a rotationally symmetrical lens. If the lens does not have a symmetry axis, the lens axis may be defined as the center of an incident bundle of rays, or by a straight line in relation to which the ray angles of all light rays within the lens are minimal. The lenses may be for example refractive or diffractive lenses as well as correction plates with free-form corrective surfaces. Planar-parallel plates are likewise considered as lenses if they are arranged in the path of rays of the objective. In a planar-parallel plate, the lens axis is perpendicular to the planar lens surfaces.

Preferably, however, the lenses are rotationally symmetrical lenses.

Objectives have an optical axis which runs from the object plane to the image plane. The (100)-lenses are preferably constructed such that they are centered about this optical axis, so that the lens axes also coincide with the optical axis.

An advantageous application of the invention is in projection objectives for a microlithography projection-exposure installation, because these objectives must meet extremely stringent requirements with respect to their optical resolution. But birefringence also has a detrimental influence on lens-testing objectives that are used for example to test lenses for projection objectives by measuring wave fronts of large aperture.

In objectives with large numerical apertures on the image side, particularly of more than 0.7, there will be aperture angles inside the (100)-lenses that exceed 25°, in particular exceed 30°. The inventive concept of orienting the lens axes in the <100> crystallographic direction is used to particular advantage with these large aperture angles. If the lens axes were oriented in the <111> crystallographic direction, the light rays with aperture angles exceeding 25°, in particular exceeding 30°, would be more noticeably affected by the detrimental influence of birefringence unless one of the corrective measures described farther below is used.

Since, on the other hand, the detrimental influence of intrinsic birefringence can reach a maximum at an aperture angle of 45°, and it is advantageous to design the projection objective in such a way that all the aperture angles of the light rays are smaller than 45°, in particular no larger than $$\arcsin\left(\frac{NA}{n_{FK}}\right),$$

where NA denotes the numerical aperture on the image side and $n_{FK}$ denotes the refractive index of the fluoride crystal. The expression arcsin $$\left(\frac{NA}{n_{FK}}\right)$$

indicates the aperture angle that corresponds to the image-side numerical aperture inside a fluoride crystal lens if the light ray is refracted at a planar boundary surface. This is achieved if the lenses that are arranged near the image plane have surfaces that converge the light rays, planar surfaces, or surfaces that diverge the passing light rays only slightly, provided that the light-diverging lens surface is followed in the direction of the light by a lens surface that converges the light rays more strongly.

Large aperture angles occur primarily with lenses that are arranged near field planes, in particular near the image plane. The (100)-lenses should therefore preferably be used in the region of the field planes. The region in which the (100)-lenses should be used can be determined on the basis of the ratio between the lens diameter and the diameter of the diaphragm. Therefore, the lens diameter of the (100)-lenses is preferably no more than 85%, in particular no more than 80%, of the diaphragm diameter.

As a rule, the largest aperture angles in projection objectives occur in the lens closest to the image plane. This is therefore the preferred lens in which to align the lens axis in the <100> crystallographic direction.

In addition to its dependence on the aperture angle of a light ray, the intrinsic birefringence of a fluoride crystal lens is also dependent on the azimuth angle of the light ray. Therefore, every fluoride crystal lens can be assigned a birefringence distribution $\Delta n(\alpha_L, \theta_L)$ which is on the one hand a function of the aperture angle $\theta_L$ and on the other hand a function of the azimuth angle $\alpha_L$. For a given ray direction that is determined by the aperture angle $\theta_L$ and the azimuth angle $\alpha_L$, the value of the birefringence $\Delta n$ (expressed in [nm/cm]) indicates the optical path difference for two mutually orthogonal states of linear polarization in relation to the physical path length traveled by the light ray inside the fluoride crystal. The intrinsic birefringence is consequently independent of the path lengths and of the shape of the lens. The optical path difference for a ray is correspondingly obtained by multiplying the birefringence by the path length traveled. The aperture angle $\theta_L$ represents the angle that a light ray encloses with the lens axis, while the azimuth angle $\alpha_L$ represents the angle between the projection of the light ray into the crystallographic plane perpendicular to the lens axis and a reference direction inextricably linked with the lens.

Because the birefringence distributions of the individual fluoride crystal lenses are angle-dependent, the rays of a bundle that converges at an image point in the image plane of the objective have angle-dependent optical path differences $\Delta OPL(\alpha_R, \theta_R)$ for two mutually orthogonal states of linear polarization. The optical path differences $\Delta OPL$ are in this case given as a function of the aperture angle $\theta_R$ and the azimuth angle $\alpha_R$. The aperture angle $\theta_R$ of a light ray is in this case defined as the angle between the direction of the ray and the optical axis in the image plane, and the azimuth angle $\alpha_R$ is defined as the angle between the projection of the light ray into the image plane and a fixed reference direction within the image plane. If the objective has at least two lenses or lens parts of fluoride crystal, it is advantageous if the lens axes of these lenses or lens parts point in a principal crystallographic direction and the lenses or lens parts are arranged such that they are rotated with respect to one another about the lens axes in such a way that the distribution $\Delta OPL(\alpha_R, \theta_R)$ of the optical path differences has significantly reduced values in comparison with an arrangement in which the lens axes point in the same principal crystallographic direction and the lenses or lens parts are installed with uniform orientation. Since, however, the birefringence distributions of the lenses have an azimuthal dependence, the rotated arrangement of the lenses can reduce the maximum value of the distribution $\Delta OPL(\alpha_R, \theta_R)$ by up to 20%, in particular by up to 25%, in comparison with a uniformly oriented installation.

Lens parts are understood for example as meaning individual lenses that are joined together in an optically seamless manner to form one individual lens by wringing. In the most general sense, lens parts refer to the components of an individual lens, the lens axes of the lens parts respectively pointing in the direction of the lens axis of the individual lens.

By installing the fluoride crystal lenses with mutually rotated orientations, the dependence of the distribution $\Delta OPL(\alpha_R, \theta_R)$ on the azimuth angle $\alpha_R$ can be significantly reduced, so that an almost rotationally symmetrical distribution $\Delta OPL(\alpha_R, \theta_R)$ is obtained.

If the lens axis is pointing in a principal crystallographic direction, the birefringence distribution $\Delta n(\alpha_L, \theta_L)$ of the lens will have a k-fold azimuthal symmetry. For example, the birefringence distribution of a (100)-lens, in which the lens axis points in the <100> crystallographic direction, has a 4-fold azimuthal symmetry, the birefringence distribution of a (111)-lens, in which the lens axis points in the <111> crystallographic direction, has a 3-fold azimuthal symmetry, and the birefringence distribution of a (110)-lens, in which the lens axis points in the <110> crystallographic direction, has a 2-fold azimuthal symmetry. Depending on the order of the azimuthal symmetry, the individual lenses or lens parts of a group are arranged with specific angles of rotation $\gamma$ at which they are rotated with respect to one another about the lens axes. The angles of rotation $\gamma$ are in this case measured between the reference directions of respective pairs of lenses or lens parts. The lens axes for the lenses of a group point in the same principal crystallographic direction or a principal crystallographic direction equivalent thereto. The reference directions of the lenses of a group are linked with the lenses in such a manner that the birefringence distributions $\Delta n(\alpha_L, \theta_0)$ for a given aperture angle $\theta_0$ have the same azimuthal profile. Consequently, the azimuthal regions with maximum birefringence occur at the same azimuth angles for all of the lenses of a group. For n lenses of a group, the angles of rotation between respective pairs of lenses are given as follows:

$$\gamma = \frac{360°}{k\,n} + m\,\frac{360°}{k} \pm 10°$$

where k stands for the degree of azimuthal symmetry, n for the number of lenses of a group and m for an arbitrary integral number. The tolerance of ±10° allows for the fact that the angles of rotation may deviate from the theoretically ideal angles, so that other constraints can be taken into account in the adjustment of the objective. A deviation from the ideal angle of rotation leads to non-optimized azimuthal compensation of the optical path differences of the lenses of a group. This can, however, be tolerated within certain limits.

For (100)-lenses, the following specification is consequently obtained for the angles of rotation:

$$\gamma = \frac{90°}{n} + m \cdot 90° \pm 10°.$$

If the group is made up of two (100)-lenses, the angle of rotation between these two lenses will ideally be 45° or 135°, 225°, . . . .

For (111)-lenses, the following specification is consequently obtained for the angles of rotation:

$$\gamma = \frac{120°}{n} + m \cdot 120° \pm 10°.$$

For (110)-lenses, the following specification is consequently obtained for the angles of rotation:

$$\gamma = \frac{180°}{n} + m \cdot 180° \pm 10°.$$

However, the distribution of the optical path differences $\Delta OPL_G(\alpha_R, \theta_R)$ can also be stated for the influence of an individual group of lenses, by only these lenses being considered in the evaluation of the birefringence and the other lenses being assumed to have no birefringence.

The lenses of a group are determined for example by an outermost aperture ray of a bundle of rays within these lenses having in each case similar aperture angles, the aperture angles of the outermost aperture ray within these lenses advantageously being greater than 15°, in particular greater than 20°. The outermost aperture ray refers to a light ray that originates from an object point and whose height in the diaphragm plane corresponds to the radius of the diaphragm, and which consequently has in the image plane an angle according to the numerical aperture on the image side. The outermost aperture rays are used to define the groups because they normally have the largest aperture angles inside the lenses and are therefore most affected by birefringence. The determination of the optical path difference for two mutually orthogonal states of linear polarization for the outermost aperture rays consequently provides information about the maximum extent to which a wave front is affected by the birefringence.

It is further advantageous if the path lengths traveled by the outermost aperture ray are equal in each of these lenses. These measures provide good compensation of the azimuthal contributions to the distribution of the optical path differences that are caused by the individual lenses of a group, so that the resulting distribution of the optical path differences comes close to being rotationally symmetrical.

It is further of advantage if the outermost aperture ray has approximately equal optical path differences for two mutually orthogonal states of linear polarization in each lens of a group if the lenses are arranged with the same orientation. If this condition is met, the mutually rotated arrangement of these lenses will provide an optimized compensation of the azimuthal contributions.

In the case of planar-parallel adjacent (100)- or (111)-lenses of equal thickness or of four planar-parallel adjacent (110)-lenses of equal thickness, a rotationally symmetrical distribution of the optical path differences $\Delta OPL$ is obtained by rotating the lenses in accordance with the above formulas. In the case of lenses with curved surfaces, it is likewise possible to achieve an approximately rotationally symmetrical distribution of the optical path differences even by rotating only two lenses if the lenses of a group are carefully selected or the thicknesses and radii of the lenses are appropriately selected. In the case of (100)-lenses or (111)-lenses, it is advantageous if a group has two lenses. In the case of (110)-lenses, an approximately rotationally symmetrical distribution of the optical path differences is achieved for four lenses in a group.

The measure of rotating the lenses is particularly effective if the lenses are arranged adjacently. It is particularly advantageous to divide a lens into two parts and to join the lens parts together, such that they are rotated with respect to one another, in an optically seamless manner, for example by wringing.

In the case of a projection objective with a multitude of lenses, it is beneficial to form several groups of lenses, where the lenses of a group are arranged such that they are rotated about the lens axes in such a way that the resulting distribution $\Delta OPL$ ($\alpha_R$, $\theta_R$) is virtually independent of the azimuth angle.

While the mutual rotation of the lenses of a group makes the distributions $\Delta OPL_G(\alpha_R, \theta_R)$ caused by the individual groups virtually independent of the azimuth angle, the maximum value of the overall distribution $\Delta OPL(\alpha_R, \theta_R)$ of the entire objective can be significantly reduced by the projection objective having both at least one group with (100)-lenses and at least one group with (111)-lenses. Good compensation is also possible if a group with (110)-lenses is arranged within the objective in addition to a group with (100)-lenses.

The reason why the compensation is possible is that the birefringence has not only an absolute value but also a direction. The detrimental influence of the birefringence is optimally compensated if the distribution of the optical path differences $\Delta OPL_1(\alpha_R, \theta_R)$ caused by the lenses or lens parts of all of the groups with (100)-lenses has maximum values of similar magnitude to those of the distribution of the optical path differences $\Delta OPL_2(\alpha_R, \theta_R)$ caused by the lenses or lens parts of all of the groups with (111)- or (110)-lenses.

A further advantageous possibility of reducing the detrimental influence of the birefringence is to cover an optical element of the projection objective with a compensation coating. This is based on the known fact that every optical coating, for example antireflection or mirror coatings, not only have properties with respect to reflection and transmission but also always produce optical path differences for two mutually orthogonal states of linear polarization. The effect is different depending on whether the light is s-polarized or p-polarized and depends furthermore on the angle of incidence at which the light ray meets the coating. Therefore, the birefringence in this case depends on the angle of incidence. For a bundle of rays whose central ray meets the compensation coating at an angle of incidence of 0°, the values and directions of the birefringence are rotationally symmetrical in relation to the central ray. The compensation coating is designed to produce a specific amount of birefringence as a function of the aperture angle of the light rays of a bundle of rays.

As a first step for this, the distribution of the optical path differences $\Delta OPL(\alpha_R, \theta_R)$ is determined for two mutually orthogonal states of linear polarization for a bundle of rays in the image plane of the projection objective. The aperture angle $\theta_R$ of a light ray is thereby determined between the direction of the ray and the optical axis in the image plane, the azimuth angle $\alpha_R$ between the projected direction of the ray into the image plane and a fixed reference direction within the image plane. In this case, the distribution of the optical path differences $\Delta OPL$ ($\alpha_R$, $\theta_R$) for two mutually orthogonal states of linear polarization describes all the influences brought about by intrinsic birefringence of fluoride crystal lenses, stress-induced birefringence, covering the optical elements with antireflection coatings of lenses or mirror coatings.

The distribution of the optical path differences $\Delta OPL(\alpha_R, \theta_R)$ is used to determine the effective birefringence distribution of the compensation coating that is applied to an optical element with an element axis. Examples of optical elements that are used are refractive or diffractive lenses, planar-parallel plates or mirrors. The optical surfaces of the optical element are defined as the areas that perform an optical function, that is normally the front and back surfaces. The element axis is provided for example by an axis of symmetry of a rotationally symmetrical lens. If the lens has no axis of symmetry, the element axis can be defined by the center of an incident bundle of rays or by a straight line in relation to which the ray angles of all light rays within the lens are minimal. The effective birefringence values depend on azimuth angles $\alpha_F$ that are based on a reference direction perpendicular to the element axis and on aperture angles $\theta_F$ that are based on the element axis.

A value pair ($\alpha_F$, $\theta_F$) relating to the optical element has its corresponding counterpart in a value pair ($\alpha_R$, $\theta_R$) of a ray in the image plane.

The effective birefringence distribution of the compensation coating is then determined in such a manner that the distribution of the optical path differences for two mutually orthogonal states of linear polarization are significantly reduced for the overall system including the compensation coating in comparison with the distribution without the compensation coating.

It is possible to influence the effective birefringence distribution through the selection of the material, the thickness profiles and the vapor-depositing angles for the individual layers of the compensation coating. The design of the coating and the process parameters are obtained here by using computer programs for coating design that determine the thickness profiles of the individual coatings and the process parameters from the effective birefringence distribution, the specified materials and the geometry of the optical element.

The compensation coating can in this case also be applied to more than one optical element. This increases the degrees of freedom in determining the compensation layers which, in addition to their compensating function, should also ensure a high degree of transmissivity of the coating.

Typical distributions of the optical path differences $\Delta\text{OPL}(\alpha_R, \theta_R)$ for two mutually orthogonal states of linear polarization have small path differences for the aperture angle $\theta_R=0°$. It is therefore beneficial if the birefringent effect of the compensation coating for the aperture angle $\theta_F=0°$ is close to zero. This is achieved if no large vapor-depositing angles are used in producing the compensation coating. It is therefore advantageous if the optical surface of the optical element to which the compensation coating is applied has the least possible curvature.

It is also possible that the compensation coating has a birefringence distribution with locally varying birefringence, so that regions with greater or lesser phase splitting are produced. The variation of the birefringence here comprises both variations in the absolute value of the phase splitting and variations in the direction, that is a directional dependence, which is given for example by the alignment of the principal axes which describe the birefringence effect. The birefringence distribution may for example be rotationally symmetrical to an element axis of the element provided with the coating. For example, a birefringence increasing or decreasing in a defined manner in the radial direction, that is from the center to the edge of the optical element, may be provided here. By selective control of the radial birefringence distribution, the compensation effect can be optimally adapted to different surface curvatures of the coated surfaces.

It is also possible that the birefringence distribution is not rotationally symmetrical. It may for example have an azimuthal modulation of the intensity of the birefringence, in particular with a birefringence distribution which has multiple radial symmetry, in particular 2-fold, 3-fold, 4-fold or 6-fold symmetry, with respect to the element axis. This allows for example at least partial compensation of an azimuthal modulation of the birefringence properties of a substrate having intrinsic birefringence, for example a substrate of <110>, <111> or <100>-oriented fluoride single crystal.

A coating of at least one optical surface of an optical component of an optical system may also be formed as an anisotropic coating and serve for example as a compensation coating. Elements with "anisotropic" coating may be useful independently of the other features of the invention and are explained in more detail below.

By rotating lenses of (100)- or (111)-orientation with respect to one another, approximately rotationally symmetrical distribution of the optical path differences $\Delta\text{OPL}(\alpha_R, \theta_R)$ in the image plane is obtained as described above, the distribution depending only on the aperture angle $\theta_R$. The optical path differences can be further reduced by an optical element being provided with a compensation coating that has an effective birefringence distribution primarily depending only on the aperture angle $\theta_F$. This is achieved through homogenous thicknesses of the individual layers of the compensation coating over the optical element without variable thickness profiles.

The invention can be advantageously used by designing the optical element with the compensation coating as an interchangeable element.

The optical element nearest to the image plane is advantageously used for this.

In the process of realizing this concept, a first step comprises determining the distribution of the optical path differences $\Delta\text{OPL}(\alpha_R, \theta_R)$ for two mutually orthogonal states of linear polarization for a bundle of rays in the image plane. In this step, the influence of all optical elements of the objective, including the coatings, is taken into account. The optical element to which the compensation coating is applied in a subsequent step is likewise in the path of rays of the bundle of rays during this step.

In a second step, the method described above is used to determine the effective birefringence distribution of a compensation coating and the resulting thickness profiles of the individual layers as well as the process parameters for producing the individual layers. In a third step, the optical element is removed from the path of rays and covered with the compensation coating. If the optical surface of the optical element is already covered with a coating, the existing coating is removed before the new coating is applied.

In a fourth step, the optical element with the compensation coating is returned to its original location within the objective.

The preferred material for the lenses in projection objectives is calcium fluoride, because calcium fluoride used together with quartz is particularly well-suited for color correction at a working wavelength of 193 nm and has an adequate transmissivity at a working wavelength of 157 nm. But the same can also be said for the fluoride crystals strontium fluoride or barium fluoride, because they are crystals of the same cubic crystal type.

The detrimental influence of the intrinsic birefringence is particularly noticeable if the light rays have large aperture angles within the lenses. This is the case for projection objectives which have a numerical aperture on the image side which is greater than 0.7, in particular greater than 0.8.

The intrinsic birefringence increases significantly with decreasing working wavelength. Therefore, in comparison to a wavelength of 248 nm, the intrinsic birefringence is more than twice as large at a wavelength of 193 nm and more than five times as large at a wavelength of 157 nm. The invention can therefore be used to particular advantage if the light rays have wavelengths of less than 200 nm, in particular less than 160 nm.

The objective may be a purely refractive projection objective comprising a multiplicity of lenses arranged with rotational symmetry about the optical axis, or it may be a projection objective of the catadioptric type of objectives.

Projection objectives of this type can be used advantageously in microlithography projection-exposure installations in which the light source is followed by an illuminating system, a mask-positioning system, a structure-bearing mask, a projection objective, an object-positioning system, and a light-sensitive substrate.

This microlithography projection-exposure installation can serve for producing micro-structured semiconductor components.

The invention also provides a suitable method for producing objectives. According to the method, lenses or lens parts of fluoride crystal whose lens axes point in a principal crystallographic direction are arranged such that they are rotated about the lens axes in such a way that the distribution $\Delta\text{OPL}(\alpha_R, \theta_R)$ has significantly reduced values in comparison with a lens arrangement in which the lens axes of the fluoride crystal lenses point in the same principal crystallographic direction and in which the lenses are arranged with the same orientation.

The method further envisages forming groups with (100)-lenses and groups with (111)-lenses or (110)-lenses and using the groups in parallel. The method is used for example in the case of a projection objective comprising at least two fluoride crystal lenses in <100>-orientation and at least two lenses in <111>-orientation. The position of the reference directions is also known for these lenses. The method makes use of the inventive concept that the maximum values of the distribution $\Delta OPL(\alpha_R, \theta_R)$ of the optical path differences can be significantly reduced by rotating the fluoride crystal lenses about the optical axis. Using suitable simulation methods, a bundle of rays originating from an object point is propagated through a projection objective and, based on the known optical properties of the fluoride crystal lenses, the distribution $\Delta OPL(\alpha_R, \theta_R)$ in the image plane is determined. In an optimizing step, the angles of rotation between the fluoride crystal lenses are varied until the birefringence has tolerable values. The optimizing step can also take into account further constraints, such as for example the compensation of non-rotationally symmetrical lens errors by rotating the lenses. This optimizing step allows the maximum value of the distribution $\Delta OPL(\alpha_R, \theta_R)$ to be reduced by up to 30%, in particular up to 50%, in comparison with a projection objective in which the fluoride crystal lenses are arranged with the same orientation. The optimization procedure may also include an intermediate step. In this intermediate step, the fluoride crystal lenses are assigned to groups in such a manner that, with equal orientation of the lenses, the lenses of a group produce for an outermost aperture ray a similar optical path difference between two mutually orthogonal states of linear polarization. In the subsequent optimizing step, the lenses are then rotated only within the groups in order to reduce the optical path differences. So, the (100)-lenses may be rotated first in such a way that the optical path differences caused by the (100)-lenses are reduced, and then the (111)-lenses are rotated in such a way that the optical path differences caused by the (111)-lenses are reduced. The distribution of the fluoride crystal lenses between lenses with (100)-orientation and (111)-orientation must take place during the optimization in such a way that the resulting (100)-distribution $\Delta OPL_{100}(\alpha_R, \theta_R)$ and the resulting (111)-distribution $\Delta OPL_{111}(\alpha_R, \theta_R)$ compensate one another to a large extent. A corresponding statement also applies to the parallel use of (100)-lenses and (110)-lenses.

The invention also relates to a method of manufacturing a lens in which, in a first step, a plurality of plates of fluoride crystal are joined in an optically seamless manner to form a blank and, in a second step, the lens is produced from the blank through known manufacturing methods. The plates are in this case arranged such that they are rotated with respect to one another about the surface normals in the same manner as described above for lenses or lens parts.

Plates whose surface normals point in the same principal crystallographic direction or in a principal crystallographic direction equivalent thereto advantageously have the same axial thickness.

If (100)-plates are joined in an optically seamless manner with (111)-plates, the ratio between the sum of the thicknesses of the (111)-plates and the sum of the thicknesses of the (100)-plates should be 1.5±0.2.

If (100)-plates are joined in an optically seamless manner with (110)-plates, the ratio between the sum of the thicknesses of the (110)-plates and the sum of the thicknesses of the (100)-plates should be 4.0±0.4.

The invention also relates to optical components with at least one "anisotropic" coating. In particular, a coating of at least one optical surface of an optical component of an optical system may be formed as an anisotropic coating and serve for example as a compensation coating. For the purposes of this application, an "anisotropic" coating is a coating which has a pronounced directional dependence of its optical effect on the direction of the electrical field vectors of the incident radiation in the area of incidence. In a region considered, an anisotropic coating may consequently have a fast or slow axis, which corresponds to a preferred direction of the coating.

Anisotropic thin films with special microstructures, which can be influenced by the production conditions, and resultant anisotropic properties are known per se. The article "Play the angles to create exotic thin films" by M. Seto and M. Brett in: Vacuum Solutions, March/April 2000, pages 26-31, describes the morphology of various thin films which can be produced by vapor deposition at high depositing angles (glancing angle deposition, GLAD). Such porous thin films, which often have columnar structures with features dependent on the coating direction, may also be useful for optical applications. Example of polarization elements of this type are specified inter alia in the article "Review of birefringent and chiral optical interference coatings" by I. Hodgkinson and Q. H. Wu in OIC 2000/2001, pages 1 and 2 or in "Birefringent Thin Film Polarizing Elements", by I. Hodgkinson and Q. H. Wu, World Scientific, Singapore, New Jersey, London, Hong Kong, ISBN 981-02-2906-2, the content of which is made the content of this description by reference.

Particularly suitable for compensation are anisotropic coatings with a local variation of the anisotropy. The variation may comprise the direction of the preferred direction and/or the absolute amount of the phase splitting produced by the coating.

To produce coatings with a birefringence distribution with a locally varying birefringence, all known coating methods can be used with suitable modification of the process control, in particular PVD processes, such as electron beam evaporation, or sputtering. When producing coatings that are at least anisotropic in certain regions, in a preferred embodiment the coating material is applied to at least one region of the substrate surface or an already existing coating at an angle of coverage, in particular a vapor-depositing angle, which is so large that an anisotropic coating structure is produced. For this purpose, it is possible, on the basis of known vapor-depositing installations, for example to reduce significantly the difference in height between a material source and the substrates, in order to achieve an inclined vapor deposition of coating material, for which typical vapor-depositing angles can lie in the range of 30° to 40° or more. Here, the angle between the direction of incidence of a coating material on the substrate surface and the surface normal of the substrate surface at the coating location is understood as the vapor-depositing angle (angle of coverage).

It has been found that it is possible by suitable modifications of known diaphragm methods to produce anisotropic coatings with a defined distribution of their birefringence properties, in particular with a defined distribution of the layer anisotropy, on flat, slightly or greatly curved optical substrates. In a variant, the following steps are carried out to control the birefringence distribution and/or the anisotropy of the coating. A rotation of the substrate about a substrate axis of rotation is produced. Preferably used for this purpose is a planetary system, in which each substrate is arranged on a substrate carrier which performs a rotation of its own about its substrate axis of rotation and a global rotation about a main axis of rotation of the planetary system. In this installation, the substrate surface is then coated with the material of a material source at large coating angles. In this case, a periodic shading of the coating material takes place during the rotation of the substrate to produce a coating time that is dependent on the radial position of the coating location, according to a prescribed radial time profile. In this case, the shading may be carried out by one or more diaphragms in such a way that small coating angles (for example <30° to 35°) are shaded, so that the material meets the substrate surface exclusively or at least predominantly at very large vapor-depositing angles (for example 40° or more) from selected directions. By suitable shaping of the diaphragms, any desired radial-symmetrical profiles of the birefringence distribution with different degrees of anisotropy can be produced.

The invention also relates to a method for producing a polarization-optical element, i.e. an optical component or arrangement with a defined effect on the state of polarization of the incident radiation, which may also be useful and able to be protected independently of the other features of the invention. The polarization-optical element may be, for example, a retardation element (retarder). The method envisages changing of the local birefringence distribution of a coating after completion of the coating operation. This changing may be carried out by local exposure of the finished coating to an energy suitable for changing the morphology of the coating according to a prescribed spatial distribution. Subsequent local changing of the layer properties may be provided in interference layer systems of all kinds (for example reflection layers, antireflection layers). It is particularly effective in the case of anisotropic coatings, since the morphologies responsible for the anisotropy are typically non-equilibrium structures with limited stability. The definition of the regions to be exposed to energy may take place for example with the aid of one or more masks. In particular, the morphology of a coating may be changed by thermal exposure. This is possible for example by irradiation with an infrared laser or some other type of irradiation producing adequate thermal energy. Working with an electron beam, possibly with a writing effect, is also possible. Alternatively or in addition to introducing energy thermally, the energy may also be applied mechanically, for example with the aid of ion beams and/or heating dies. As a particular advantage, the subsequent working of the layer structure allows non-rotationally-symmetrical birefringence distributions to be set, with a very small-scale setting of properties possibly being possible, for example with typical range sizes in the mm or cm range.

For example, layers vapor-deposited at low coating temperatures (cold), in particular anisotropic layer systems, may be changed locally in their birefringence properties by laser radiation. In this way, a polarization filter with specific local modulation of the phase splitting can be produced.

The subsequent changing of the birefringence distribution also allows changes of its polarization-optical behavior to be performed on ready-assembled optical systems, for example projection objectives for microlithography. For this purpose, the optical system may firstly be assembled using at least one component with an anisotropic coating, or some other non-equilibrium coating, and measured. The measurement result can be used to determine a desired effective birefringence distribution of the at least one compensation coating, which is required to adjust the system polarization-optically. Then, the optical element provided with the coating can be disassembled, in order to perform the subsequent changes of the layer properties locally by suitable introduction of energy. After installing the optical element changed in this way, the optical system then has the desired properties. The invention consequently also relates to a special production method for an optical system, in particular an optical system for microlithography.

The invention is explained in more detail on the basis of the drawings.

FIG. 1 shows a section through a fluoride crystal block perpendicular to the {100} crystallographic planes together with a lens of a projection objective, in schematic representation;

FIGS. 2A-C each show a planar-parallel (100)-, (111)- and (110)-lens in a schematic three-dimensional representation;

FIG. 3 shows a system of coordinates for defining the aperture angle and the azimuth angle;

FIGS. 4A-F show the birefringence distribution for (100)-lenses in various representations, and the birefringence distribution for two (100)-lenses rotated by 45° with respect to one another;

FIGS. 5A-F show the birefringence distribution for (111)-lenses in various representations, and the birefringence distribution for two (111)-lenses rotated by 60° with respect to one another;

FIGS. 6A-G show the birefringence distribution for (111)-lenses in various representations, and the birefringence distribution for two (110)-lenses rotated by 90° with respect to one another, and respectively for four (110)-lenses rotated by 45° with respect to one another;

Figure 12:
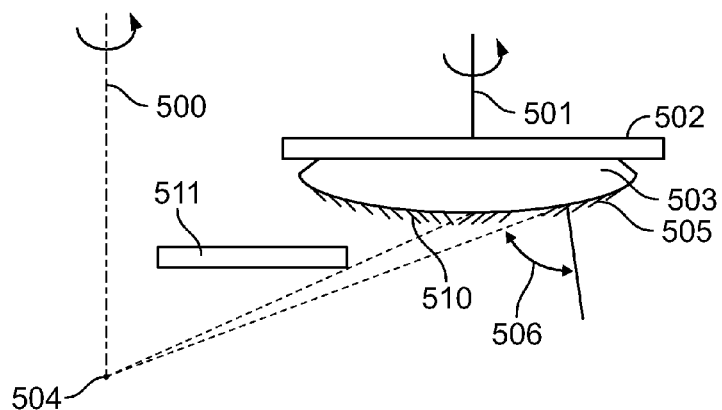
Figure 13A:
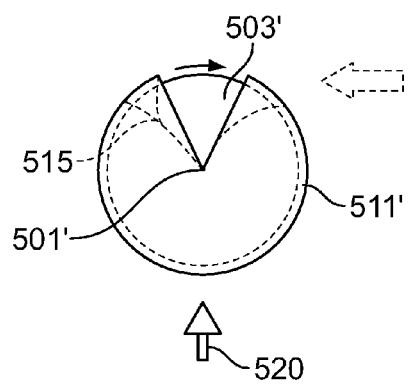
Figure 13B:
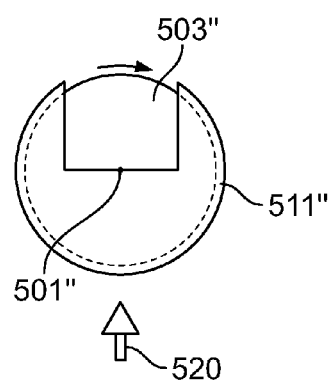
Figure 13C:
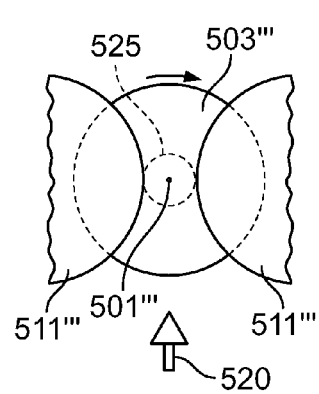
Figure 14:
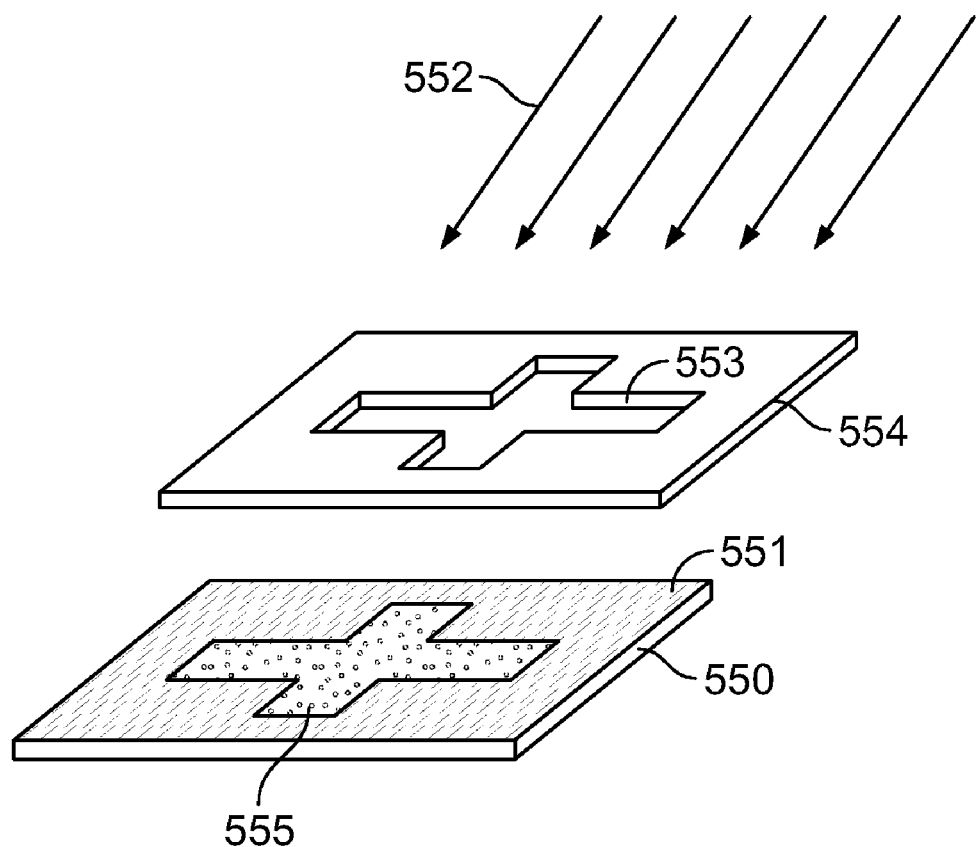

FIG. 12 schematically shows the production of an anisotropic coating on a lens in a coating installation with a planetary system;

FIG. 13 schematically shows shading geometries for the coating production with the aid of shading diaphragms; and FIG. 14 schematically shows a production method for a polarizer with subsequent changing of the properties of an anisotropic coating.

Figure 1:
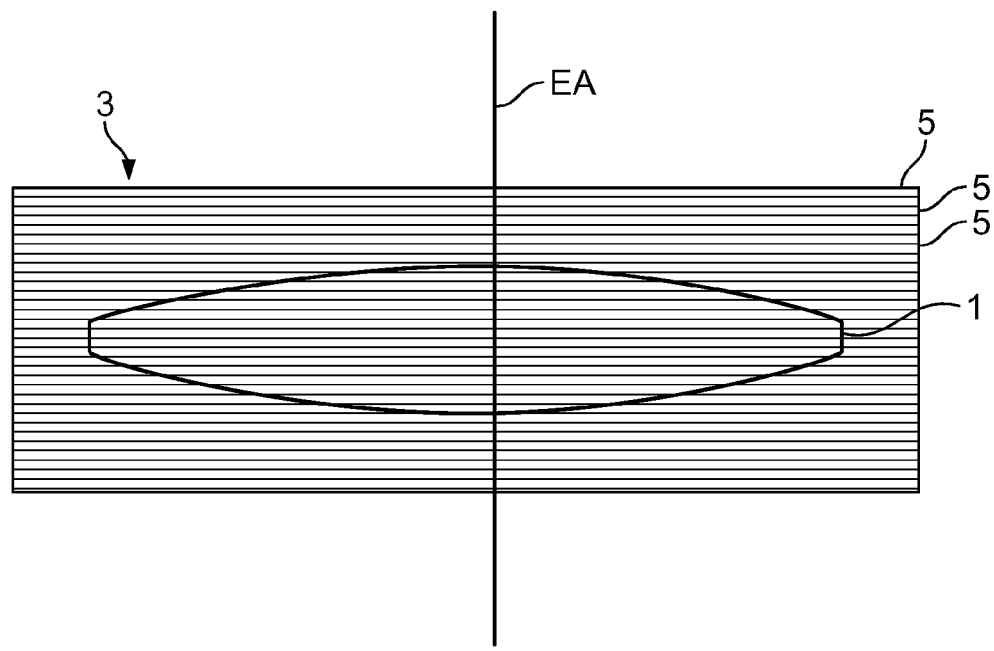

FIG. 1 schematically shows a section through a fluoride crystal block 3. The section is chosen such that the {100} crystallographic planes 5 appear as individual lines, so that the {100} crystallographic planes 5 are perpendicular to the plane of the paper. The fluoride crystal block 3 serves as a blank or starting material for the (100)-lens 1. In this example, the (100)-lens 1 is a bi-convex lens with the lens axis EA, which is at the same time the axis of symmetry of the lens. The lens 1 is formed out of the fluoride crystal block in such a manner that the lens axis EA is perpendicular to the {100} crystallographic planes.

Figure 2A:
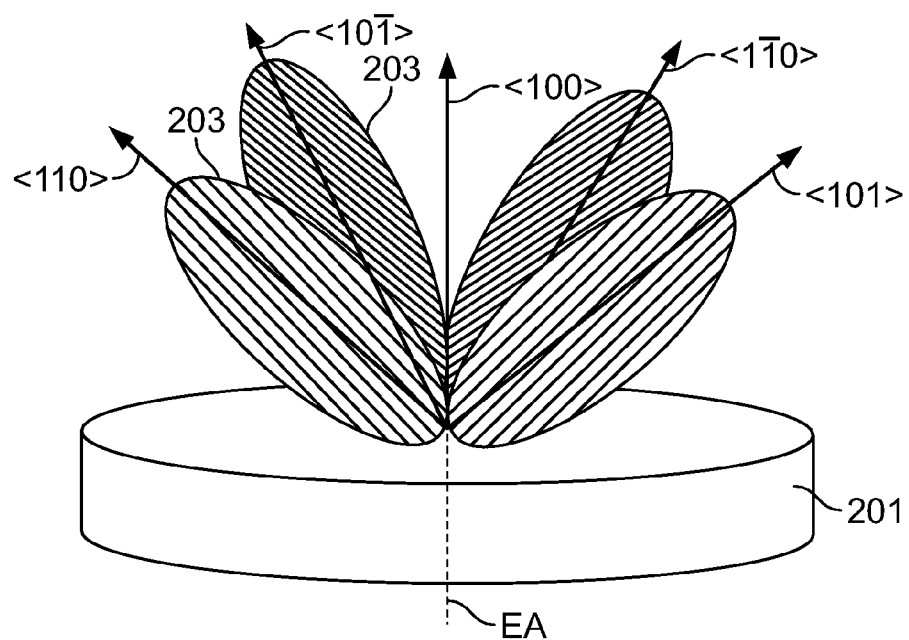

FIG. 2A illustrates by a three-dimensional representation how the intrinsic birefringence is associated with the crystallographic directions in the case where the lens axis EA points in the <100> crystallographic direction. A circular planar-parallel plate 201 of calcium fluoride is represented. The lens axis EA points in the <100> crystallographic direction. In addition to the <100> crystallographic direction, the crystallographic directions <101>, <1$\bar{1}$0>, <10$\bar{1}$> and <110> are likewise represented by arrows. The intrinsic birefringence is schematically represented by four "paddles" 203, whose surface areas indicate the amount of intrinsic birefringence for the respective direction of a light ray. The maximum intrinsic birefringence occurs in the crystallographic directions <101>, <1$\bar{1}$0>, <10$\bar{1}$> and <110>, i.e., for light rays which have inside the lens an aperture angle of 45° an azimuth angle of 0°, 90°, 180° and 270°, respectively. Minimum values of the intrinsic birefringence occur for azimuth angles of 45°, 135°, 225° and 315°. The intrinsic birefringence becomes zero for an aperture angle of 0°.

Figure 2B:
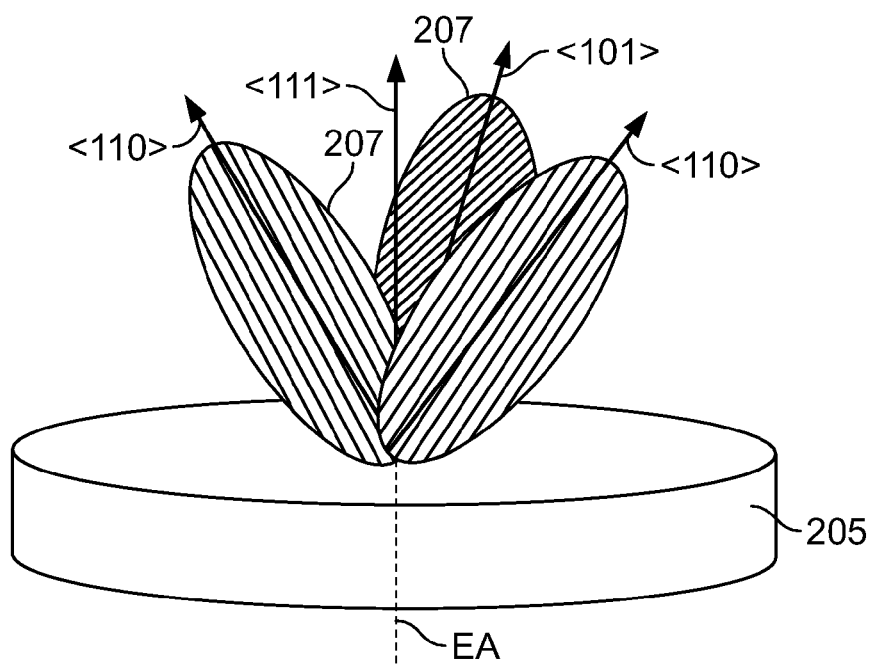

FIG. 2B illustrates by a three-dimensional representation how the intrinsic birefringence is associated with the crystallographic directions in the case where the lens axis EA points in the <111> crystallographic direction. A circular planar-parallel plate 205 of calcium fluoride is represented. The lens axis EA points in the <111> crystallographic direction. In addition to the <111> crystallographic direction, the crystallographic directions <011>, <101>, and <110> are likewise represented by arrows. The intrinsic birefringence is schematically represented by three "paddles" 207, whose surface areas indicate the amount of intrinsic birefringence for the respective direction of a light ray. The maximum intrinsic birefringence respectively occurs in the crystallographic directions <011>, <101>, and <110>, i.e. for light rays which have inside the lens an aperture angle of 35° and an azimuth angle of 0°, 120°, and 240°, respectively. Minimum values of the intrinsic birefringence occur for azimuth angles of 60°, 180°, and 300°. The intrinsic birefringence becomes zero for an aperture angle of 0°.

Figure 2C:
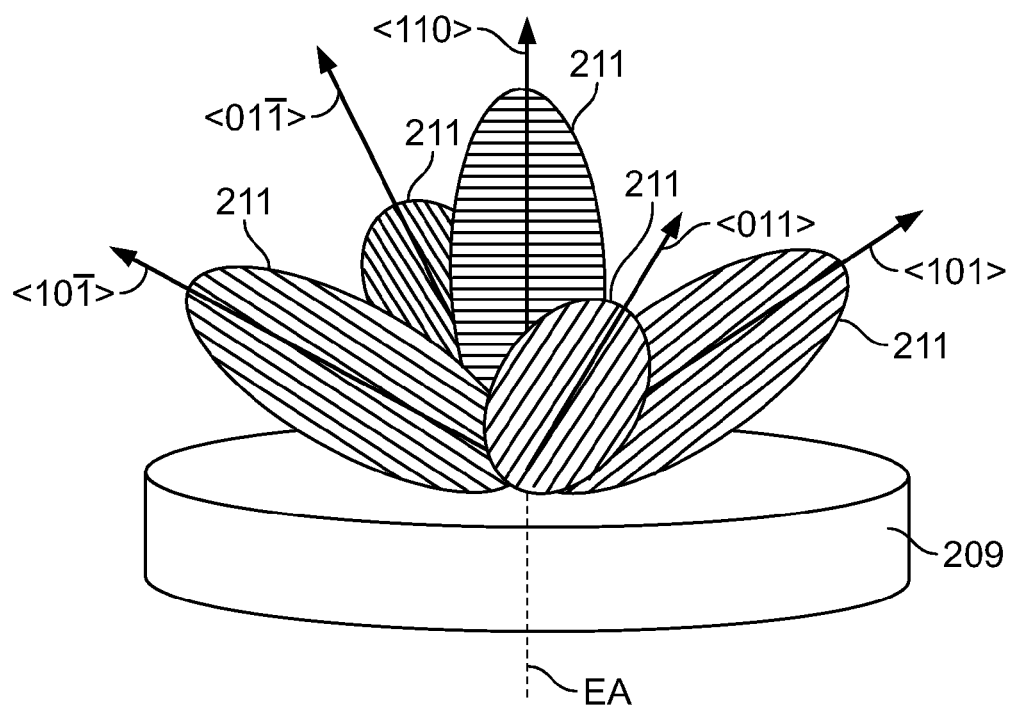

FIG. 2C illustrates by a three-dimensional representation how the intrinsic birefringence is associated with the crystallographic directions in the case where the lens axis EA points in the <110> crystallographic direction. A circular planar-parallel plate 209 of calcium fluoride is represented. The lens axis EA points in the <110> crystallographic direction. In addition to the <110> crystallographic direction, the crystallographic directions <01$\bar{1}$>, <10$\bar{1}$>, <101>, and <011> are likewise represented by arrows. The intrinsic birefringence is schematically represented by five "paddles" 211, whose surface areas indicate the amount of intrinsic birefringence for the respective direction of a light ray. The maximum intrinsic birefringence respectively occurs on the one hand in the direction of the lens axis EA, and on the other hand respectively in the crystallographic directions <01$\bar{1}$>, <10$\bar{1}$>, <101>, and <011>, i.e. for light rays with an aperture angle of 0°, or respectively with an aperture angle of 60° and the four azimuth angles obtained by projection of the <01$\bar{1}$>, <10$\bar{1}$>, <101>, and <011> crystallographic directions into the {110} crystallographic plane. However, aperture angles of this magnitude do not occur in crystal material, because the maximum aperture angles are limited to less than 45° by the refractive index of the crystal.

Figure 3:
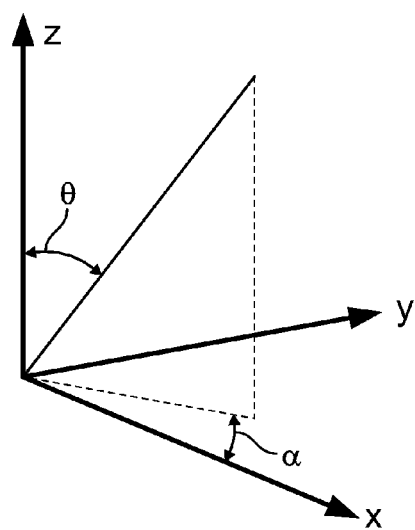

FIG. 3 illustrates how the aperture angle θ and the azimuth angle α are defined. For the (100)-lens of FIG. 2, the z-axis points in the <100> crystallographic direction, the x-axis points in the direction that is obtained by projecting the <110> crystallographic direction into the {100} crystallographic plane. The z-axis is in this case the same as the lens axis and the x-axis is the same as the reference direction.

It is known from the cited Internet publication that measurements for calcium fluoride gave a birefringence value of (6.5±0.4) nm/cm for light with a wavelength of λ=156.1 nm traveling in the <110> crystallographic direction. Using this measured value as a normalizing factor, the birefringence distribution Δn(θ, α) of a calcium fluoride lens can be calculated theoretically as a function of the crystal orientation. The calculation is based on the formalisms that are known from crystal optics for the calculation of index ellipsoids as a function of the direction of a light ray. The theoretical principles may be found for example in "Lexikon der Optik", Spektrum Akademischer Verlag Heidelberg Berlin, 1999 under the keyword "Kristalloptik".

In more recent measurements carried out by the applicant, a birefringence value of 11 nm/cm was found for light with a wavelength of λ=156.1 nm traveling in the <110> crystallographic direction in a calcium fluoride crystal. The statements made hereafter for the normalizing factor $\Delta n_{max}$=6.5 nm/cm can be converted without difficulty to the normalizing factor $\Delta n_{max}$=11 nm/cm.

Figure 4A:
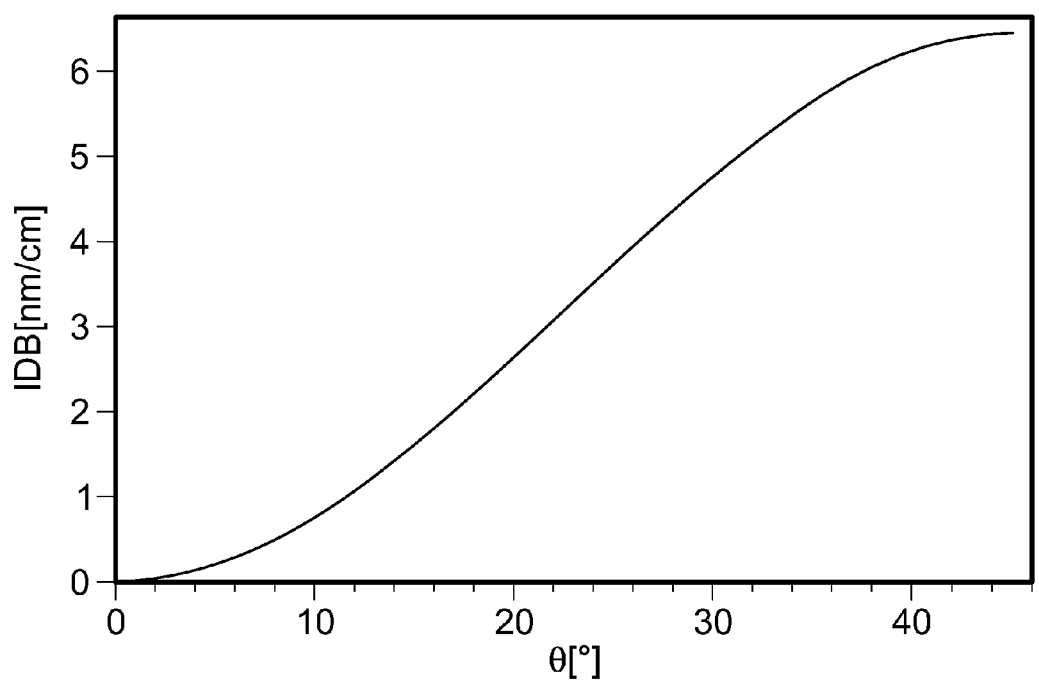

In FIG. 4A, the amount of the intrinsic birefringence is represented as a function of the aperture angle θ for the azimuth angle α=0° for a (100)-lens. The value of 6.5 nm/cm for the intrinsic birefringence at an aperture angle of θ=45° corresponds to the measured value. The curve profile was determined on the basis of the formulas that are known from crystal optics.

Figure 4B:
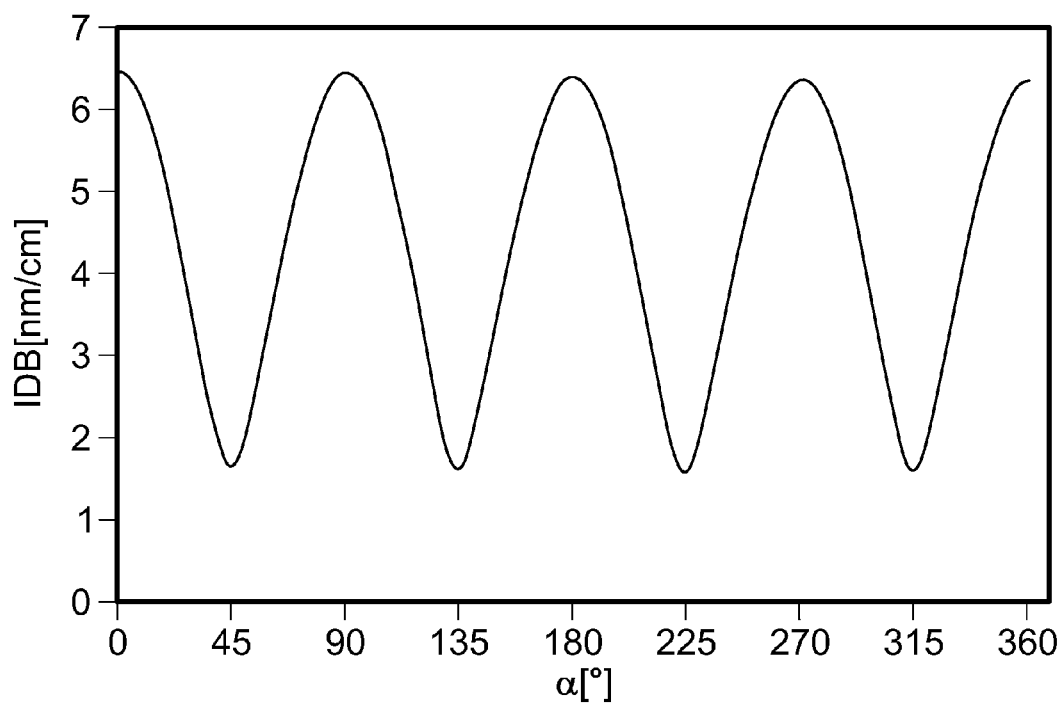

In FIG. 4B, the amount of the intrinsic birefringence is represented as a function of the azimuth angle α for the aperture angle θ=45° for a (100)-lens. The fourfold azimuthal symmetry is readily apparent.

Figure 4C:
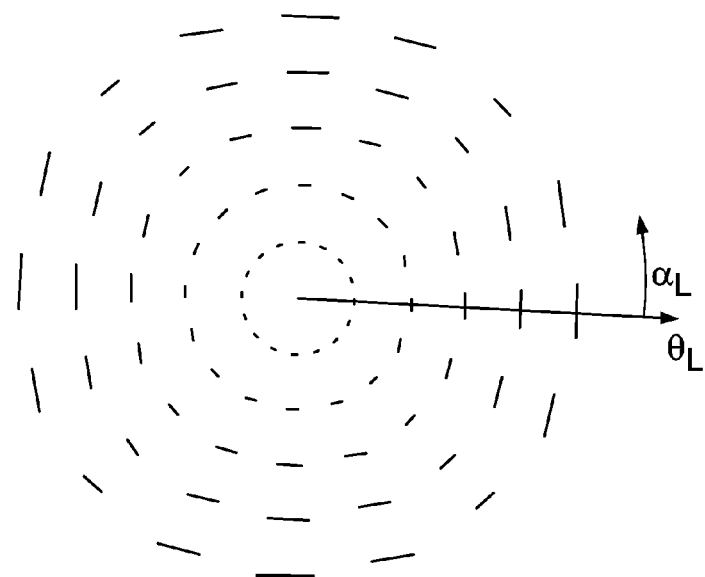

In FIG. 4C, the birefringence distribution Δn(θ, α) is represented for individual light ray directions in the (θ, α)-angular domain for a (100)-lens. Each line represents the magnitude and direction for a light ray direction defined by the aperture angle θ and the azimuth angle α. The length of the lines is in proportion to the amount of the birefringence, or the difference between the lengths of the principal axes of the intersecting ellipse, while the direction of the lines indicates the orientation of the longer principal axis of the intersecting ellipse. The intersecting ellipse is obtained as the intersection between the index ellipsoid for the ray in the direction (θ, α) and a plane which is perpendicular to the direction of the light ray and passes through the center of the index ellipsoid. Both the directions and the lengths of the lines are indicative of the four-fold symmetry of the distribution. The length of the lines, and consequently the birefringence, is largest at the azimuth angles of 0°, 90°, 180° and 270°.

Figure 4D:
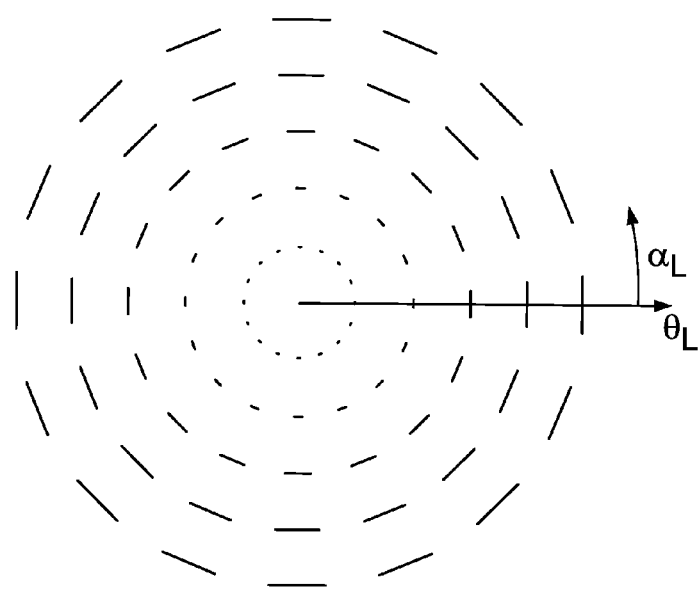

FIG. 4D then shows the birefringence distribution Δn(θ, α) that is obtained if two adjacent planar-parallel (100)-lenses of equal thickness are arranged such that they are rotated by 45°. The resulting birefringence distribution Δn(θ, α) is independent of the azimuth angle α. The longer principal axes of the intersecting ellipses run tangentially. The resultant optical path differences of two mutually orthogonal states of polarization are obtained by multiplying the birefringence values by the physical path lengths traveled by the light rays inside the planar-parallel (100)-lenses. Rotationally symmetrical birefringence distributions are obtained by arranging n planar-parallel (100)-lenses of equal thickness in such a manner that the angles of rotation β between respective pairs of lenses conform to the equation $$\beta = \frac{90°}{n} + m \cdot 90° \pm 5°,$$

where n stands for the number of the planar-parallel (100)-lenses and m is an integral number. In comparison with a uniformly oriented arrangement of the lenses, the maximum value of the birefringence for the aperture angle θ=30° can be reduced by 30%. An approximately rotationally symmetrical distribution of the optical path differences for two mutually orthogonal states of linear polarization is also obtained with lenses of an arbitrary shape if all rays of a bundle have angles of similar magnitude and cover light paths of similar length inside the lenses. The lenses should therefore be assembled into groups in such a manner that the rays satisfy the condition specified above as well as possible.

Figure 4E:
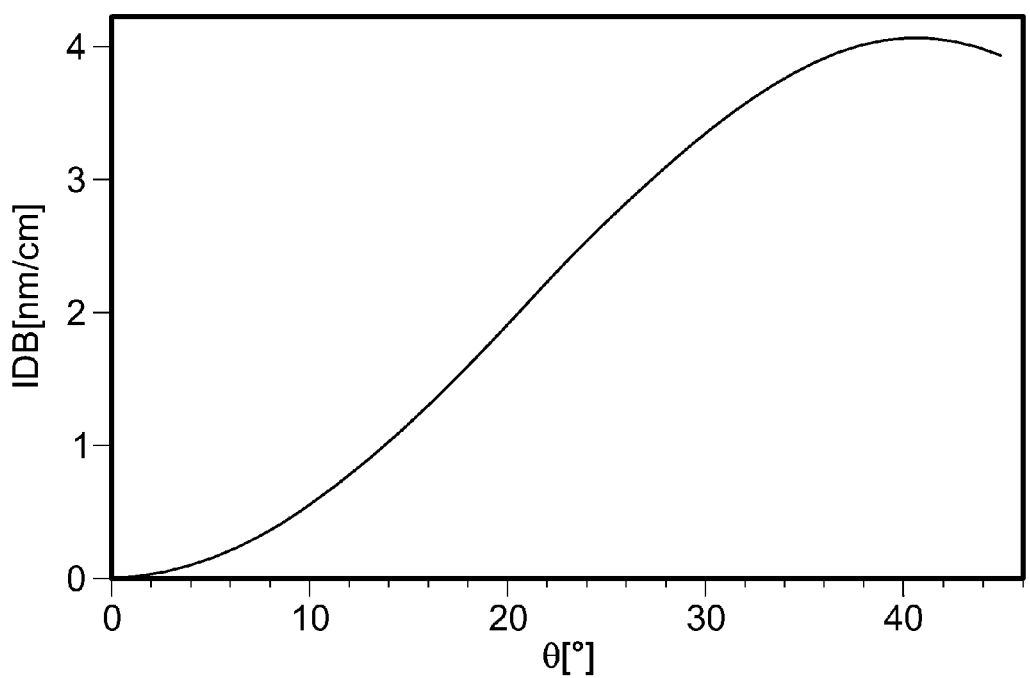

In FIG. 4E, the amount of the intrinsic birefringence is represented as a function of the aperture angle θ for the azimuth angle α=0° for the two adjacent planar-parallel (100)-lenses of equal thickness of FIG. 4D. The maximum value for the intrinsic birefringence at the aperture angle θ=41° is 4.2 nm/cm and is consequently reduced by 35% compared to the maximum value of 6.5 nm/cm in FIG. 4A.

Figure 4F:
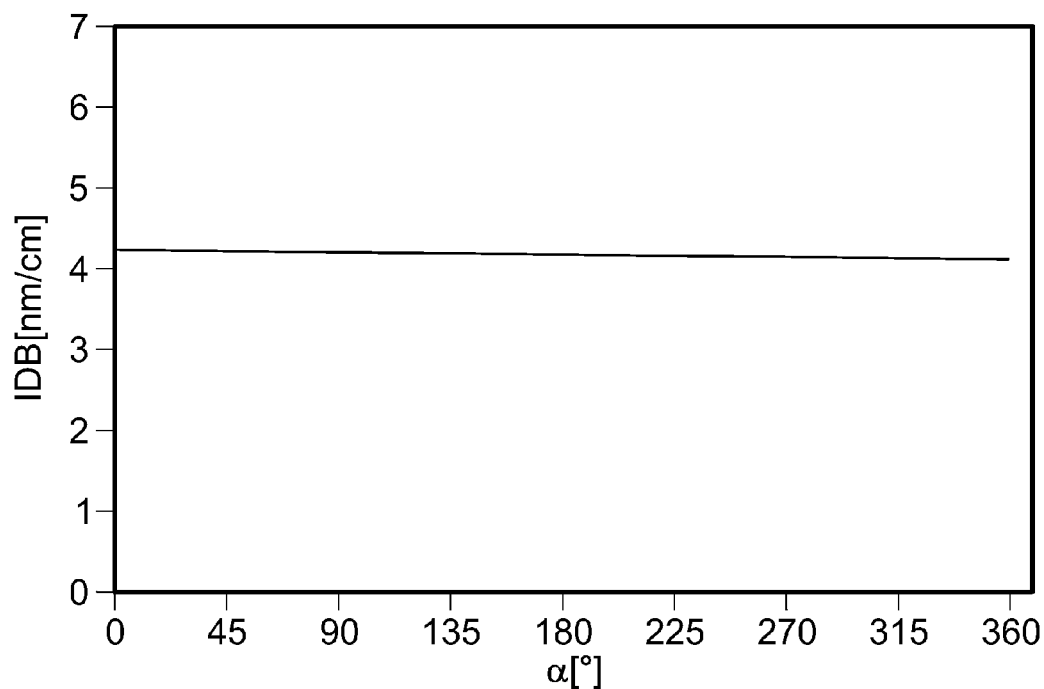

In FIG. 4F, the amount of the intrinsic birefringence is represented as a function of the azimuth angle α for the aperture angle θ=41° for the two adjacent planar-parallel (100)-lenses of equal thickness of FIG. 4D. The intrinsic birefringence is independent of the azimuth angle α.

Figure 5A:
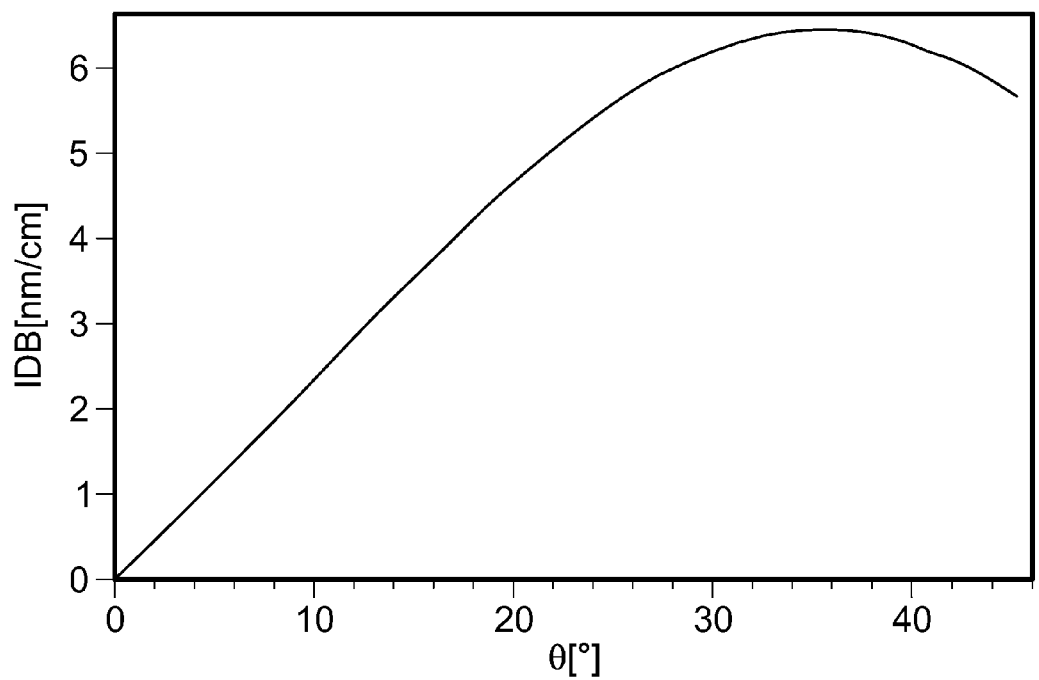

In FIG. 5A, the amount of the intrinsic birefringence is represented as a function of the aperture angle θ for the azimuth angle α=0° for a (111)-lens. The value of 6.5 nm/cm for the intrinsic birefringence at an aperture angle of θ=35° corresponds to the measured value. The curve profile was determined on the basis of the formulas that are known from crystal optics.

Figure 5B:
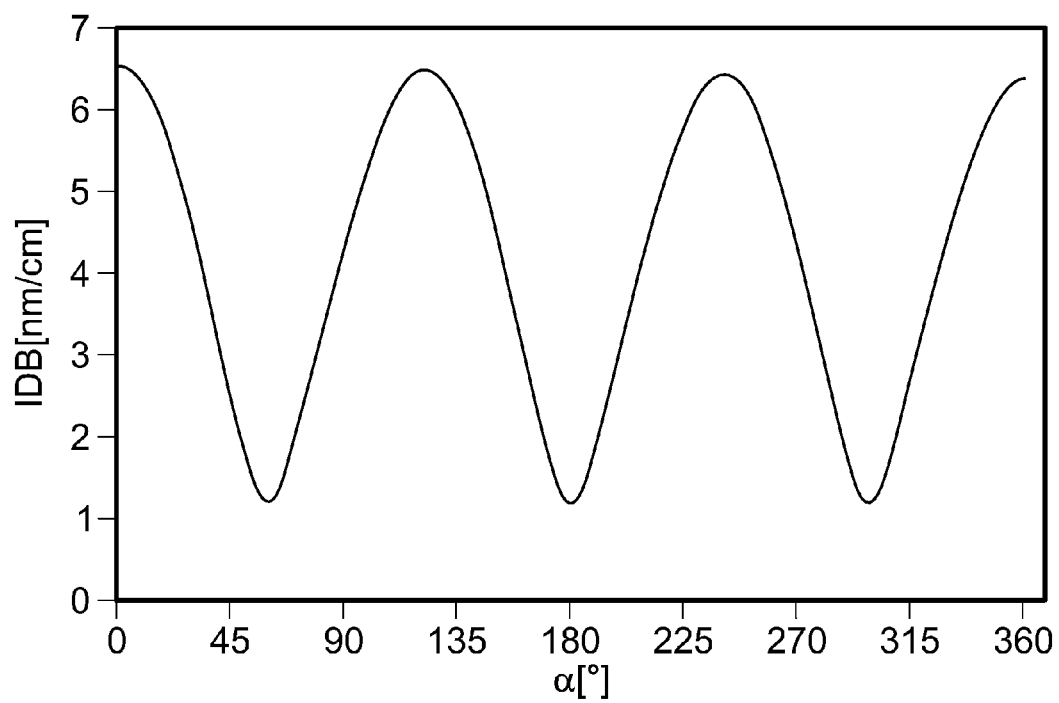

In FIG. 5B, the amount of the intrinsic birefringence is represented as a function of the azimuth angle α for the aperture angle θ=35° for a (111)-lens. The threefold azimuthal symmetry is readily apparent.

Figure 5C:
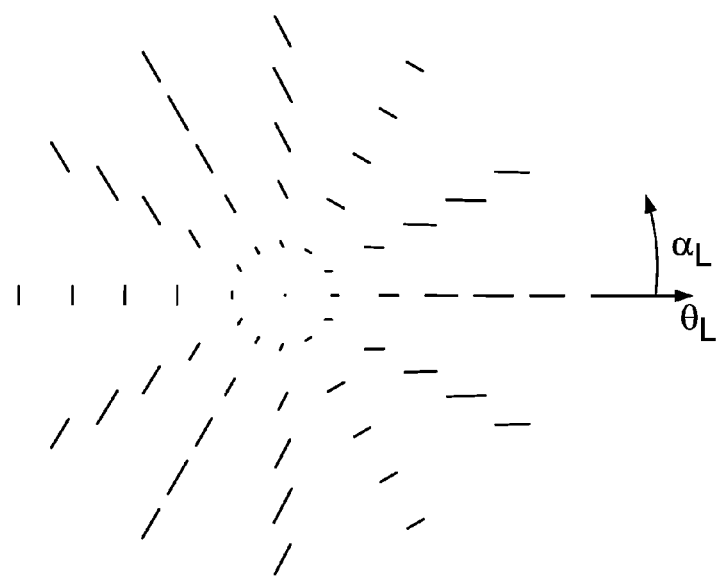

FIG. 5C shows the birefringence distribution Δn(θ, α) for individual light ray directions in the (θ, α)-angular domain for a (111)-lens in the same form as that already represented by FIG. 4C. Both the directions and the lengths of the lines are indicative of the threefold symmetry of the distribution. The length of the lines, and consequently the birefringence, is largest at the azimuth angles of 0°, 120°, and 2400. By contrast with a (100)-lens, the orientation of the birefringence turns by 90° when a light ray passes through a lens with an azimuth angle of 180° instead of with an azimuth angle of 0°. Consequently, the birefringence can be compensated, for example, by two (111)-lenses of the same orientation if the ray angles of a bundle of rays change over their signs between the two lenses.

Figure 5D:
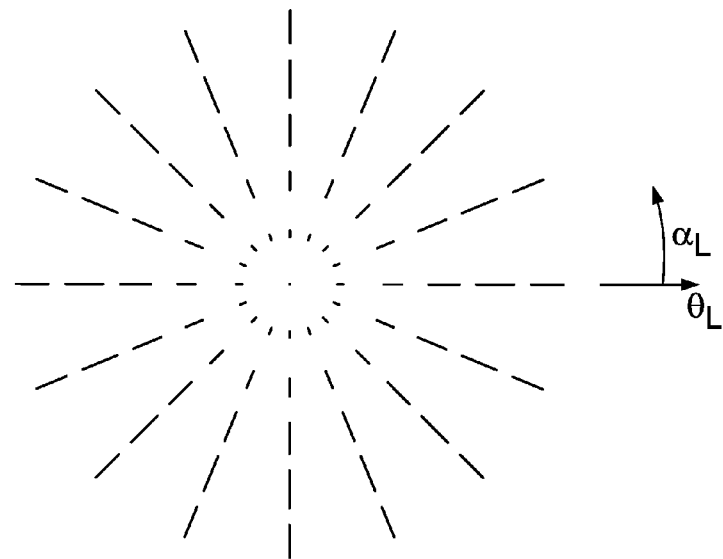

FIG. 5D then shows the birefringence distribution Δn(θ, α) that is obtained if two adjacent planar-parallel (111)-lenses of equal thickness are arranged such that they are rotated by 60°. The resulting birefringence distribution Δn(θ, α) is independent of the azimuth angle α. However, by contrast with FIG. 4C, the longer principal axes of the intersecting ellipses run radially. The resultant optical path differences of two mutually orthogonal states of polarization are obtained by multiplying the birefringence values by the physical path lengths traveled by the light rays inside the (111)-lenses. Rotationally symmetrical birefringence distributions are likewise obtained by arranging n planar-parallel (111)-lenses of equal thickness in such a manner that the angles of rotation between respective pairs of lenses conform to the equation $$\gamma = \frac{120°}{k} + 1 \cdot 120° \pm 5°,$$

where k stands for the number of the planar-parallel (111)-lenses and 1 is an integral number. In comparison with a uniformly oriented arrangement of the lenses, the value of the birefringence for the aperture angle θ=30° can be reduced by 68%. An approximately rotationally symmetrical distribution of the optical path differences for two mutually orthogonal states of linear polarization is also obtained with lenses of an arbitrary shape if all rays of a bundle in the lenses have angles of similar magnitude and cover light paths of similar length inside the lenses. The lenses should therefore be assembled into groups in such a manner that the rays satisfy the condition specified above as well as possible.

Figure 5E:
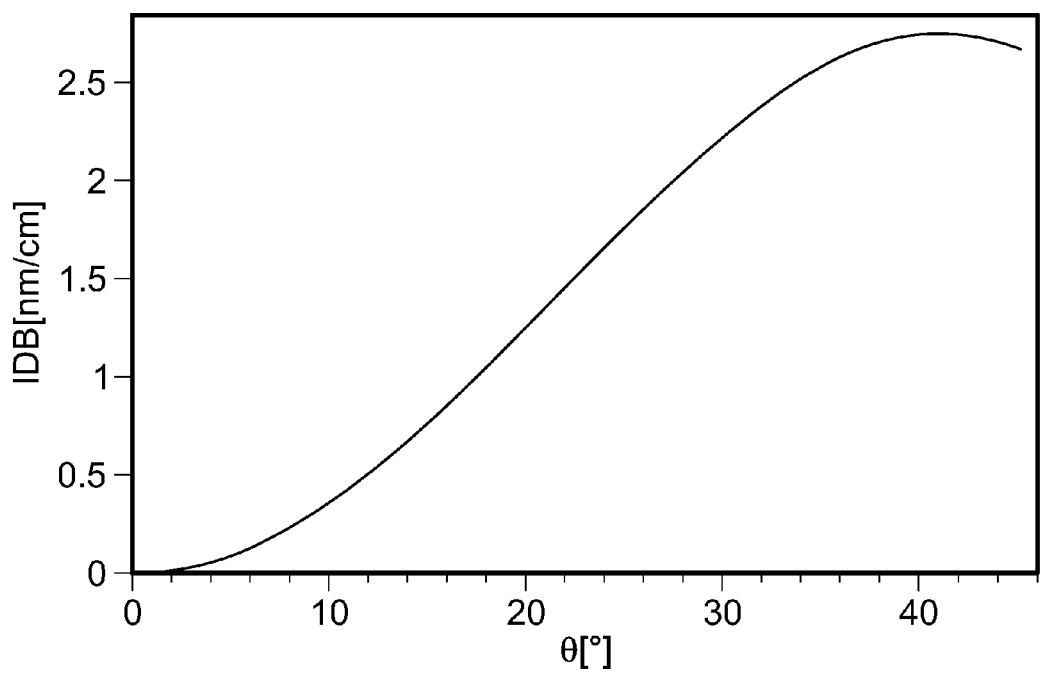

In FIG. 5E, the amount of the intrinsic birefringence is represented as a function of the aperture angle θ for the azimuth angle α=0° for the two adjacent planar-parallel (111)-lenses of equal thickness of FIG. 5D. The maximum value for the intrinsic birefringence at the aperture angle θ=41° is 2.8 nm/cm and is consequently reduced by 57% compared to the maximum value of 6.5 nm/cm in FIG. 5A.

Figure 5F:
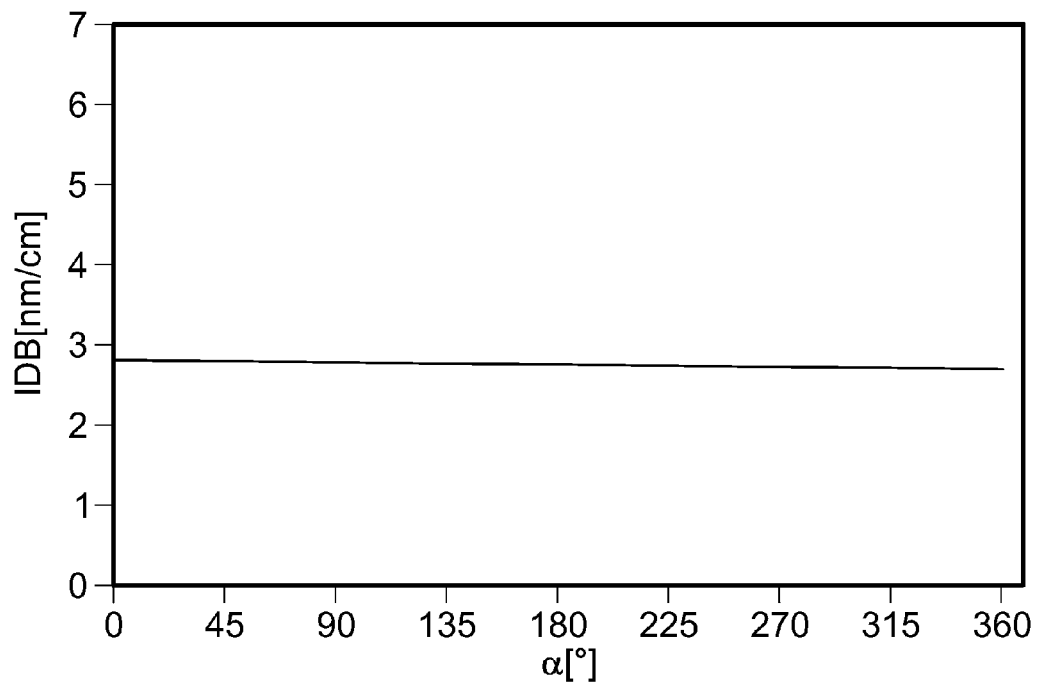

In FIG. 5F, the amount of the intrinsic birefringence is represented as a function of the azimuth angle α for the aperture angle θ=41' for the two adjacent planar-parallel (111)-lenses of equal thickness of FIG. 5D. The intrinsic birefringence is independent of the azimuth angle α.

By combining groups with (100)-lenses and groups with (111)-lenses within a projection objective, the optical path differences produced by these lenses for two mutually orthogonal states of linear polarization can be compensated to a large extent. This requires that an approximately rotationally symmetrical distribution of the optical path differences is first obtained within these groups by rotating the lenses and that the two distributions of optical path differences are then compensated by combining a group with (100)-lenses and a group with (111)-lenses. The compensation takes advantage of the fact that the orientations of the longer principal axes of the intersecting ellipses for the birefringence distribution of a group with rotated (100)-lenses is perpendicular to the orientations of the longer principal axes of the intersecting ellipses for the birefringence distribution of a group with rotated (111)-lenses, as can be seen in FIGS. 4D and 5D. It is of importance that on the one hand the individual groups generate an approximately rotationally symmetrical distribution of the optical path differences, and on the other hand that the sum of the contributions of the groups with (100)-lenses is of approximately equal absolute magnitude as the sum of the contributions of the groups with (111)-lenses.

Figure 6A:
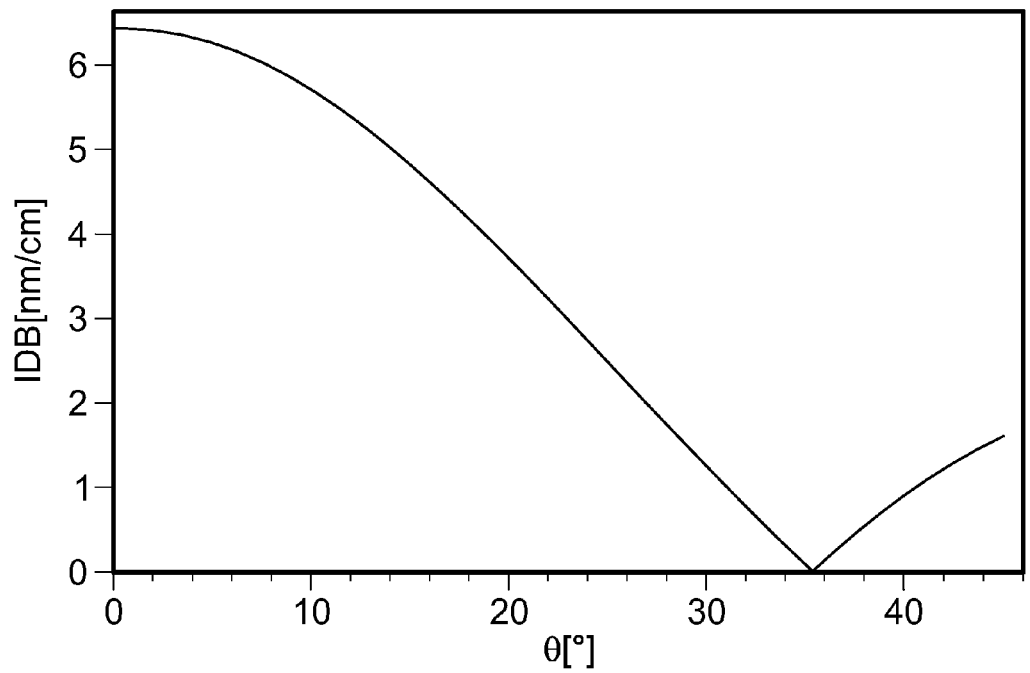

In FIG. 6A, the amount of the intrinsic birefringence is represented as a function of the aperture angle θ for the azimuth angle α=0° for a (110)-lens. The value of 6.5 nm/cm for the intrinsic birefringence at an aperture angle of θ=0° corresponds to the measured value. The curve profile was determined on the basis of the formulas that are known from crystal optics.

Figure 6B:
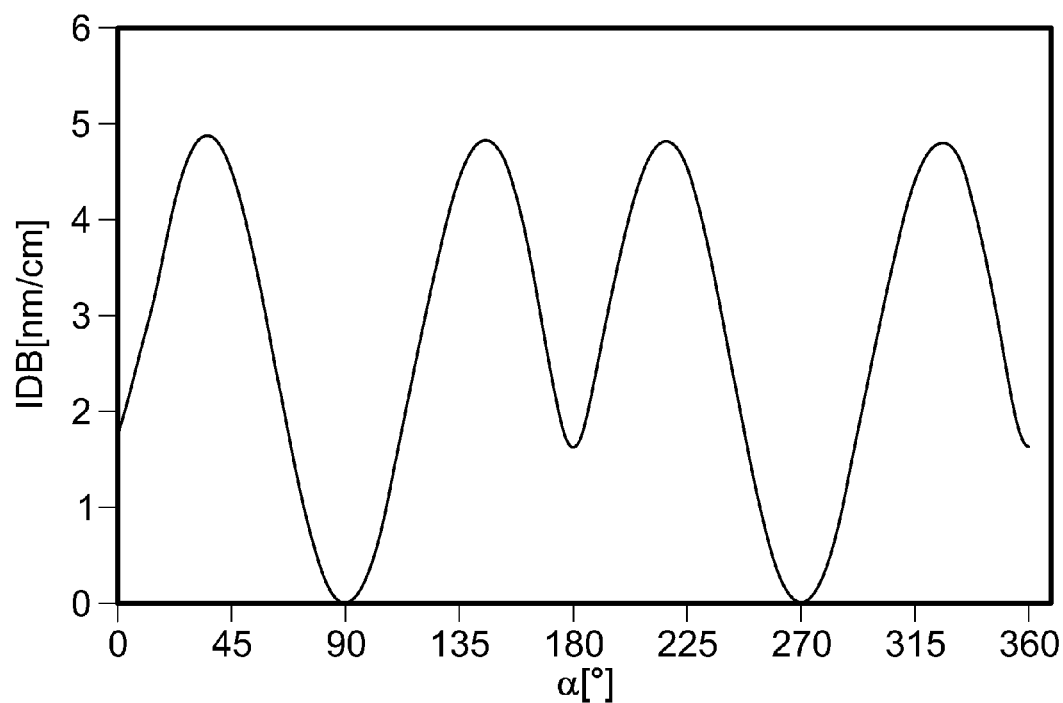

In FIG. 6B, the amount of the intrinsic birefringence is represented as a function of the azimuth angle α for the aperture angle θ=35° for a (110)-lens. The twofold azimuthal symmetry is readily apparent.

Figure 6C:
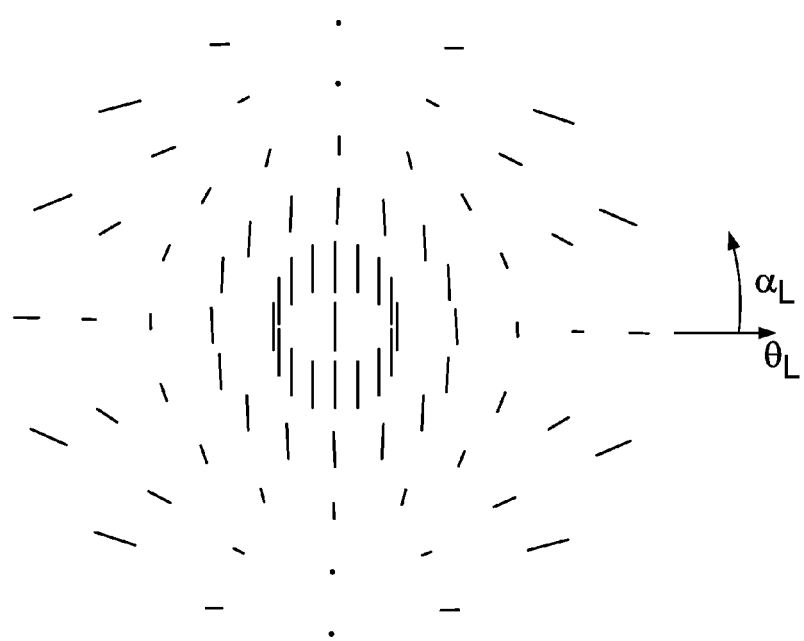

FIG. 6C shows the birefringence distribution Δn(θ, α) for individual light ray directions in the (θ, α)-angular domain for a (110)-lens in the same form as that already represented by FIG. 4C. Both the directions and the lengths of the lines are indicative of the twofold symmetry of the distribution. The line with a maximum length, and consequently the maximum birefringence, is obtained for the aperture angle θ=0°.

Figure 6D:
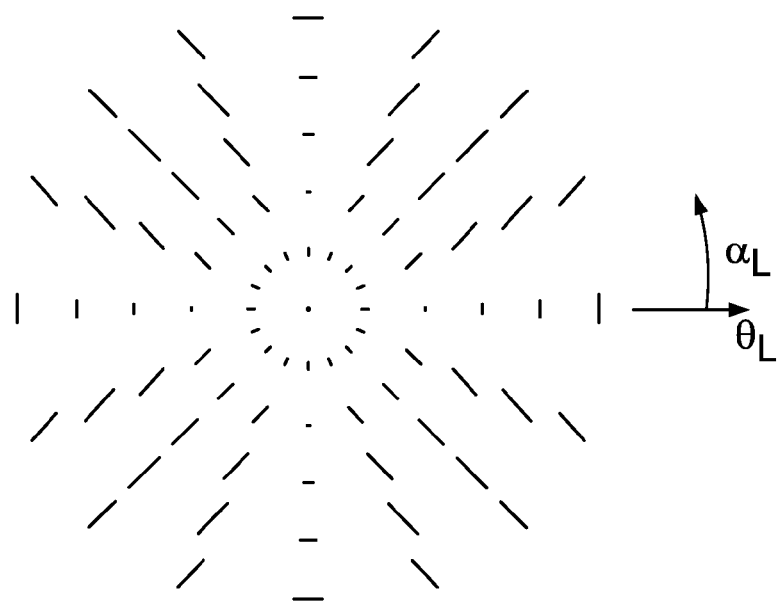

FIG. 6D then shows the birefringence distribution Δn(θ, α) that is obtained if two adjacent planar-parallel (110)-lenses of equal thickness are arranged such that they are rotated by 90°.

The resulting birefringence distribution Δn(θ, α) has a fourfold azimuthal symmetry. Maximum birefringence values occur at the azimuth angles α=45°, 135°, 225° and 315°, with a birefringence value of 2.6 nm/cm for the aperture angle θ=40°.

Figure 6E:
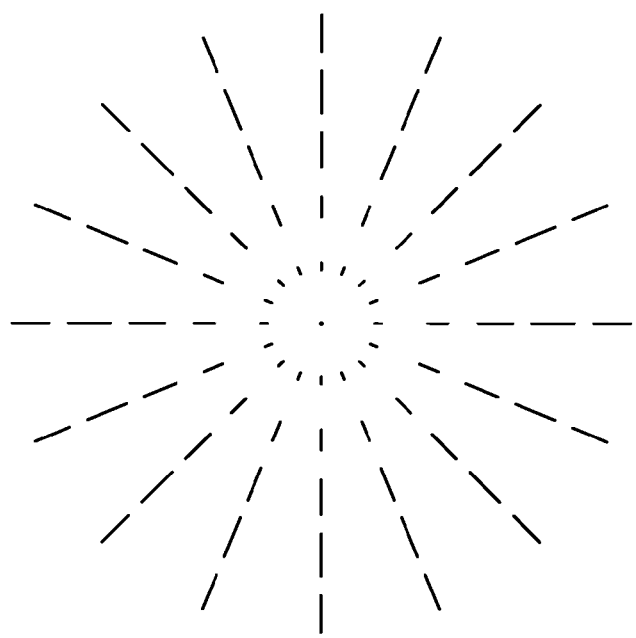

FIG. 6E then shows the birefringence distribution Δn(θ, α) that is obtained when the two planar-parallel (110)-lenses of equal thickness of FIG. 6C are combined with two further planar-parallel (110)-lenses of equal thickness. The angle of rotation between pairs of the (110)-lenses is 45°. The resultant birefringence distribution Δn(θ, α) is independent of the azimuth angle α. However, by contrast with FIG. 4C, the longer principal axes of the intersecting ellipses extend radially, that is similar to the distribution of FIG. 5C. The resultant optical path differences of two mutually orthogonal states of polarization are obtained by multiplying the birefringence values by the physical path lengths traveled by the light rays inside the (110)-lenses. Rotationally symmetrical birefringence distributions are likewise obtained by arranging 4·n planar-parallel (110)-lenses of equal thickness in such a manner that the angles of rotation β between respective pairs of the lenses conforms to the equation $$\beta = \frac{45°}{n} + m\ 90° \pm 5°,$$

where 4·n stands for the number of planar-parallel (100)-lenses and m is an integral number. An approximately rotationally symmetrical distribution of the optical path differences for two mutually orthogonal states of linear polarization is also obtained with lenses of an arbitrary shape if all rays of a bundle in the lenses have angles of similar magnitude and cover light paths of similar length inside the lenses. The lenses should therefore be assembled into groups in such a manner that the rays satisfy the condition specified above as well as possible.

Figure 6F:
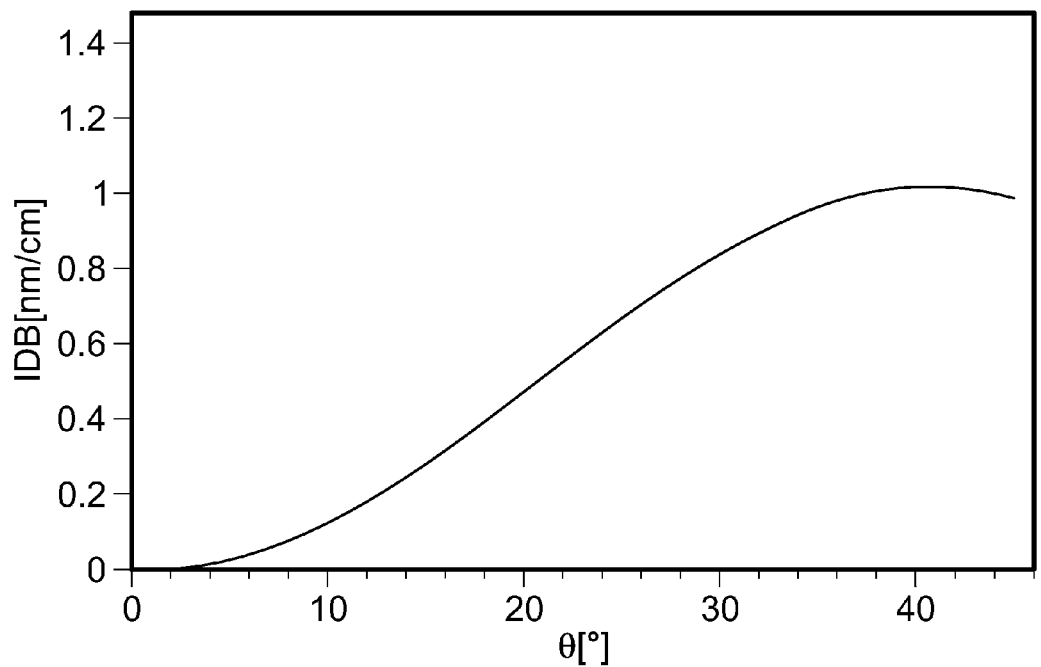

FIG. 6F shows the amount of the intrinsic birefringence as a function of the aperture angle θ for the azimuth angle α=0° for the four adjacent planar-parallel (110)-lenses of equal thickness of FIG. 6E. The value for the intrinsic birefringence at the aperture angle θ=41° is in this case 1.0 nm/cm and is consequently reduced by 84% in comparison with the maximum value of 6.5 nm/cm in FIG. 5A.

Figure 6G:
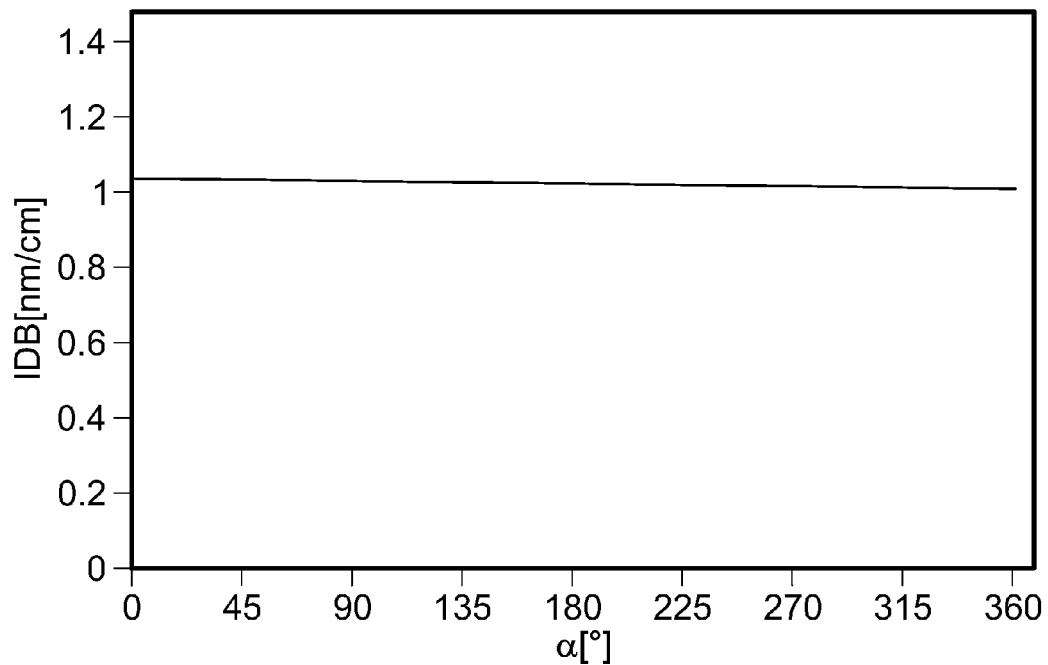

In FIG. 6G, the amount of the intrinsic birefringence is represented as a function of the azimuth angle α for the aperture angle θ=41° for the four adjacent planar-parallel (110)-lenses of equal thickness of FIG. 6E. The intrinsic birefringence is independent of the azimuth angle α.

By combining groups with (110)-lenses and groups with (100)-lenses within a projection objective, the optical path differences produced by these lenses for two mutually orthogonal states of linear polarization can be compensated to a large extent. This requires that an approximately rotationally symmetrical distribution of the optical path differences is first obtained within these groups by rotating the lenses and that the two distributions of optical path differences are then compensated by combining a group with (110)-lenses and a group with (100)-lenses. The compensation takes advantage of the fact that the orientations of the longer principal axes of the intersecting ellipses for the birefringence distribution of a group with rotated (110)-lenses is perpendicular to the orientations of the longer principal axes of the intersecting ellipses for the birefringence distribution of a group with rotated (100)-lenses, as can be seen in FIGS. 4D and 6E. It is of importance that on the one hand the individual groups generate an approximately rotationally symmetrical distribution of the optical path differences, and on the other hand that the sum of the contributions of the groups with (110)-lenses is of approximately equal absolute magnitude as the sum of the contributions of the groups with (100)-lenses.

Figure 7:
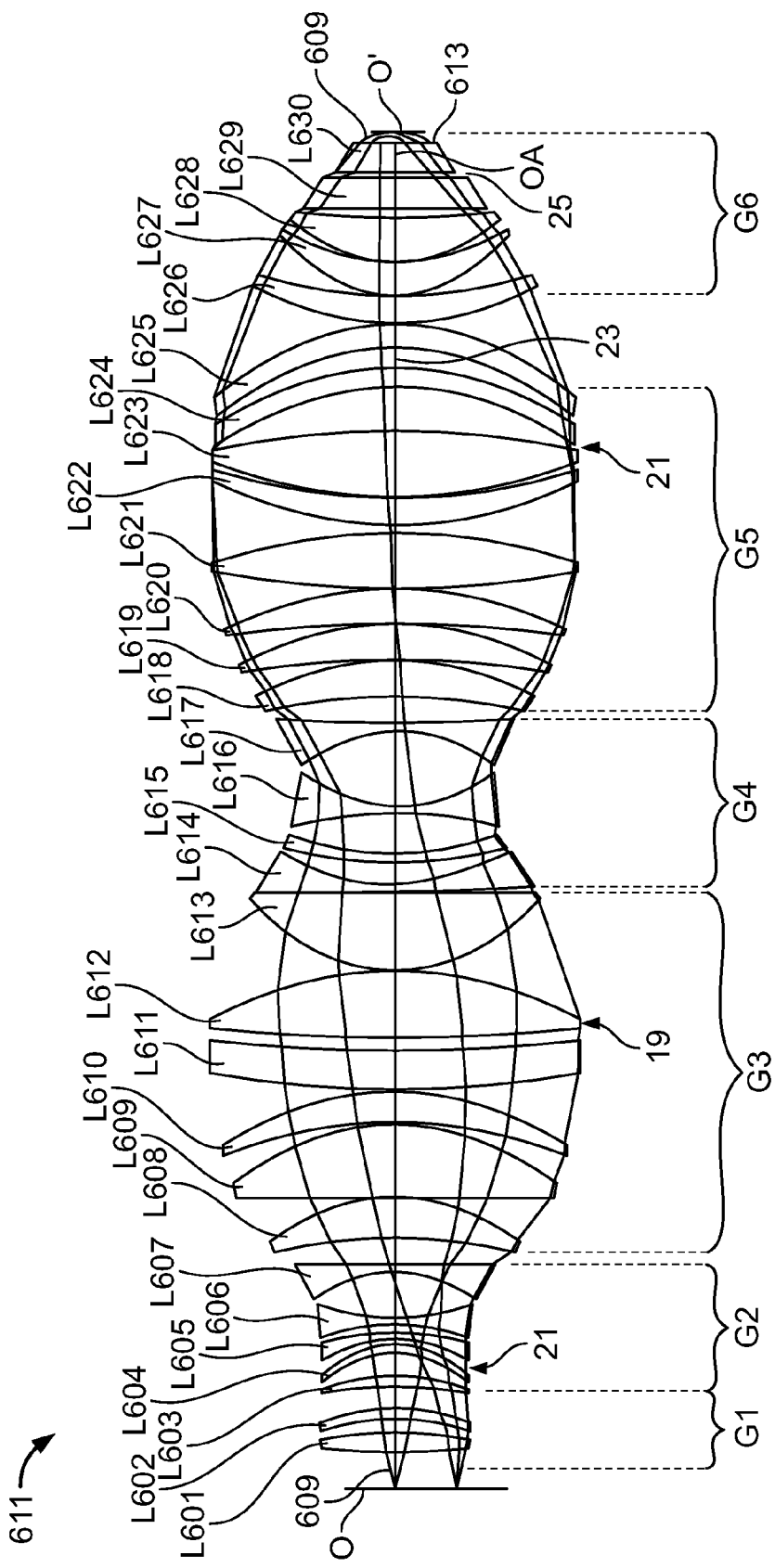
FIG. 7 shows the lens section of a refractive projection objective.

In FIG. 7, the lens section of a refractive projection objective 611 is represented for the wavelength of 157 nm. The optical data for this objective are listed in Table 1. The exemplary embodiment is taken from the applicant's patent application PCT/EP00/13148, where it corresponds to FIG. 7 and Table 6. For a more detailed functional description of the objective, the reader is referred to the patent application PCT/EP00/13148. All lenses of this objective consist of calcium fluoride crystal. The numerical aperture on the image side of the objective is 0.9. The imaging performance of this objective is corrected so well that the wavefront deviation from an ideal spherical wave is smaller 1.8 mλ on the basis of the wavelength of 157 nm. Especially in these high-performance objectives, it is necessary to reduce the detrimental influences, such as of intrinsic birefringence, as much as possible.

For the exemplary embodiment of FIG. 6, the aperture angles θ and path lengths $RL_L$ of the outermost aperture ray 609 were calculated for the individual lenses L601 to L630. The outermost aperture ray 609 originates from the object point at the coordinates x=0 mm and y=0 mm and has in the image plane an angle relative to the optical axis that corresponds to the numerical aperture on the image side. The outermost aperture ray 609 is used because its aperture angle inside the lenses is close to the maximum aperture angle.

TABLE 2

| Lens | Aperture angle θ [°] | Path length $RL_L$ [mm] | Optical path difference (111)-lens $α_L = 0°$ [nm] | Optical path difference (111)-lens $α_L = 60°$ [nm] | Optical path difference (100)-lens $α_L = 0°$ [nm] | Optical path difference (100)-lens $α_L = 45°$ [nm] | Optical path difference (110)-lens $α_L = 0°$ [nm] | Optical path difference (110)-lens $α_L = 45°$ [nm] | Optical path difference (110)-lens $α_L = 90°$ [nm] | Optical path difference (110)-lens $α_L = 135°$ [nm] |
|---|---|---|---|---|---|---|---|---|---|---|
| L601 | 8.1 | 15.1 | 2.9 | −2.2 | −0.8 | −0.4 | −9.0 | −9.0 | −9.1 | −9.0 |
| L602 | 8.7 | 8.2 | 1.7 | −1.2 | −0.5 | −0.2 | −4.9 | −4.8 | −4.9 | −4.8 |
| L603 | 7.8 | 9.5 | 1.7 | −1.3 | −0.4 | −0.2 | −5.7 | −5.7 | −5.7 | −5.7 |
| L604 | 10.7 | 7.2 | 1.9 | −1.3 | −0.6 | −0.3 | −4.1 | −4.1 | −4.1 | −4.1 |
| L605 | 9.4 | 6.5 | 1.5 | −1.0 | −0.4 | −0.2 | −3.8 | −3.8 | −3.8 | −3.8 |
| L606 | 10.3 | 8.5 | 2.1 | −1.4 | −0.7 | −0.3 | −4.8 | −4.8 | −4.8 | −4.8 |
| L607 | 21.8 | 12.7 | 6.6 | −2.7 | −3.9 | −1.8 | −4.2 | −4.2 | −4.3 | −4.2 |

TABLE 2-continued

| Lens | Aperture angle $\theta$ [°] | Path length $RL_L$ [mm] | Optical path difference (111)-lens $\alpha_L = 0°$ [nm] | Optical path difference (111)-lens $\alpha_L = 60°$ [nm] | Optical path difference (100)-lens $\alpha_L = 0°$ [nm] | Optical path difference (100)-lens $\alpha_L = 45°$ [nm] | Optical path difference (110)-lens $\alpha_L = 0°$ [nm] | Optical path difference (110)-lens $\alpha_L = 45°$ [nm] | Optical path difference (110)-lens $\alpha_L = 90°$ [nm] | Optical path difference (110)-lens $\alpha_L = 135°$ [nm] |
|---|---|---|---|---|---|---|---|---|---|---|
| L608 | 25.4 | 22.2 | 12.8 | −4.4 | −8.7 | −3.9 | −5.3 | −5.7 | −5.8 | −5.7 |
| L609 | 16.3 | 36.1 | 14.3 | −7.6 | −6.8 | −3.3 | −16.5 | −16.5 | −16.7 | −16.5 |
| L610 | 12.2 | 15.2 | 4.5 | −2.9 | −1.7 | −0.8 | −8.2 | −8.2 | −8.2 | −8.2 |
| L611 | 2.3 | 26.6 | 1.4 | −1.3 | −0.1 | −0.1 | −17.2 | −17.2 | −17.2 | −17.2 |
| L612 | 2.3 | 32.2 | 1.6 | −1.5 | −0.1 | −0.1 | −20.8 | −20.8 | −20.8 | −20.8 |
| L613 | −18.3 | 30.4 | −6.6 | 13.5 | −7.0 | −3.3 | −12.5 | −12.6 | −12.7 | −12.6 |
| L614 | −18.7 | 22.0 | −4.8 | 10.0 | −5.3 | −2.5 | −8.9 | −8.9 | −9.0 | −8.9 |
| L615 | −14.0 | 10.2 | −2.0 | 3.5 | −1.5 | −0.7 | −5.1 | −5.1 | −5.2 | −5.1 |
| L616 | −1.3 | 29.8 | −0.8 | 0.9 | 0.0 | 0.0 | −19.3 | −19.3 | −19.3 | −19.3 |
| L617 | 26.4 | 31.6 | 18.6 | −6.1 | −13.0 | −5.7 | −6.7 | −7.6 | −7.5 | −7.6 |
| L618 | 33.5 | 14.3 | 9.3 | −2.0 | −7.9 | −3.1 | −0.6 | 3.2 | −1.4 | 3.2 |
| L619 | 26.5 | 7.5 | 4.4 | −1.4 | −3.1 | −1.4 | −1.6 | −1.8 | −1.8 | −1.8 |
| L620 | 19.3 | 6.4 | 3.0 | −1.4 | −1.6 | −0.8 | −2.5 | −2.5 | −2.5 | −2.5 |
| L621 | 6.7 | 8.0 | 1.3 | −1.0 | −0.3 | −0.1 | −4.9 | −4.9 | −4.9 | −4.9 |
| L622 | −10.3 | 7.7 | −1.3 | 1.9 | −0.6 | −0.3 | −4.4 | −4.4 | −4.4 | −4.4 |
| L623 | −11.9 | 9.6 | −1.8 | 2.8 | −1.0 | −0.5 | −5.2 | −5.2 | −5.2 | −5.2 |
| L624 | 0.3 | 17.8 | 0.1 | −0.1 | 0.0 | 0.0 | −11.6 | −11.6 | −11.6 | −11.6 |
| L625 | 6.0 | 16.3 | 2.3 | −1.8 | −0.5 | −0.2 | −9.9 | −9.9 | −10.0 | −9.9 |
| L626 | −24.0 | 9.0 | −1.9 | 5.0 | −3.2 | −1.5 | −2.5 | −2.6 | −2.6 | −2.6 |
| L627 | −35.6 | 8.0 | −0.9 | 5.2 | −4.7 | −1.7 | 0.1 | 2.1 | −0.5 | 2.1 |
| L628 | −39.4 | 12.0 | −1.0 | 7.6 | −7.5 | −2.5 | 1.0 | 4.0 | −0.3 | 4.0 |
| L629 | −35.3 | 27.3 | −3.3 | 17.7 | −15.7 | −5.9 | 0.5 | 6.9 | −1.9 | 6.9 |
| L630 | −35.3 | 26.0 | −3.1 | 16.9 | −15.0 | −5.6 | 0.4 | 6.5 | −1.9 | 6.5 |
| Sum | | | 64.5 | 42.3 | 112.9 | 47.4 | −198.2 | −178.7 | −208.0 | −178.8 |

Table 2 lists not only the aperture angles θ and optical path lengths $RL_L$ for the outermost aperture ray but also the optical path differences for two mutually orthogonal states of linear polarization for different lens orientations. The optical path differences are listed for (111)-lenses, (100)-lenses and (110)-lenses, the azimuth angle $\alpha_L$ of the outermost edge ray within the lenses being 0° and 60° for a (111)-lens, 0° and 45° for a (100)-lens and 0°, 45°, 90° and 135° for a (110)-lens.

According to Table 2, the aperture angles θ for the lenses L608, L617, L618, L619, L627, L628, L629 and L630 are larger than 25°, exceeding even 30° for the lenses L618, L627, L628, L629 and L630. Large aperture angles occur in particular in the lenses L627 to L630 which are closest to the image plane.

The design of the projection objective produced the result that the maximum aperture angle of all the light rays is less than 45°. The maximum aperture angle for the outermost aperture ray is 39.4° in the lens L628. It also proved helpful to use two thick planar lenses L629 and L630 immediately before the image plane.

The diameter of the diaphragm between the lenses L621 and L622 is 270 mm. The diameter of the lens L618 is 207 mm, and the diameters of the lenses L627 to L630 are all smaller than 190 mm. Consequently, the diameters of these lenses, which have large aperture angles, are smaller than 80% of the diaphragm diameter.

As can be concluded from Table 2, it is beneficial for individual lenses with large aperture angles to orient them in the (100)-direction, because the birefringence values are lower overall. This is due to the fact that the angles at which the influence of the <110> crystallographic directions begins to be noticeable are larger in (100)-lenses than in (111)-lenses. For example in the lenses L608, L609 and L617, the optical path differences are more than 30% lower.

The two planar-parallel lenses L629 and L630 are a good example to show how the birefringence can be significantly reduced by rotating the lenses with respect to one another. Both lenses have equal aperture angles for the outermost aperture ray of 35.3°, and similar path lengths of 27.3 mm and 26.0 mm, respectively. If the two lenses were installed with equal orientation as (100)-lenses, they would produce an optical path difference of 30.7 nm. By contrast, if the two (100)-lenses are rotated with respect to one another by 45°, the optical path difference is reduced to 20.9 nm, representing a reduction of 32%. If the two lenses were installed with equal orientation as (111)-lenses, they would produce an optical path difference of 34.6 nm. However, if the two (111)-lenses are rotated with respect to one another by 60°, the optical path difference is reduced to 13.6 nm, that is by 61%.

Almost complete compensation of the optical path differences due to the intrinsic birefringence caused by the lenses L629 and L630 for two mutually orthogonal states of linear polarization can be achieved by splitting the lens L629 into the lenses L6291 and L6292, and splitting the lens L630 into the lenses L6301 and L6302, wherein the lens L6291 is a (100)-lens with a thickness of 9.15 mm, the lens L6292 is a (111)-lens with a thickness of 13.11 mm, the lens L6301 is a (100)-lens with a thickness of 8.33 mm, and the lens L6302 is a (111)-lens with a thickness of 12.9 mm. The lenses L6291 and L6301 are rotated with respect to one another by 45°; the lenses L6292 and L6302 are rotated by 60°. The resultant maximum optical path difference is in this case then 0.2 nm. The lenses L6291 and L6292 as well as the lenses L6301 and L6302 can be joined in an optically seamless manner, for example by means of wringing. This principle can also be applied if the projection objective contains only one crystal lens. The one crystal lens in this case is split into at least two lenses that are arranged such that they are rotated in relation to one another. The lenses can be joined together by wringing. Another possibility is first to produce an optically seamless combination of individual plates that have the desired crystal orientation and then form the lens from the joined-together plates in a further process step.

Another possibility for reducing the detrimental influence of the intrinsic birefringence of the lenses L629 and L630 is to split the lens L629 into the lenses L6293 and L6294 and to split the lens L630 into the lenses L6303 and L6304, wherein the lens L6293 is then a (110)-lens with a thickness of 11.13 mm, the lens L6294 is a (110)-lens with a thickness of 11.13 mm, the lens L6303 is a (110)-lens with a thickness of 10.62 mm, and the lens L6304 is a (110)-lens with a thickness of 10.62 mm. The lenses L6293 and L6294, as well as the lenses L6303 and L6304 are in each case rotated with respect to one another by 90°, and the angle of rotation between the lenses L6293 and L6303 is 45°. The resultant maximum optical path difference is in this case 4.2 nm. The lenses L6293 and L6294 as well as the lenses L6303 and L6304 can be joined as lens parts in an optically seamless manner, for example by means of wringing.

Almost complete compensation of the optical path differences for two mutually orthogonal states of linear polarization caused by the highly loaded lenses L629 and L630 can be achieved by splitting each lens into three lens parts L6295, L6296 and L6297, and L6305, L6306 and L6307, respectively, wherein the lens L6295 is then a (100)-lens with a thickness of 4.45 mm, the lenses L6296 and L6297 are (110)-lenses with a thickness of 8.90 mm, the lens L6305 is a (100)-lens with a thickness of 4.25 mm, and the lenses L6306 and L6307 are (110)-lenses with a thickness of 8.49 mm. The lenses L6294 and L6304 are rotated with respect to one another by 45°; pairs of the lenses L6295, L6297, L6306 and L6307 are rotated with respect to one another by 45°. In this combination, the resultant maximum optical path difference is reduced to below 0.1 nm. The lenses L6295 to L6297 as well as the lenses L6305 to L6307 can be joined as lens parts in an optically seamless manner, for example by means of wringing.

Another possibility for reducing the detrimental influence of the intrinsic birefringence by the lenses L629 and L630 is to combine two (110)-lenses with a (100)-lens. The two (110)-lenses are to be installed such that they are rotated by 90° with respect to one another, while the angle of rotation between the (100)-lens and the (110)-lenses is 45°+m·90°, where m is an integral number. For this purpose, the lens L629 is split into the lenses L6298 and L6299 and the lens L630 is split into the lenses L6308 and L6309, wherein the lens L6298 is then a (110)-lens with a thickness of 17.40 mm, the lens L6299 is a (110)-lens with a thickness of 4.87 mm, the lens L6308 is a (110)-lens with a thickness of 12.53 mm, and the lens L6309 is a (100)-lens with a thickness of 8.70 mm. The resultant maximum optical path difference is 3.1 nm. The lenses L6298 and L6299 as well as the lenses L6308 and L6309 can be joined as lens parts in an optically seamless manner, for example by means of wringing.

Figure 8:
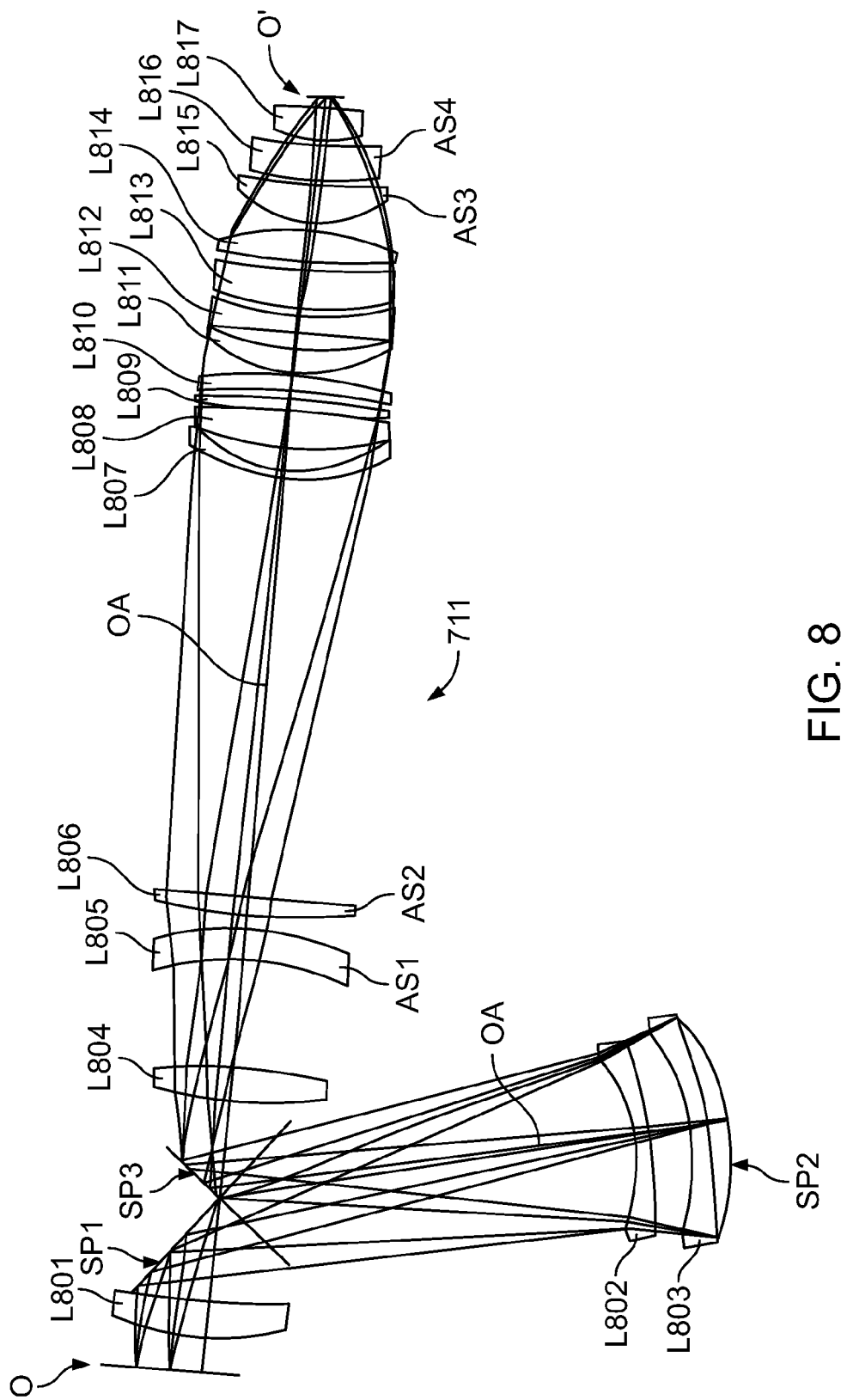
FIG. 8 shows the lens section of a catadioptric projection objective.

In FIG. 8, the lens section of a catadioptric projection objective 711 is represented for the wavelength of 157 nm. The optical data for this objective are listed in Table 3. The exemplary embodiment is taken from the applicant's patent application PCT/EP00/13148, where it corresponds to FIG. 9 and Table 8. For a more detailed functional description of the objective, the reader is referred to the patent application PCT/EP00/13148. All lenses of this objective consist of calcium fluoride crystal. The numerical aperture on the image side of the objective is 0.8.

For the exemplary embodiment of FIG. 8, the aperture angles θ and path lengths $RL_L$ of the upper outermost aperture ray 713 and of the lower outermost aperture ray 715 were calculated for the individual lenses L801 to L817. The outermost aperture rays 713 and 715 originate from the object point at the coordinates x=0 mm and y=−82.15 mm and have in the image plane angles relative to the optical axis that correspond to the numerical aperture on the image side. The upper and lower outermost aperture rays were calculated because the object field is located outside the optical axis and therefore, like the outermost aperture ray of the exemplary embodiment of FIG. 7, the aperture rays are not symmetrical to the optical axis.

Table 4 lists the data for the upper outermost aperture ray, and Table 5 lists the data for the lower outermost aperture ray. Table 4 and Table 5 list not only the aperture angles θ and optical path lengths $RL_L$ for the outermost aperture ray but also the optical path differences for two mutually orthogonal states of linear polarization for different lens orientations; to be precise for (111)-lenses, (100)-lenses and (110)-lenses, the azimuth angle $α_L$ of the outermost edge ray within the lenses being 0° and 60° for a (111)-lens, 0° and 45° for a (100)-lens and 0°, 45°, 90° and 135° for a (110)-lens.

TABLE 4

| Lens | Aperture angle θ [°] | Path length $RL_L$ [mm] | Optical path difference (111)-lens $α_L$ = 0° [nm] | Optical path difference (111)-lens $α_L$ = 60° [nm] | Optical path difference (100)-lens $α_L$ = 0° [nm] | Optical path difference (100)-lens $α_L$ = 45° [nm] | Optical path difference (110)-lens $α_L$ = 0° [nm] | Optical path difference (110)-lens $α_L$ = 45° [nm] | Optical path difference (110)-lens $α_L$ = 90° [nm] | Optical path difference (110)-lens $α_L$ = 135° [nm] |
|---|---|---|---|---|---|---|---|---|---|---|
| L801 | 1.4 | 28.1 | 0.8 | −0.8 | 0.0 | 0.0 | −18.2 | −18.2 | −18.2 | −18.2 |
| L802 | −10.8 | 30.7 | −5.3 | 8.0 | −2.7 | −1.3 | −17.2 | −17.2 | −17.3 | −17.2 |
| L803 | −15.6 | 32.4 | −6.8 | 12.4 | −5.7 | −2.7 | −15.3 | −15.3 | −15.4 | −15.3 |
| L803 | −24.4 | 31.8 | −6.5 | 17.8 | −11.7 | −5.2 | −8.4 | −8.8 | −9.0 | −8.8 |
| L802 | −19.5 | 26.6 | −5.8 | 12.4 | −6.8 | −3.2 | −10.2 | −10.3 | −10.4 | −10.3 |
| L804 | 6.4 | 20.1 | 3.0 | −2.4 | −0.6 | −0.3 | −12.4 | −12.4 | −12.4 | −12.4 |
| L805 | 10.8 | 34.4 | 9.0 | −6.0 | −3.0 | −1.5 | −19.3 | −19.3 | −19.3 | −19.3 |
| L806 | 0.2 | 10.0 | 0.1 | −0.1 | 0.0 | 0.0 | −6.5 | −6.5 | −6.5 | −6.5 |
| L807 | −11.1 | 22.0 | −3.9 | 5.9 | −2.1 | −1.0 | −12.2 | −12.2 | −12.3 | −12.2 |
| L808 | 0.1 | 18.5 | 0.0 | 0.0 | 0.0 | 0.0 | −12.0 | −12.0 | −12.0 | −12.0 |
| L809 | −0.8 | 9.0 | −0.1 | 0.2 | 0.0 | 0.0 | −5.8 | −5.8 | −5.8 | −5.8 |
| L810 | 1.1 | 12.4 | 0.3 | −0.3 | 0.0 | 0.0 | −8.0 | −8.0 | −8.0 | −8.0 |

TABLE 4-continued

| Lens | Aperture angle θ [°] | Path length $RL_L$ [mm] | Optical path difference (111)-lens $α_L = 0°$ [nm] | Optical path difference (111)-lens $α_L = 60°$ [nm] | Optical path difference (100)-lens $α_L = 0°$ [nm] | Optical path difference (100)-lens $α_L = 45°$ [nm] | Optical path difference (110)-lens $α_L = 0°$ [nm] | Optical path difference (110)-lens $α_L = 45°$ [nm] | Optical path difference (110)-lens $α_L = 90°$ [nm] | Optical path difference (110)-lens $α_L = 135°$ [nm] |
|---|---|---|---|---|---|---|---|---|---|---|
| L811 | −16.8 | 9.4 | −2.0 | 3.8 | −1.9 | −0.9 | −4.2 | −4.2 | −4.2 | −4.2 |
| L812 | −10.4 | 29.8 | −5.0 | 7.5 | −2.4 | −1.2 | −16.9 | −16.9 | −16.9 | −16.9 |
| L813 | −8.8 | 34.7 | −5.2 | 7.3 | −2.1 | −1.0 | −20.5 | −20.5 | −20.5 | −20.5 |
| L814 | −9.4 | 17.5 | −2.8 | 4.0 | −1.2 | −0.6 | −10.2 | −10.2 | −10.2 | −10.2 |
| L815 | −27.4 | 28.1 | −5.3 | 16.9 | −12.2 | −5.3 | −5.2 | −6.4 | −6.1 | −6.4 |
| L816 | −28.7 | 40.2 | −7.1 | 24.8 | −18.6 | −7.9 | −6.2 | −8.5 | −7.6 | −8.5 |
| L817 | −30.8 | 39.0 | −6.3 | 24.7 | −19.6 | −8.1 | −3.9 | −8.0 | −5.7 | −8.0 |
| Sum | | | −48.9 | 136.1 | −90.9 | −40.3 | −212.9 | −220.9 | −218.0 | −220.9 |

TABLE 5

| Lens | Aperture angle θ [°] | Path length $RL_L$ [mm] | Optical path difference (111)-lens $α_L = 0°$ [nm] | Optical path difference (111)-lens $α_L = 60°$ [nm] | Optical path difference (100)-lens $α_L = 0°$ [nm] | Optical path difference (100)-lens $α_L = 45°$ [nm] | Optical path difference (110)-lens $α_L = 0°$ [nm] | Optical path difference (110)-lens $α_L = 45°$ [nm] | Optical path difference (110)-lens $α_L = 90°$ [nm] | Optical path difference (110)-lens $α_L = 135°$ [nm] |
|---|---|---|---|---|---|---|---|---|---|---|
| L801 | −11.6 | 32.1 | −5.8 | 9.0 | −3.2 | −1.6 | −17.6 | −17.6 | −17.6 | −17.6 |
| L802 | 19.5 | 28.3 | 13.3 | −6.1 | −7.3 | −3.4 | −10.9 | −10.9 | −11.1 | −10.9 |
| L803 | 24.7 | 33.8 | 19.1 | −6.9 | −12.7 | −5.7 | −8.6 | −9.2 | −9.3 | −9.2 |
| L803 | 17.7 | 34.3 | 14.7 | −7.4 | −7.5 | −3.6 | −14.6 | −14.6 | −14.8 | −14.6 |
| L802 | 12.7 | 31.6 | 9.7 | −6.0 | −3.8 | −1.8 | −16.7 | −16.7 | −16.8 | −16.7 |
| L804 | −5.2 | 27.7 | −2.7 | 3.3 | −0.6 | −0.3 | −17.4 | −17.4 | −17.4 | −17.4 |
| L805 | −4.5 | 34.6 | −3.0 | 3.5 | −0.5 | −0.3 | −21.9 | −21.9 | −21.9 | −21.9 |
| L806 | −8.6 | 19.5 | −2.9 | 4.0 | −1.1 | −0.6 | −11.6 | −11.6 | −11.6 | −11.6 |
| L807 | −0.5 | 16.5 | −0.2 | 0.2 | 0.0 | 0.0 | −10.7 | −10.7 | −10.7 | −10.7 |
| L808 | −8.2 | 25.6 | −3.7 | 5.0 | −1.3 | −0.7 | −15.3 | −15.3 | −15.3 | −15.3 |
| L809 | −7.5 | 10.1 | −1.3 | 1.8 | −0.4 | −0.2 | −6.1 | −6.1 | −6.1 | −6.1 |
| L810 | −9.1 | 13.1 | −2.0 | 2.9 | −0.8 | −0.4 | −7.7 | −7.7 | −7.7 | −7.7 |
| L811 | 9.0 | 9.9 | 2.1 | −1.5 | −0.6 | −0.3 | −5.8 | −5.8 | −5.8 | −5.8 |
| L812 | 2.6 | 30.7 | 1.8 | −1.6 | −0.2 | −0.1 | −19.8 | −19.8 | −19.8 | −19.8 |
| L813 | 0.9 | 34.0 | 0.6 | −0.6 | 0.0 | 0.0 | −22.1 | −22.1 | −22.1 | −22.1 |
| L814 | 1.3 | 10.4 | 0.3 | −0.3 | 0.0 | 0.0 | −6.7 | −6.7 | −6.7 | −6.7 |
| L815 | 23.5 | 16.3 | 8.9 | −3.4 | −5.7 | −2.6 | −4.7 | −4.8 | −4.9 | −4.8 |
| L816 | 24.6 | 37.2 | 21.0 | −7.6 | −13.9 | −6.2 | −9.6 | −10.2 | −10.3 | −10.2 |
| L817 | 29.4 | 29.6 | 18.5 | −5.1 | −14.1 | −5.9 | −4.0 | −6.2 | −5.2 | −6.2 |
| Sum | | | 88.3 | −16.8 | −73.7 | −33.5 | −231.9 | −235.4 | −235.2 | −235.4 |

In accordance with Table 4 and Table 5, the aperture angles θ for the lenses L815 to L817 are larger than 25°. In this exemplary embodiment, again, the lenses L815 to L817 which are closest to the image plane have large aperture angles.

Based on the design of the lenses L815 to L817, the maximum aperture angle does not exceed $$\arcsin\left(\frac{NA}{n_{FK}}\right) = \arcsin\left(\frac{0.8}{1.5597}\right) = 30.9°.$$

The maximum aperture angle for the outermost aperture ray is 30.8°, for the lens L817.

The diameter of the diaphragm between the lenses L811 and L812 is 193 mm. The diameter of the lenses L815 to L817 are all smaller than 162 mm. Consequently, the diameters of these lenses, which have large aperture angles, are smaller than 85% of the diaphragm diameter.

As can be concluded from Table 4 and Table 5, it is beneficial for lenses with large aperture angles to orient them in the (100)-direction, because the birefringence values are lower overall. For example, in the lenses L815 to L817, the optical path differences are more than 20% lower.

Based on the exemplary embodiment of FIG. 8, the following discussion is intended to demonstrate how the intrinsic birefringence can to a large extent be compensated by using groups of mutually rotated (100)-lenses in parallel with groups of mutually rotated (111)-lenses.

Firstly, all the calcium fluoride lenses of (111)-orientation are installed without rotating the (111)-lenses with respect to one another. In this case, a maximum optical path difference of 136 nm is obtained for two mutually orthogonal states of linear polarization. By rotating the (111)-lenses, the maximum optical path difference can be reduced to approximately 38 nm. For this purpose, the lenses L801 and L804 are assigned to a group, and the lenses L802 and L803 are assigned to a further group, where the angle of rotation between the lenses in each case is 60°. The lenses L808, L809 and L810 are combined into a group of three, as are the lenses L815, L816 and L817, where the angle of rotation between pairs of these lenses is 40°. The lenses L811, L812, L813 and L814 are combined into a group of four with an angle of mutual rotation of 30°.

If all the calcium fluoride lenses of (100)-orientation are installed without rotating the (100)-lenses with respect to one another, a maximum optical path difference of 90.6 nm is obtained for two mutually orthogonal states of linear polarization. By rotating the (100)-lenses, the maximum optical path difference can be reduced to approximately 40 nm. For this purpose, the lenses L801 and L804 are assigned to a group, and the lenses L802 and L803 are assigned to a further group, where the angle of rotation between the lenses in each case is 45°. The lenses L808, L809 and L810 are combined into a group of three, as are the lenses L815, L816 and L817, where the angle of rotation between pairs of these is 30°. The lenses L811, L812, L813 and L814 are combined into a group of four with an angle of mutual rotation of 22.5°.

A maximum optical path difference of 7 nm is obtained for two mutually orthogonal states of linear polarization if groups of (100)-lenses are combined with groups of (111)-lenses. For this purpose, the lenses L801 and L804 are combined to form a group of (111)-lenses with an angle of rotation of 60° between the lenses. The lenses L802 and L803 are combined to form a group of (100)-lenses with an angle of rotation of 45° between the lenses. The lenses L808, L809 and L810 are combined into a group of three (100)-lenses with an angle of rotation of 30° between respective pairs of these lenses. The lenses L815, L816, L817 are combined to form a group of three (111)-lenses with an angle of rotation of 40° between pairs of these lenses. The lenses L811, L812, L813 and L814 are combined to form a group of four (100)-lenses with an angle of rotation of 22.5°. The lens axes of the lenses L805 and L807 which are not combined to form a group are oriented in the <111> crystallographic direction, while the lens axis of the lens L806 is oriented in the <100> crystallographic direction. The groups can be rotated with respect to one another by an arbitrary angle about the optical axis. These degrees of freedom can be used for the compensation of aberrations from rotational symmetry which can be produced for example by the mounting of the lenses.

The refractive objective 611 is to be used in the following discussion to show how the detrimental influence of birefringence effects can be significantly reduced by covering an optical element with a compensation coating 613. Only the contributions of the two lenses L629 and L630 to the birefringence will be considered here, as these two lenses consist of calcium fluoride and are therefore intrinsically birefringent. In this exemplary embodiment, the two lenses have a (111)-orientation and are rotated by 60° with respect to one another. This leads to an almost rotationally symmetrical distribution of the optical path differences ΔOPL. The maximum optical path difference ΔOPL for an outermost aperture ray is between 13.6 nm and 14.6 nm, depending on the azimuth angle $\alpha_R$. The compensation coating 613 described in Table 6 is then applied to the optical surface of the lens L630 that faces toward the image plane O'. The compensation coating 613 consists of 15 individual layers of the materials magnesium fluoride ($MgF_2$) and lanthanum fluoride ($LaF_3$). n and k in Table 6 represent the real part and the imaginary part of the refractive index. The layer thicknesses are homogenous and have no lateral thickness variation. The vapor-depositing angles during the coating process are perpendicular to the optical surface of the lens L630.

With the compensation coating, the resultant optical path difference is 1.1 nm and is consequently significantly reduced in comparison with the objective without a compensation coating.

TABLE 6

| Layer | Thickness [nm] | Material |
|---|---|---|
|  | Substrate | CaF2 |
| 1 | 103.54 | MgF2 |
| 2 | 41.54 | LaF3 |
| 3 | 33.35 | MgF2 |
| 4 | 30.8 | LaF3 |
| 5 | 39.53 | MgF2 |
| 6 | 35.34 | LaF3 |
| 7 | 32.05 | MgF2 |
| 8 | 27.25 | LaF3 |
| 9 | 28.57 | MgF2 |
| 10 | 26.48 | LaF3 |
| 11 | 27.64 | MgF2 |
| 12 | 26.17 | LaF3 |
| 13 | 27.36 | MgF2 |
| 14 | 26.11 | LaF3 |
| 15 | 8.66 | MgF2 |
| Optical constants | n | k |
| LaF3 | 1.760026 | 0.00118471 |
| MgF2 | 1.506675 | 0.00305275 |

An analogous procedure is also possible if, instead of the two last lenses, the entire objective is considered. Instead of compensating for the birefringence with only one optical element with a compensation coating, it is also possible to cover a plurality of optical elements with compensation coatings.

The procedure can also be used to compensate for birefringence in an entire system, where the causes of this birefringence may be stress-induced birefringence, intrinsic birefringence and birefringence due to the other layers.

Following the final adjustment of a system, the distribution of the optical path differences ΔOPL for one or more bundle of rays in the image plane is determined. The required compensation coating is then calculated by means of a program for coating optimization, and the coating is applied, for example to the system surface closest to the image plane. It is beneficial if the optical element closest to the image plane is interchangeable. This provides the possibility of also correcting birefringence effects that occur only with the actual use of the objective.

In order to compensate for birefringence of crystals in the ultraviolet range, it is possible to arrange crystal elements with different orientations of the crystallographic axes one after the other, as described above. However, if lenses with different crystallographic orientations are arranged one after the other in an optical system, the problem occurs that lenses are often passed through at different angles, so that only a limited degree of compensation may be possible. In the case of optical systems that contain only one crystal lens, this type of compensation is not possible at all.

One possible solution is to design a lens in such a way that it is split into two mutually rotated parts that are joined by wringing. In practice, this concept has the drawback that stresses deform the joining surface and that the two halves have to be laterally positioned at a micrometer level of accuracy.

It is proposed to manufacture blanks from individual plates that are wrung together and rotated relative to the orientation of the crystallographic axes, and then make the blanks into lenses by grinding and polishing. Everything said above about orientations also applies to lenses made in this manner.

In addition to wringing, which is a traditional manufacturing process in the field of optics, any other joining technique that provides intimate contact and introduces a minimal amount of stress can be used and is considered to be encompassed by the invention. The wringing can be facilitated in particular by coatings, for example of quartz glass. It is important to have no refraction or reflection at the joining surface as this would interfere with the intended function.

The orientations are selected on the basis of the criteria described above.

Given as exemplary embodiments are blanks which can be used for example to make the lens L816 for the projection objective of FIG. 8. The lens L816 has a convex aspherical front surface with a vertex curvature radius of 342.13 mm and a concave spherical rear surface with a vertex curvature radius of 449.26 mm. The axial thickness is 37.3 mm. The lens material is calcium fluoride. The lens diameter is 141 mm. The blank from which the lens is to be manufactured requires an overall thickness of at least 45 mm and a diameter of 150 mm. The blank may in this case comprise two (100)-plates of 9.0 mm thickness that are rotated by 45° with respect to one another and two (111)-plates of 13.5 mm thickness that are rotated by 60° with respect to one another, which are joined in an optically seamless manner. The (100)-plates and the (111)-plates should be respectively arranged adjacently.

In a further embodiment, six (100)-plates of 3.0 mm thickness that are rotated with respect to one another by 45° and six (111)-plates of 4.5 thickness that are rotated with respect to one another by 60° are joined in an optically seamless manner, alternating between pairs of (100)-plates and pairs of (111)-plates.

In a further embodiment, four (110)-plates of 9.0 mm thickness that are rotated with respect to one another by 45° and two (100)-plates of 4.5 thickness that are rotated with respect to one another by 45° are joined in an optically seamless manner, with the two (100)-plates following the four (110)-plates.

In a further embodiment, eight (110)-plates of 4.5 mm thickness that are rotated with respect to one another by 45° and four (100)-plates of 2.25 thickness that are rotated with respect to one another by 45° are joined in an optically seamless manner, in a sequence of four (110)-plates and two (100)-plates followed by another four (110)-plates and two (100)-plates.

Figure 9:
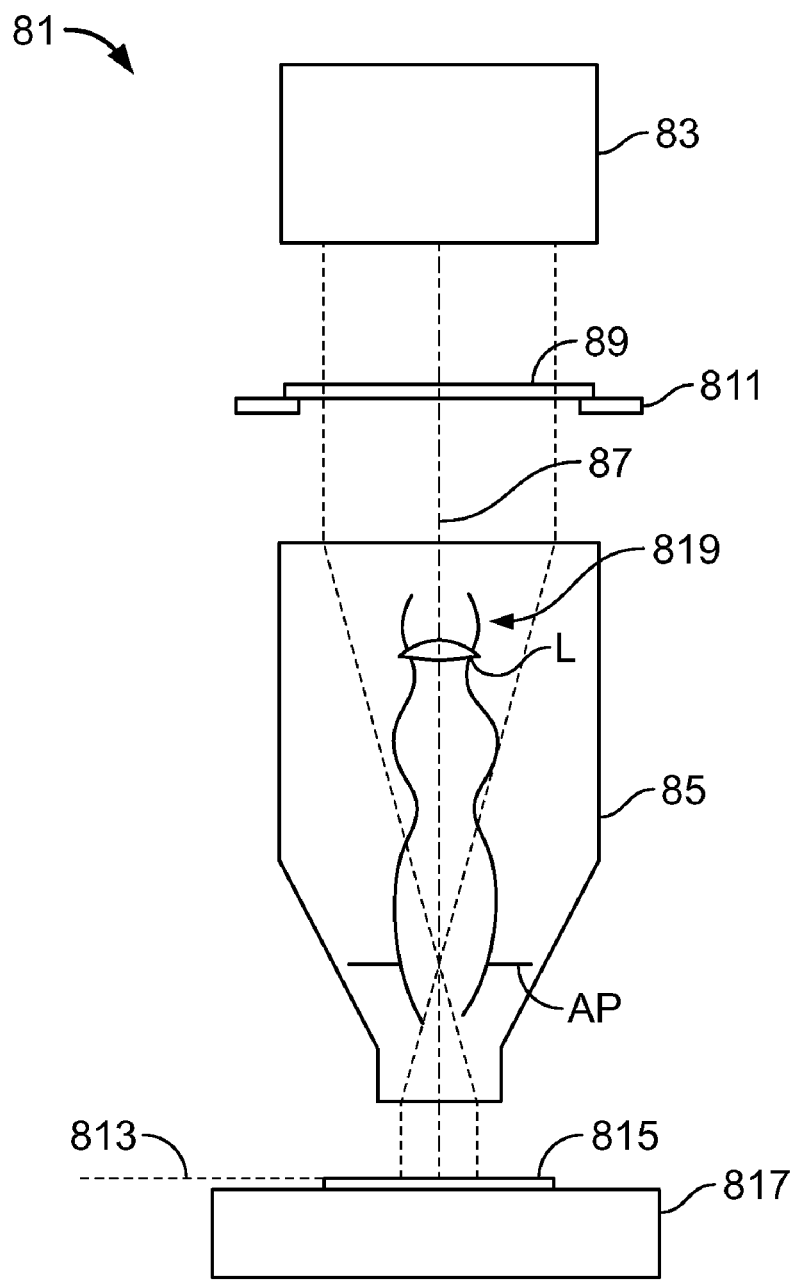
FIG. 9 shows a microlithography projection-exposure installation in a schematic representation.

The construction of a microlithography projection-exposure installation is described in principle on the basis of FIG. 9. The projection-exposure installation 81 has an illuminating device 83 and a projection objective 85. The projection objective 85 comprises a lens arrangement 819 with an aperture diaphragm AP, an optical axis 87 being defined by the lens arrangement 89. Exemplary embodiments of the lens arrangement 89 are given in FIG. 6 and FIG. 7. A mask 89, held in the path of rays by means of a mask holder 811, is arranged between the illuminating device 83 and the projection objective 85. Such masks 89 used in microlithography have a micrometer-to-nanometer structure, a reduced image of which, for example four to five times smaller, is projected by means of the projection objective 85 onto an image plane 813. A light-sensitive substrate 815, or a wafer, positioned by a substrate holder 817 is held in the image plane 813.

The limit of resolution in the projection of fine structures depends on the wavelength $\lambda$ of the light used for the illumination and on the numerical aperture on the image side of the projection objective 85, the maximum achievable resolution of the projection-exposure installation 81 increasing with decreasing wavelength $\lambda$ of the illuminating device 83 and with increasing numerical aperture of the projection objective 85 on the image side. With the exemplary embodiments shown in FIG. 6 and FIG. 7, it is possible to achieve resolutions smaller than 150 nm. Therefore, effects such as intrinsic birefringence must also be minimized. The invention has been successful in greatly reducing the detrimental influence of intrinsic birefringence particularly in projection objectives with large numerical apertures on the image side.

Figure 10:
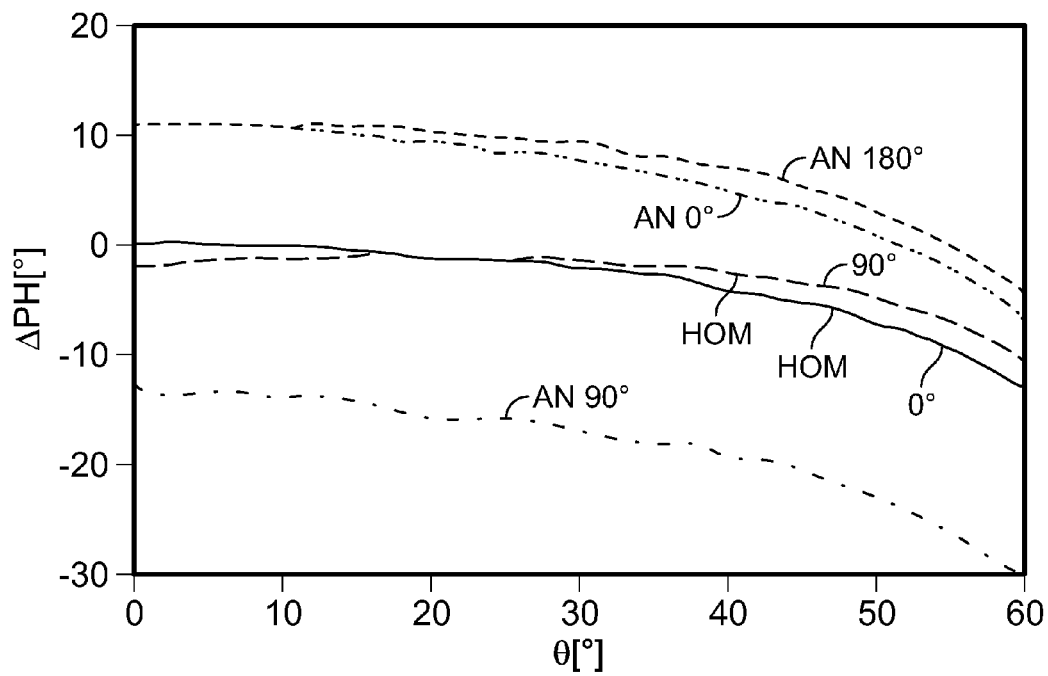
FIG. 10 is a diagram which shows the dependence of the phase splitting ΔPH caused by birefringence on the direction of irradiation for a homogeneous compensation coating and for an anisotropic compensation coating.

The influence of the anisotropy of a compensation coating on the birefringence brought about by the coating is explained on the basis of FIG. 10. In this case, the absolute amount and the direction of the birefringence brought about by the layer are specified by the phase angle $\Delta$PH of the phase splitting, that is by a difference in the wave front between two mutually orthogonal, linear states of polarization. This parameter is suitable also for describing the directional dependence of the birefringence. In FIG. 10, the dependence of the phase angle on the angle of the introduction of the radiation is indicated, corresponding to the aperture angle $\Theta$ of the previous representations. The phase splitting brought about by an anisotropic interference layer system (magnesium fluoride lanthanum fluoride multilayer laminate) applied to a planar substrate by being vapor-deposited at a depositing angle of 40° is shown. This is compared with an isotropic layer system.

The curves identified by HOM in the middle indicate the measured values for the isotropic compensation coating 613, which is specified in Table 6 and the layer thicknesses of which are homogeneous and have no lateral thickness variation. As explained, the effective birefringence of the layer, characterized by the phase splitting, for the aperture angle $\Theta$=0° approximates to zero. For higher aperture angles, a slight shift of the phase splitting to negative values occurs on account of the increased path of rays within the layer. The solid line shows the ellipsometric measured values for irradiations in a first plane, which is perpendicular to the coating surface and is designated here as the 0° plane. The broken line indicates the values for the 90° plane perpendicular thereto. It is evident that the amount and direction of the phase splitting are substantially independent of the azimuth angle □. This is consequently an isotropic coating.

In the case of the anisotropic coating (AN) on the other hand, there is a pronounced directional dependence of the phase splitting on the azimuth angle □. The curve AN 0° shows the measured values of directions of irradiation in the first plane, which corresponds to the azimuth angle 0°. In comparison with the homogeneous coating, substantially the same angle variation is evident, but the amount of the birefringence is clearly higher, with a considerable phase splitting (about 10°) even at the angle of irradiation of 0°. Substantially the same values are obtained if radiation is introduced in the same first plane from the direction lying opposite with respect to the optical axis. This corresponds to rotation of the sample with respect to the measuring device by 180° (curve AN 180°).

If, on the other hand, radiation is introduced in a plane perpendicular to the first plane (curve AN 90°), the azimuth angle therefore being changed by 90°, although there is the same phase splitting in terms of the magnitude, it is with a negative phase angle. This demonstrates that, with the aid of an anisotropic coating, the direction of the phase splitting can be controlled by producing an anisotropic coating with a specific preferred direction, which is then to be aligned in a prescribed direction in relation to the electrical field vectors of the incoming radiation.

Figure 11:
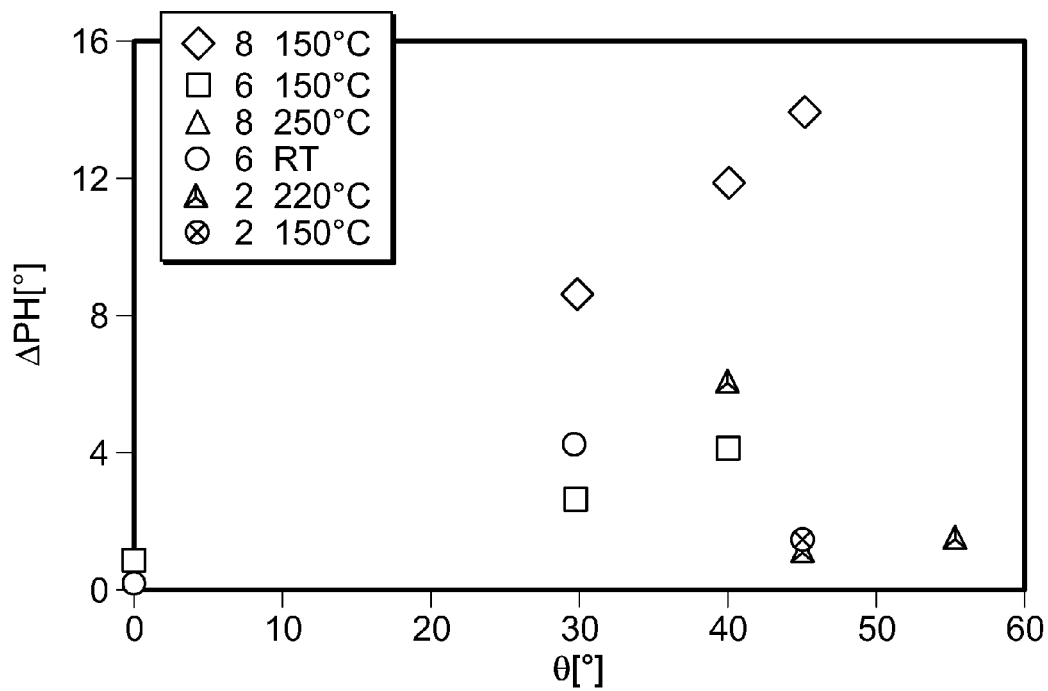
FIG. 11 is a diagram which shows the dependence of the phase splitting ΔPH caused by birefringence on the direction of irradiation for layers with different numbers of individual layers and different production conditions.

It is explained on the basis of FIG. 11 that, in the case of anisotropic coatings, the extent of the phase splitting, i.e. the intensity of the birefringence, can also be selectively controlled. Measured values for the phase splitting in dependence on the aperture angle $\Theta$ for different coatings are shown. The lozenge symbols in this case correspond to an MgF2/LaF3 multilayer laminate with 8 individual layers, vapor-deposited at 150° C. The square symbols correspond to a coating produced at the same temperature with 6 individual layers of these materials. A comparison of the birefringent effect of these two layer systems shows that the absolute amount of the achievable phase splitting increases as the number of layers increases.

The triangle symbols correspond to a coating with 8 layers, coated at 250°, that is much higher temperatures. In comparison with the corresponding 8-ply layer at 150°, much lower phase splittings are obtained.

These tendencies (increase of the birefringent effect with increasing number of layers, lessening of the birefringent effect with increasing production temperature) also become clear from the comparison with the other layer systems (six-layer system at room temperature, two-layer system at 220° and 150°).

On the basis of the dependences represented by way of example, it is possible with the aid of anisotropic coatings to create polarization-effective optical components which have a prescribable locally varying birefringence with respect to amount and direction over the coated surface area. The production of a rotationally symmetrical anisotropic coating of a lens in a vapor-depositing installation with a planetary system is explained on the basis of FIG. 12. The planetary system has a main carrier which can be rotated about a main axis of rotation 500 (not shown) and attached to the circumference of which are a number of substrate carriers 502, which are rotatable about respective substrate carrier axes 501. Each substrate carrier carries a substrate 503, which in the example is designed as a biconvex lens. Arranged in the region of the main axis of rotation is a material source 504 for vapor-depositing material, in order for example to evaporate magnesium fluoride and lanthanum fluoride alternately with the aid of an electron beam and vapor-deposit them onto the coating surface 505 of the substrate facing the material source. The coating material symbolized by broken lines meets the respective coating locations at a vapor-depositing angle (coating angle) 506, which is determined by the geometry of the installation and the curvature of the coating surface.

In order to produce an anisotropic coating 510 in this installation, arranged between the material source 504 and the substrate is a set of shading diaphragms 511, with each of which the part of the coating surface facing the material source can be shaded completely from the stream of material, so that only the part of the coating surface facing away from the material source is coated at a large vapor-depositing angle.

The oblique vapor-depositing has the effect that the layer material grows up in a columnar structure, symbolized by oblique lines. The angle of inclination is in this case determined by the principal vapor-depositing direction. The degree of this morphology can be influenced by the coating temperature, the anisotropy being pronounced to a greater degree at lower coating temperatures, for example between room temperature and about 90° C., and at higher coating temperatures, for example of over 120° C., 150° C. or 200° C.

It is evident that in this way it is possible to produce an anisotropic coating which is rotationally symmetrical to the axis of rotation 501 and in which the preferred direction (direction of inclination of the coating material columns) points substantially in the radial direction. On account of the curvature of the lens surface, a variation of the vapor-depositing angle is also obtained from the center to the edge, this angle increasing in the example from the inside to the outside, so that the anisotropy of the coating is greater at the edge than in the center. In the case of a concave surface, the situation would be reversed. It is also evident that, by setting the difference in height between the material source 504 and the coating surface, the concentration of the distribution of the angles of incidence can be set, smaller vertical distances leading to larger vapor-depositing angles.

It is explained on the basis of FIG. 13 how, by suitably designing shading diaphragms for each coating location, a coating time that is dependent on the radial position of the coating location can be prescribed according to a prescribable radial time profile and a desired angular spectrum of the directions of growth of the columnar structures. The shading effect of the diaphragms is in this case symbolically represented by diaphragms 511', 511'', 511''', which periodically shade a substrate 503', 503', 503''' rotating behind them during its rotation about the axis of rotation 501', 501'', 501''' with respect to the stream of material 520, represented by arrow symbols, of the material source.

FIG. 13(a) shows a shading with a shading angle which is constant over the entire radius and is measured in the circumferential direction of the rotation. This is achieved by a V-shaped "window" in the stream of material. This shading has the effect that the coating time, i.e. the time for which the rotating coating location lies within the stream of material 520, is substantially the same for all radial positions. In the case of planar substrate surfaces, this would lead to a structure which is largely uniform in the radial direction. If the shading window were expanded outward, for example according to the broken lines 515, this would produce a radial time profile with which radially inner regions are shaded for longer than radially outer regions. This makes it possible, if appropriate, to achieve compensation for geometrically caused decreases in layer thickness toward the edge. However, it is also possible to produce rotationally symmetrical layers, the layer thickness of which increases continuously from the center to the edge. The narrower the range of the vapor-depositing directions allowed by the shading diaphragm, the narrower or smaller the angular spectrum of the directions of growth of the columnar structures. A narrower angular spectrum in this case generally corresponds to a more pronounced anisotropy.

The rectangular window in FIG. 13(b) has the effect that the radially inner regions are vapor-deposited over longer time intervals and from more varied directions than radially outer regions. This makes it possible, if appropriate, to produce layers of which the layer thickness decreases more from the center to the edge than a thickness decrease caused by the surface curvature alone. On the other hand, the anisotropy will be more pronounced at the edge than in the center. In the case of concave coating surfaces, it is possible in this way, if appropriate, to achieve a homogeneous layer thickness between the center and the edge.

The geometry of the diaphragms 511''' in FIG. 13(c) has the effect that a central region 525 of the substrate 503''' remains constantly exposed to the stream of material and is consequently coated substantially isotropically. In the remaining region, a radial variation is obtained, with the anisotropy and/or layer thickness changing in the radial direction.

The alignment of the principal axis of the coating can be set by suitable choice of the orientation of the stream of vapor-deposited material with respect to the diaphragms. If, for example, in the case of the arrangement according to FIG. 13(a) vapor-depositing is carried out in a direction offset by 90° (broken arrow), columnar structures which are aligned substantially tangentially result.

In order to hinder or avoid penetration of impurities, such as hydrocarbons, water vapor or the like, into the porous layer structure, a largely pore-free protective layer may be applied, for example as an outermost layer of the coating, serving as a diffusion barrier. This may be formed, by a suitable layer thickness, such that it is optically largely neutral, for example as a half-wave layer.

A variant of the method which makes it possible to produce polarization-optically effective components (for example retarders) with a virtually freely selectable local birefringence distribution is explained on the basis of FIG. 15. For this purpose, firstly a substrate, for example a planar-parallel plate 550, is covered with a polarization-optically effective coating 551, the birefringent effect of which may be substantially homogeneous or anisotropic. The coating has a non-equilibrium layer structure, which allows the morphology of the layer, and consequently its birefringent properties, to be changed in the exposed region by selective local introduction of energy. This may be, as in the example, an anisotropic coating 551 produced by oblique vapor-deposition. After completion of the layer 551, the layer is locally exposed in accordance with a prescribed distribution to an energy which is suitable for changing the morphology, and consequently the birefringent properties of the layer material. In the example, for this purpose a high-energy radiation 552, for example an ion beam or a suitably expanded laser beam, is introduced through the aperture 553 of a mask 554 onto the coating. Induced as a result in the region 555 of the coating prescribed by the shape of the mask aperture 553 is a diffusion-supported change of the morphology, in which for example the columnar growth structures of an anisotropic layer coagulate and form a layer of greater density and less anisotropy. A number of masks with different forms of aperture may also be used one after the other, in order to produce more complex local birefringent distributions. Maskless methods are also possible, for example by "writing" a desired birefringent distributions with the aid of a focused high-energy beam, for example a laser beam. In this way, virtually any desired local modulations of the phase splitting brought about by a coating can be produced. The regions of uniform phase splitting may be of a very small scale, for example a few millimeters.

With the method, polarization masks (i.e. polarizers or retardation elements with a locally dependent effect) can be produced for various wavelength ranges, in particular by using anisotropic starting layers. Starting coatings for the visible wavelength range can be produced for example by "cold vapor-depositing", it then being possible for the morphology change to be produced by irradiation with high-energy laser light, for example from the UV range. The starting layers must be stable with respect to the working wavelength even for applications in the UV range, in particular in the case of a wavelength below about 260 nm. Here it is expedient to produce the starting coating at higher coating temperatures, for example between 100° and 152°, whereby thermally more stable coatings are created. The transformation of the morphology must be carried out with correspondingly greater introductions of energy, for example with an infrared laser, by ion beams, electron beams or by suitable heating dies.

The methods described are also suitable for producing polarizing phase-shift masks as polarization-optically effective components, in particular using at least one anisotropic coating. In this case, for example, regions in the direct vicinity of structures to be replicated, for example a line, can be covered with a spatially delimited anisotropic coating in order to produce a favorable retarder effect. The construction and functional principle of polarizing phase shift masks (polarized phase shift masks, P:PSM) are described for example in the article: "Polarized Phase Shift Mask: Concept, Design and Potential Advantages to Photolithography Process and Physical Design" by R. Wang, W. Grobmann, A. Reich and M. Thompson, Proc. SPIE Vol. 4562, pages 406 et seq, the disclosure of which is made the content of this description by reference. With the aid of such masks, it is possible if appropriate to mitigate or eliminate the problem of "phase conflict", so that a single exposure may possibly be adequate for replication of adequate quality.

TABLE 1

M1587a

| FREE LENS DIAMETER | RADII | THICKNESSES | GLASSES | REFRACTIVE INDEX 1/2 AT 157.629 nm | |
|---|---|---|---|---|---|
| 0 | 0.000000000 | 27.171475840 | N2 | 1.00031429 | 46.200 |
|  | 0.000000000 | 0.602670797 | N2 | 1.00031429 | 52.673 |
| L601 | 900.198243311AS | 15.151284556 | CaF2 | 1.55929035 | 53.454 |
|  | −235.121108435 | 9.531971079 | N2 | 1.00031429 | 54.049 |
| L602 | −167.185917779 | 8.294716452 | CaF2 | 1.55929035 | 54.178 |
|  | −132.673519510 | 14.020355779 | N2 | 1.00031429 | 54.901 |
| L603 | −333.194588652 | 9.893809820 | CaF2 | 1.55929035 | 53.988 |
|  | −155.450516203 | 15.930502944 | N2 | 1.00031429 | 54.132 |
| L604 | −73.572316296 | 7.641977580 | CaF2 | 1.55929035 | 53.748 |
|  | −68.248613899AS | 2.881720302 | N2 | 1.00031429 | 55.167 |
| L605 | −86.993585564AS | 5.094651720 | CaF2 | 1.55929035 | 52.580 |
|  | −238.150965327 | 5.379130780 | N2 | 1.00031429 | 53.729 |
| L606 | −165.613920870 | 5.094651720 | CaF2 | 1.55929035 | 53.730 |
|  | 153.417884485 | 34.150169591 | N2 | 1.00031429 | 56.762 |

TABLE 1-continued

| | | M1587a | | | |
|---|---|---|---|---|---|
| L607 | −92.061009990 | 5.094651720 | CaF2 | 1.55929035 | 58.081 |
| | 8491.086261873AS | 19.673523795 | N2 | 1.00031429 | 74.689 |
| L608 | −407.131300451 | 30.380807138 | CaF2 | 1.55929035 | 87.291 |
| | −140.620317156 | 0.761662684 | N2 | 1.00031429 | 91.858 |
| L609 | −4831.804853654AS | 50.269660218 | CaF2 | 1.55929035 | 117.436 |
| | −192.197373609 | 1.688916911 | N2 | 1.00031429 | 121.408 |
| L610 | −367.718684892 | 21.227715500 | CaF2 | 1.55929035 | 127.704 |
| | −233.628547894 | 2.224071019 | N2 | 1.00031429 | 129.305 |
| L611 | 709.585855080 | 28.736922725 | CaF2 | 1.55929035 | 137.016 |
| | 1238.859445357 | 9.120684720 | N2 | 1.00031429 | 137.428 |
| L612 | 1205.457051945 | 49.281218258 | CaF2 | 1.55929035 | 138.288 |
| | −285.321880705 | 1.625271224 | N2 | 1.00031429 | 138.379 |
| L613 | 137.549591710 | 56.718543740 | CaF2 | 1.55929035 | 108.652 |
| | −4380.301012978AS | 0.623523902 | N2 | 1.00031429 | 106.138 |
| L614 | 2663.880214408 | 6.792868960 | CaF2 | 1.55929035 | 103.602 |
| | 149.184979730 | 15.779049257 | N2 | 1.00031429 | 84.589 |
| L615 | 281.093108064 | 6.792868960 | CaF2 | 1.55929035 | 83.373 |
| | 184.030288413 | 32.341552355 | N2 | 1.00031429 | 77.968 |
| L616 | −222.157416308 | 5.094651720 | CaF2 | 1.55929035 | 77.463 |
| | 101.254238115AS | 56.792834221 | N2 | 1.00031429 | 71.826 |
| L617 | −106.980638018 | 5.094651720 | CaF2 | 1.55929035 | 72.237 |
| | 1612.305471130 | 20.581065398 | N2 | 1.00031429 | 89.760 |
| L618 | −415.596135628 | 26.398111993 | CaF2 | 1.55929035 | 96.803 |
| | −204.680044631 | 0.713343960 | N2 | 1.00031429 | 103.409 |
| L619 | −646.696622394 | 25.867340760 | CaF2 | 1.55929035 | 116.636 |
| | −231.917626896 | 0.766268682 | N2 | 1.00031429 | 118.569 |
| L620 | −790.657607677 | 23.400482872 | CaF2 | 1.55929035 | 128.806 |
| | −294.872053725 | 0.721402031 | N2 | 1.00031429 | 130.074 |
| L621 | 786.625567756 | 40.932308205 | CaF2 | 1.55929035 | 141.705 |
| | −431.247283013 | 12.736629300 | N2 | 1.00031429 | 142.089 |
| | 0.000000000 | −8.491086200 | N2 | 1.00031429 | 134.586 |
| L622 | 295.022653593AS | 20.185109438 | CaF2 | 1.55929035 | 139.341 |
| | 449.912291916 | 0.619840486 | N2 | 1.00031429 | 137.916 |
| L623 | 358.934076212 | 48.662890509 | CaF2 | 1.55929035 | 136.936 |
| | −622.662988878 | 30.955714157 | N2 | 1.00031429 | 135.288 |
| L624 | −224.404889753 | 12.736629300 | CaF2 | 1.55929035 | 134.760 |
| | −251.154571510AS | 16.079850229 | N2 | 1.00031429 | 134.853 |
| L625 | −193.582989843AS | 16.510083506 | CaF2 | 1.55929035 | 134.101 |
| | −198.077570749 | 0.880353872 | N2 | 1.00031429 | 136.109 |
| L626 | 206.241795157 | 19.927993542 | CaF2 | 1.55929035 | 101.240 |
| | 338.140581666 | 0.925956949 | N2 | 1.00031429 | 97.594 |
| L627 | 111.017549581 | 24.580089962 | CaF2 | 1.55929035 | 85.023 |
| | 169.576109839 | 0.777849447 | N2 | 1.00031429 | 81.164 |
| L628 | 117.982165264 | 31.161065630 | CaF2 | 1.55929035 | 75.464 |
| | 921.219058213AS | 6.934980174 | N2 | 1.00031429 | 69.501 |
| L629 | 0.000000000 | 22.260797322 | CaF2 | 1.55929035 | 63.637 |
| | 0.000000000 | 4.245543100 | N2 | 1.00031429 | 48.606 |
| L630 | 0.000000000 | 21.227715500 | CaF2 | 1.55929035 | 41.032 |
| | 0.000000000 | 8.491086200 | N2 | 1.00031429 | 26.698 |
| | 0.000000000 | 0.000000000 | | 1.00000000 | 11.550 |

Wavelength and refractive index are stated relative to vacuum.

ASPHERICAL CONSTANTS

Asphere of lens L601

| K | 0.0000 |
|---|---|
| C1 | 1.28594437e−007 |
| C2 | 8.50731836e−013 |
| C3 | 1.16375620e−016 |
| C4 | 2.28674275e−019 |
| C5 | −1.23202729e−022 |
| C6 | 3.32056239e−026 |
| C7 | −4.28323389e−030 |
| C8 | 0.00000000e+000 |
| C9 | 0.00000000e+000 |

Asphere of lens L604

| K | −1.3312 |
|---|---|
| C1 | −4.03355456e−007 |
| C2 | 2.25776586e−011 |
| C3 | −2.19259878e−014 |
| C4 | 4.32573397e−018 |
| C5 | −7.92477159e−022 |
| C6 | 7.57618874e−026 |

TABLE 1-continued

M1587a

| | |
|---|---|
| C7 | −7.14962797e−030 |
| C8 | 0.00000000e+000 |
| C9 | 0.00000000e+000 |

Asphere of lens L605

| | |
|---|---|
| K | −1.1417 |
| C1 | 1.33637337e−007 |
| C2 | 1.56787758e−011 |
| C3 | −1.64362484e−014 |
| C4 | 3.59793786e−018 |
| C5 | −5.11312568e−022 |
| C6 | 1.70636633e−026 |
| C7 | 1.82384731e−030 |
| C8 | 0.00000000e+000 |
| C9 | 0.00000000e+000 |

Asphere of lens L607

| | |
|---|---|
| K | 0.0000 |
| C1 | 1.34745120e−007 |
| C2 | −2.19807543e−011 |
| C3 | 1.20275881e−015 |
| C4 | 4.39597377e−020 |
| C5 | −2.37132819e−023 |
| C6 | 2.87510939e−027 |
| C7 | −1.42065162e−031 |
| C8 | 0.00000000e+000 |
| C9 | 0.00000000e+000 |

Asphere of lens L609

| | |
|---|---|
| K | 0.0000 |
| C1 | 6.85760526e−009 |
| C2 | −4.84524868e−013 |
| C3 | −6.28751350e−018 |
| C4 | −3.72607209e−022 |
| C5 | 3.25276841e−026 |
| C6 | −4.05509974e−033 |
| C7 | −3.98843079e−035 |
| C8 | 0.00000000e+000 |
| C9 | 0.00000000e+000 |

Asphere of lens L613

| | |
|---|---|
| K | 0.0000 |
| C1 | 2.24737416e−008 |
| C2 | −4.45043770e−013 |
| C3 | −4.10272049e−017 |
| C4 | 4.31632628e−021 |
| C5 | −3.27538237e−025 |
| C6 | 1.44053025e−029 |
| C7 | −2.76858490e−034 |
| C8 | 0.00000000e+000 |
| C9 | 0.00000000e+000 |

Asphere of lens L616

| | |
|---|---|
| K | 0.0000 |
| C1 | −2.83553693e−008 |
| C2 | −1.12122261e−011 |
| C3 | −2.05192812e−016 |
| C4 | −1.55525080e−020 |
| C5 | −4.77093112e−024 |
| C6 | 8.39331135e−028 |
| C7 | −8.97313681e−032 |
| C8 | 0.00000000e+000 |
| C9 | 0.00000000e+000 |

Asphere of lens L622

| | |
|---|---|
| K | 0.0421 |
| C1 | 7.07310826e−010 |
| C2 | −2.00157185e−014 |
| C3 | −9.33825109e−020 |
| C4 | 1.27125854e−024 |
| C5 | 1.94008709e−027 |
| C6 | −6.11989858e−032 |
| C7 | 2.92367322e−036 |
| C8 | 0.00000000e+000 |
| C9 | 0.00000000e+000 |

TABLE 1-continued

M1587a

Asphere of lens L624

| | |
|---|---|
| K | 0.0000 |
| C1 | 3.02835805e−010 |
| C2 | −2.40484062e−014 |
| C3 | −3.22339189e−019 |
| C4 | 1.64516979e−022 |
| C5 | −8.51268614e−027 |
| C6 | 2.09276792e−031 |
| C7 | −4.74605669e−036 |
| C8 | 0.00000000e+000 |
| C9 | 0.00000000e+000 |

Asphere of lens L625

| | |
|---|---|
| K | 0.0000 |
| C1 | −3.99248993e−010 |
| C2 | 5.79276562e−014 |
| C3 | 3.53241478e−018 |
| C4 | −4.57872308e−023 |
| C5 | −6.29695208e−027 |
| C6 | 1.57844931e−031 |
| C7 | −2.19266130e−036 |
| C8 | 0.00000000e+000 |
| C9 | 0.00000000e+000 |

Asphere of lens L628

| | |
|---|---|
| K | 0.0000 |
| C1 | 4.40737732e−008 |
| C2 | 1.52385268e−012 |
| C3 | −5.44510329e−016 |
| C4 | 6.32549789e−020 |
| C5 | −4.58358203e−024 |
| C6 | 1.92230388e−028 |
| C7 | −3.11311258e−033 |
| C8 | 0.00000000e+000 |
| C9 | 0.00000000e+000 |

TABLE 3

L61

| FREE LENS DIAMETER | RADII | THICKNESSES | GLASSES | REFRACTIVE INDEX 1/2 AT 157.13 nm | |
|---|---|---|---|---|---|
| 0 | 0.000000000 | 34.000000000 | | 1.00000000 | 82.150 |
| | 0.000000000 | 0.100000000 | | 1.00000000 | 87.654 |
| L801 | 276.724757380 | 40.000000000 | CaF2 | 1.55970990 | 90.112 |
| | 1413.944109416AS | 95.000000000 | | 1.00000000 | 89.442 |
| SP1 | 0.000000000 | 11.000000000 | | 1.00000000 | 90.034 |
| | 0.000000000 | 433.237005445 | | 1.00000000 | 90.104 |
| L802 | −195.924336384 | 17.295305525 | CaF2 | 1.55970990 | 92.746 |
| | −467.658808527 | 40.841112468 | | 1.00000000 | 98.732 |
| L803 | −241.385736441 | 15.977235467 | CaF2 | 1.55970990 | 105.512 |
| | −857.211727400AS | 21.649331094 | | 1.00000000 | 118.786 |
| SP2 | 0.000000000 | 0.000010000 | | 1.00000000 | 139.325 |
| | 253.074839896 | 21.649331094 | | 1.00000000 | 119.350 |
| L803' | 857.211727400AS | 15.977235467 | CaF2 | 1.55970990 | 118.986 |
| | 241.385736441 | 40.841112468 | | 1.00000000 | 108.546 |
| L802' | 467.658808527 | 17.295305525 | CaF2 | 1.55970990 | 102.615 |
| | 195.924336384 | 419.981357165 | | 1.00000000 | 95.689 |
| SP3 | 0.000000000 | 6.255658280 | | 1.00000000 | 76.370 |
| | 0.000000000 | 42.609155219 | | 1.00000000 | 76.064 |
| Z1 | 0.000000000 | 67.449547115 | | 1.00000000 | 73.981 |
| L804 | 432.544479547 | 37.784311058 | CaF2 | 1.55970990 | 90.274 |
| | −522.188532471 | 113.756133662 | | 1.00000000 | 92.507 |
| L805 | −263.167605725 | 33.768525968 | CaF2 | 1.55970990 | 100.053 |
| | −291.940616829AS | 14.536591424 | | 1.00000000 | 106.516 |
| L806 | 589.642961222AS | 20.449887046 | CaF2 | 1.55970990 | 110.482 |
| | −5539.698828792 | 443.944079795 | | 1.00000000 | 110.523 |
| L807 | 221.780582003 | 9.000000000 | CaF2 | 1.55970990 | 108.311 |
| | 153.071443064 | 22.790060084 | | 1.00000000 | 104.062 |

TABLE 3-continued

| | L61 | | | | |
|---|---|---|---|---|---|
| L808 | 309.446967518 | 38.542735318 | CaF2 | 1.55970990 | 104.062 |
| | −2660.227900099 | 0.100022286 | | 1.00000000 | 104.098 |
| L809 | 23655.354584194 | 12.899131182 | CaF2 | 1.55970990 | 104.054 |
| | −1473.189213176 | 9.318886362 | | 1.00000000 | 103.931 |
| L810 | −652.136459374 | 16.359499814 | CaF2 | 1.55970990 | 103.644 |
| | −446.489459129 | 0.100000000 | | 1.00000000 | 103.877 |
| L811 | 174.593507050 | 25.900313780 | CaF2 | 1.55970990 | 99.267 |
| | 392.239615259AS | 14.064505431 | | 1.00000000 | 96.610 |
| | 0.000000000 | 2.045119392 | | 1.00000000 | 96.552 |
| L812 | 7497.306838492 | 16.759051656 | CaF2 | 1.55970990 | 96.383 |
| | 318.210831711 | 8.891640764 | | 1.00000000 | 94.998 |
| L813 | 428.724465129 | 41.295806263 | CaF2 | 1.55970990 | 95.548 |
| | 3290.097860119AS | 7.377912006 | | 1.00000000 | 95.040 |
| L814 | 721.012739719 | 33.927118706 | CaF2 | 1.55970990 | 95.443 |
| | −272.650872353 | 6.871397517 | | 1.00000000 | 95.207 |
| L815 | 131.257556743 | 38.826450065 | CaF2 | 1.55970990 | 81.345 |
| | 632.112566477AS | 4.409527396 | | 1.00000000 | 74.847 |
| L816 | 342.127616157AS | 37.346293509 | CaF2 | 1.55970990 | 70.394 |
| | 449.261078744 | 4.859754445 | | 1.00000000 | 54.895 |
| L817 | 144.034814702 | 34.792179308 | CaF2 | 1.55970990 | 48.040 |
| | −751.263321098AS | 11.999872684 | | 1.00000000 | 33.475 |
| 0' | 0.000000000 | 0.000127776 | | 1.00000000 | 16.430 |

ASPHERICAL CONSTANTS

Asphere of lens L801

| | |
|---|---|
| K | 0.0000 |
| C1 | 4.90231706e−009 |
| C2 | 3.08634889e−014 |
| C3 | −9.53005325e−019 |
| C4 | −6.06316417e−024 |
| C5 | 6.11462814e−028 |
| C6 | −8.64346302e−032 |
| C7 | 0.00000000e+000 |
| C8 | 0.00000000e+000 |
| C9 | 0.00000000e+000 |

Asphere of lens L803

| | |
|---|---|
| K | 0.0000 |
| C1 | −5.33460884e−009 |
| C2 | 9.73867225e−014 |
| C3 | −3.28422058e−018 |
| C4 | 1.50550421e−022 |
| C5 | 0.00000000e+000 |
| C6 | 0.00000000e+000 |
| C7 | 0.00000000e+000 |
| C8 | 0.00000000e+000 |
| C9 | 0.00000000e+000 |

Asphere of lens L803'

| | |
|---|---|
| K | 0.0000 |
| C1 | 5.33460884e−009 |
| C2 | −9.73867225e−014 |
| C3 | 3.28422058e−018 |
| C4 | −1.50550421e−022 |
| C5 | 0.00000000e+000 |
| C6 | 0.00000000e+000 |
| C7 | 0.00000000e+000 |
| C8 | 0.00000000e+000 |
| C9 | 0.00000000e+000 |

Asphere of lens L805

| | |
|---|---|
| K | 0.0000 |
| C1 | 2.42569449e−009 |
| C2 | 3.96137865e−014 |
| C3 | −2.47855149e−018 |
| C4 | 7.95092779e−023 |
| C5 | 0.00000000e+000 |
| C6 | 0.00000000e+000 |
| C7 | 0.00000000e+000 |
| C8 | 0.00000000e+000 |
| C9 | 0.00000000e+000 |

Asphere of lens L806

| | |
|---|---|
| K | 0.0000 |
| C1 | −6.74111232e−009 |

TABLE 3-continued

| | L61 |
|---|---|
| C2 | −2.57289693e−014 |
| C3 | −2.81309020e−018 |
| C4 | 6.70057831e−023 |
| C5 | 5.06272344e−028 |
| C6 | −4.81282974e−032 |
| C7 | 0.00000000e+000 |
| C8 | 0.00000000e+000 |
| C9 | 0.00000000e+000 |
| Asphere of lens L811 | |
| K | 0.0000 |
| C1 | 2.28889624e−008 |
| C2 | −1.88390559e−014 |
| C3 | 2.86010656e−017 |
| C4 | −3.18575336e−021 |
| C5 | 1.45886017e−025 |
| C6 | −1.08492931e−029 |
| C7 | 0.00000000e+000 |
| C8 | 0.00000000e+000 |
| C9 | 0.00000000e+000 |
| Asphere of lens L813 | |
| K | 0.0000 |
| C1 | 3.40212872e−008 |
| C2 | −1.08008877e−012 |
| C3 | 4.33814531e−017 |
| C4 | −7.40125614e−021 |
| C5 | 5.66856812e−025 |
| C6 | 0.00000000e+000 |
| C7 | 0.00000000e+000 |
| C8 | 0.00000000e+000 |
| C9 | 0.00000000e+000 |
| Asphere of lens L815 | |
| K | 0.0000 |
| C1 | −3.15395039e−008 |
| C2 | 4.30010133e−012 |
| C3 | 3.11663337e−016 |
| C4 | −3.64089769e−020 |
| C5 | 1.06073268e−024 |
| C6 | 0.00000000e+000 |
| C7 | 0.00000000e+000 |
| C8 | 0.00000000e+000 |
| C9 | 0.00000000e+000 |
| Asphere of lens L816 | |
| K | 0.0000 |
| C1 | −2.16574623e−008 |
| C2 | −6.67182801e−013 |
| C3 | 4.46519932e−016 |
| C4 | −3.71571535e−020 |
| C5 | 0.00000000e+000 |
| C6 | 0.00000000e+000 |
| C7 | 0.00000000e+000 |
| C8 | 0.00000000e+000 |
| C9 | 0.00000000e+000 |
| Asphere of lens L817 | |
| K | 0.0000 |
| C1 | 2.15121397e−008 |
| C2 | −1.65301726e−011 |
| C3 | −5.03883747e−015 |
| C4 | 1.03441815e−017 |
| C5 | −6.29122773e−021 |
| C6 | 1.44097714e−024 |
| C7 | 0.00000000e+000 |
| C8 | 0.00000000e+000 |
| C9 | 0.00000000e+000 |

The invention claimed is:

1. An objective, comprising:
at least two lenses or lens parts of fluoride crystal, each lens or lens part having a lens axis that points approximately in a principal crystallographic direction, an image point in an image plane being impinged by a bundle of rays with rays which respectively have an azimuth angle $\alpha_R$, an aperture angle $\theta_R$ and an optical path difference $\Delta$OPL for two mutually orthogonal states of linear polarization, and each lens or lens part having optical surfaces; and
a compensation coating on at least one optical surface, the compensation coating being designed in such a way that the distribution of the optical path differences $\Delta$OPL $(\alpha_R, \theta_R)$ of the bundle of rays as a function of the azimuth angle $\alpha_R$ and of the aperture angle $\theta_R$ has significantly reduced values in comparison with an objective without a compensation coating,
wherein
the lenses or the lens parts are arranged such that they are rotated with respect to one another about the lens axes in such a way that the distribution of the optical path differences $\Delta$OPL $(\alpha_R, \theta_R)$ of the bundle of rays as a function of the azimuth angle $\alpha_R$ and of the aperture angle $\theta_R$ has significantly reduced values in comparison with lenses or lens parts of which the lens axes point in the same principal crystallographic direction and which are not arranged such that they are rotated with respect to one another about the lens axes, and
wherein an optical element with the compensation coating has an element axis, the compensation coating has an effective birefringence distribution, and the effective birefringence values of which depend on azimuth angles $\alpha_F$ with respect to a reference direction perpendicular to the element axis and on aperture angles $\theta_F$ with respect to the element axis.

2. The objective as claimed in claim 1, wherein the effective birefringence distribution of the compensation coating for the aperture angle $\theta_F=0°$ is approximately zero.

3. The objective as claimed in claim 1, wherein the effective birefringence distribution primarily depends only on the aperture angle $\theta_F$.

4. The objective as claimed in claim 1, wherein the optical element with the compensation coating is one of the lenses of fluoride crystal, and the element axis is the lens axis of the lens of fluoride crystal.

5. The objective as claimed in claim 1, wherein a plurality of optical elements have a compensation coating.

6. The objective as claimed in claim 1, wherein all the optical elements have a compensation coating.

7. An objective, comprising:
a plurality of optical elements, each of the plurality of optical elements having optical surfaces, wherein
an image point in an image plane is impinged by a bundle of rays with rays which respectively have an optical path difference $\Delta$OPL for two mutually orthogonal states of linear polarization, at least one optical surface is covered with a compensation coating, and the compensation coating is designed in such a way that the optical path differences $\Delta$OPL of the bundle of rays have significantly reduced values in comparison with an objective without a compensation coating, and
wherein the compensation coating has an effective birefringence distribution with locally varying birefringence, and the compensation coating has an effective birefringence distribution which is substantially rotationally symmetrical to an element axis of the element provided with the compensation coating.

8. The objective as claimed in claim 7, wherein the effective birefringence values depend on azimuth angles $\alpha_F$ with respect to a reference direction perpendicular to the element axis and on aperture angles $\theta F$ with respect to the element axis.

9. The objective as claimed in claim 8, wherein the effective birefringence distribution of the compensation coating for the aperture angle $\theta_F=0°$ is approximately zero.

10. The objective as claimed claim 8, wherein the effective birefringence distribution of the compensation coating primarily depends on the aperture angle $\theta_F$.

11. The objective as claimed in claim 8, wherein the optical element with the compensation coating is interchangeable.

12. The objective as claimed in claim 7, wherein at least two optical elements are lenses or lens parts of fluoride crystal, each lens or lens part has an axis, and the lenses or the lens parts are arranged such that they are rotated with respect to one another about the lens axes in such a way that the distribution of the optical path differences $\Delta$OPL$(\alpha_R,\theta_R)$ of the bundle of rays as a function of the azimuth angle $\alpha_R$ and of the aperture angle $\theta_R$ has significantly reduced values in comparison with lenses or lens parts of which the lens axes point in the same principal crystallographic direction and which are not arranged such that they are rotated with respect to one another about the lens axes.

13. A microlithography projection-exposure installation, comprising:
an illuminating system, comprising:
an objective as claimed in claim 1, wherein the objective projects an image of a structure-bearing mask onto a light-sensitive substrate.

14. A method for producing semiconductor components that comprises using a microlithography projection-exposure installation as claimed in claim 13.

15. The objective of claim 7, wherein the compensation coating has an effective birefringence distribution which has a birefringence increasing or decreasing in the radial direction.

16. The objective of claim 7, wherein at least one optical surface of an optical component has an anisotropic coating.

17. The objective of claim 16, wherein the anisotropic coating has a local variation of the anisotropy, the variation comprising the direction of a preferred direction, the absolute amount of the phase splitting produced by the coating, or both the direction of the preferred direction and the absolute amount of the phase splitting produced by the coating.

18. A microlithography projection-exposure installation, comprising:
an illuminating system, comprising:
an objective as claimed in claim 7, wherein the objective projects an image of a structure-bearing mask onto a light-sensitive substrate.

19. A method for producing semiconductor components that comprises using a microlithography projection-exposure installation as claimed in claim 18.

20. An objective, comprising:
a plurality of optical elements, each of the plurality of optical elements having optical surfaces, wherein
an image point in an image plane is impinged by a bundle of rays with rays which respectively have an optical path difference $\Delta$OPL for two mutually orthogonal states of linear polarization, at least one optical surface is covered with a compensation coating, and the compensation coating is designed in such a way that the optical path differences ΔOPL of the bundle of rays have significantly reduced values in comparison with an objective without a compensation coating, and wherein at least one optical surface of an optical component has an anisotropic coating having a local variation of the anisotropy, the variation comprising the direction of a preferred direction, the absolute amount of the phase splitting produced by the coating, or both the direction of the preferred direction and the absolute amount of the phase splitting produced by the coating.

21. The objective as claimed in claim 20, wherein the optical element with the compensation coating has an element axis, the compensation coating has an effective birefringence distribution, and the effective bireficngence values of which depend on azimuth angles $\alpha_F$ with respect to a reference direction perpendicular to the element axis and on aperture angles $\theta_F$ with respect to the element axis.

22. The objective as claimed in claim 21, wherein the effective birefringence distribution of the compensation coating for the aperture angle $\theta_F=0°$ is approximately zero.

23. The objective as claimed in claim 21, wherein the effective birefringence distribution of the compensation coating primarily depends on the aperture angle $\theta_F$.

24. The objective as claimed in claim 21, wherein the optical element with the compensation coating is interchangeable.

25. The objective as claimed in claim 20, wherein at least two optical elements are lenses or lens parts of fluoride crystal, each lens or lens part has an axis, and the lenses or the lens parts are arranged such that they are rotated with respect to one another about the lens axes in such a way that the distribution of the optical path differences $\Delta OPL(\alpha_R, \theta_R)$ of the bundle of rays as a function of the azimuth angle $\alpha_R$ and of the aperture angle $\theta_R$ has significantly reduced values in comparison with lenses or lens parts of which the lens axes point in the same principal crystallographic direction and which are not arranged such that they are rotated with respect to one another about the lens axes.

26. The objective as claimed in claim 20, wherein the objective is designed for wavelengths less than 200 nm.

27. The objective as claimed in claim 20, wherein the objective is designed for wavelengths less than 160 nm.

28. The objective as claimed in claim 20, wherein the objective is a refractive objective.

29. The objective as claimed in claim 20, wherein the objective is a catadioptric objective with lenses and at least one mirror.

30. The objective as claimed in claim 20, wherein all the lenses are formed of calcium fluoride.

31. The objective as claimed in claim 20, wherein a plurality of optical elements are covered with compensation coatings.

32. A microlithography projection-exposure installation, comprising:
an illuminating system, comprising:
an objective as claimed in claim 20, wherein the objective projects an image of a structure-bearing mask onto a light-sensitive substrate.

33. A method for producing semiconductor components that comprises using a microlithography projection-exposure installation as claimed in claim 32.

* * * * *